(12) United States Patent
Ohkawa

(10) Patent No.: US 7,242,043 B2
(45) Date of Patent: Jul. 10, 2007

(54) IMAGING DEVICE AND MANUFACTURING METHOD THEREOF

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 208 days.

(21) Appl. No.: 10/866,829

(22) Filed: Jun. 15, 2004

(65) Prior Publication Data

US 2005/0067640 A1 Mar. 31, 2005

(30) Foreign Application Priority Data

Sep. 26, 2003 (JP) .............................. 2003-335484

(51) Int. Cl.
*H01L 31/113* (2006.01)
(52) U.S. Cl. .................. 257/292; 257/59; 257/233; 438/48
(58) Field of Classification Search ................ 257/291, 257/59, 233, 292; 438/48
See application file for complete search history.

(56) References Cited

U.S. PATENT DOCUMENTS

| | | | |
|---|---|---|---|
| 5,625,210 A | 4/1997 | Lee et al. | |
| 6,180,969 B1* | 1/2001 | Yang et al. | 257/291 |
| 6,847,051 B2* | 1/2005 | Hong | 257/59 |
| 2002/0054226 A1 | 5/2002 | Lee | |
| 2003/0227039 A1* | 12/2003 | Umeda et al. | 257/291 |
| 2003/0228736 A1* | 12/2003 | Kimura | 438/286 |
| 2004/0188729 A1* | 9/2004 | Uchida et al. | 257/292 |

FOREIGN PATENT DOCUMENTS

| | | |
|---|---|---|
| JP | 8-335688 | 12/1996 |
| JP | 2000-152083 | 5/2000 |
| JP | 2002-110957 | 4/2002 |
| JP | 2003-101006 | 4/2003 |
| JP | 2003-115580 | 4/2003 |

* cited by examiner

*Primary Examiner*—Phat X. Cao
*Assistant Examiner*—Abul Kalam
(74) *Attorney, Agent, or Firm*—Westerman, Hattori, Daniels & Adrian, LLP.

(57) ABSTRACT

Disclosed is an imaging device including a photodiode and floating diffusion region formed to be spaced from each other on a surface layer of a pixel region of a silicon (semiconductor) substrate, and a transfer gate having one of a concave and convex portions toward the floating diffusion region, the transfer gate being formed above the silicon substrate between the photodiode and the floating diffusion region by interposing a gate insulating film therebetween.

7 Claims, 41 Drawing Sheets

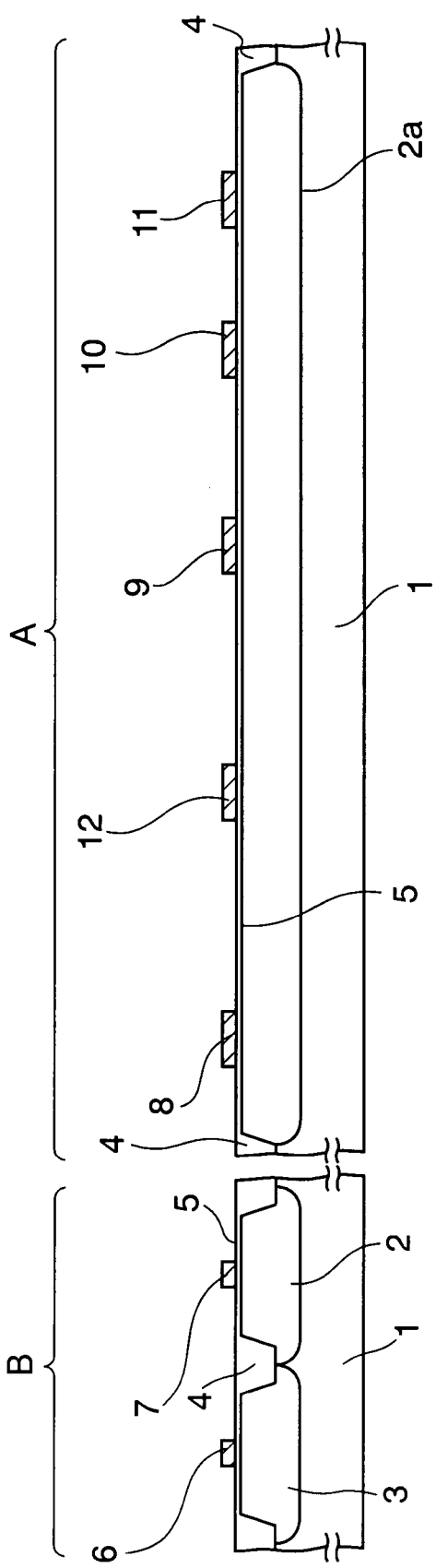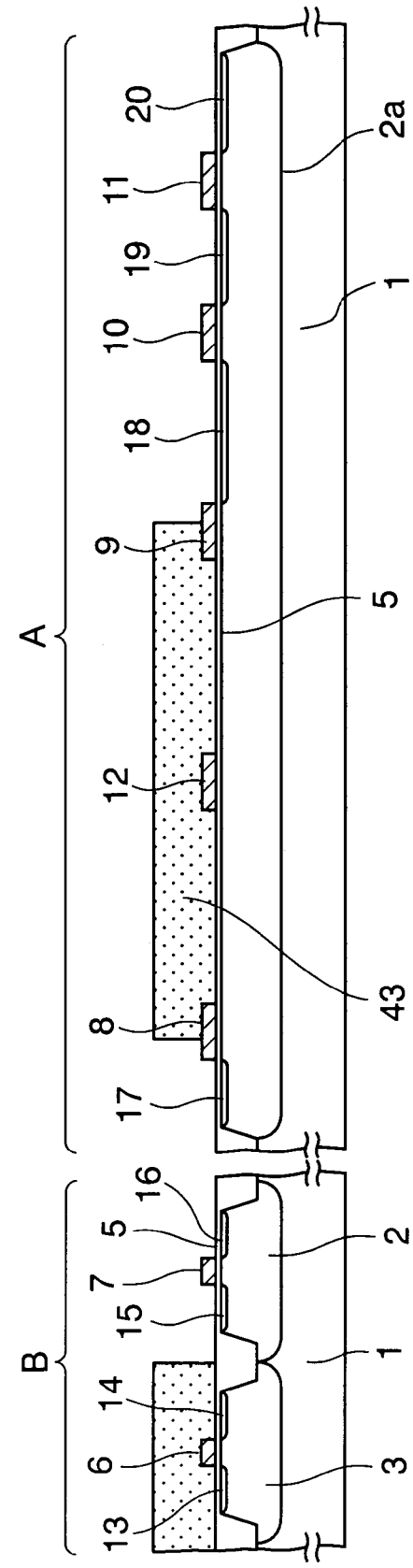

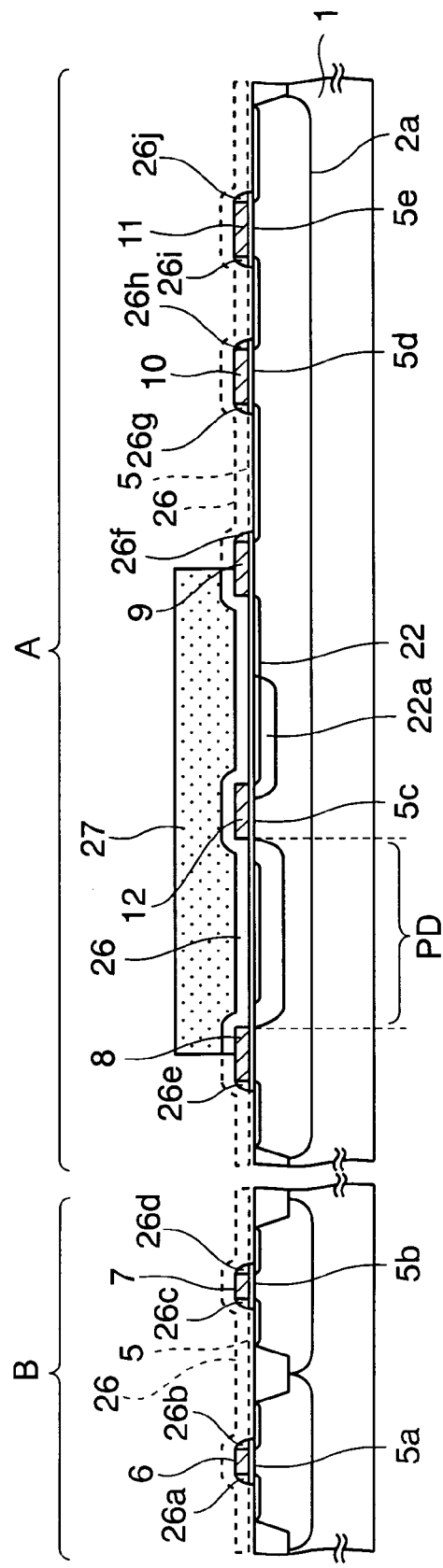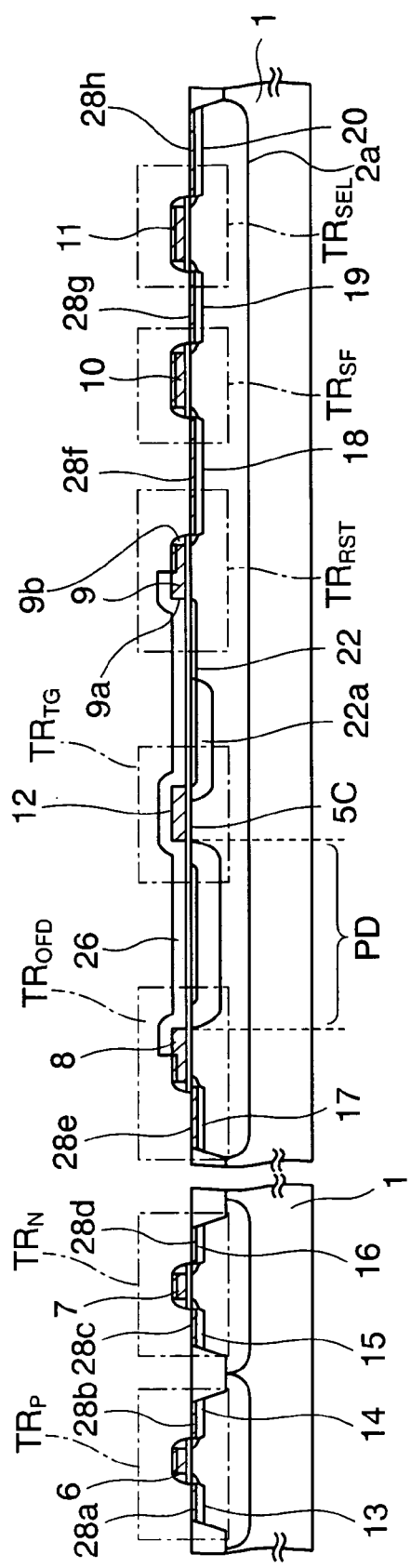

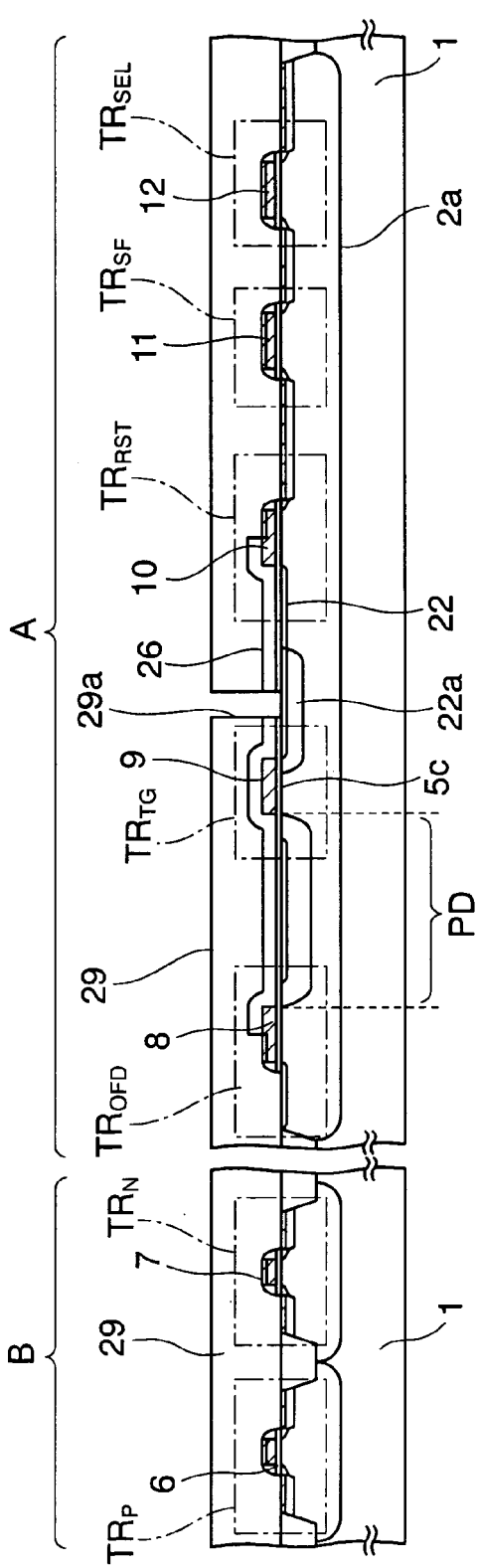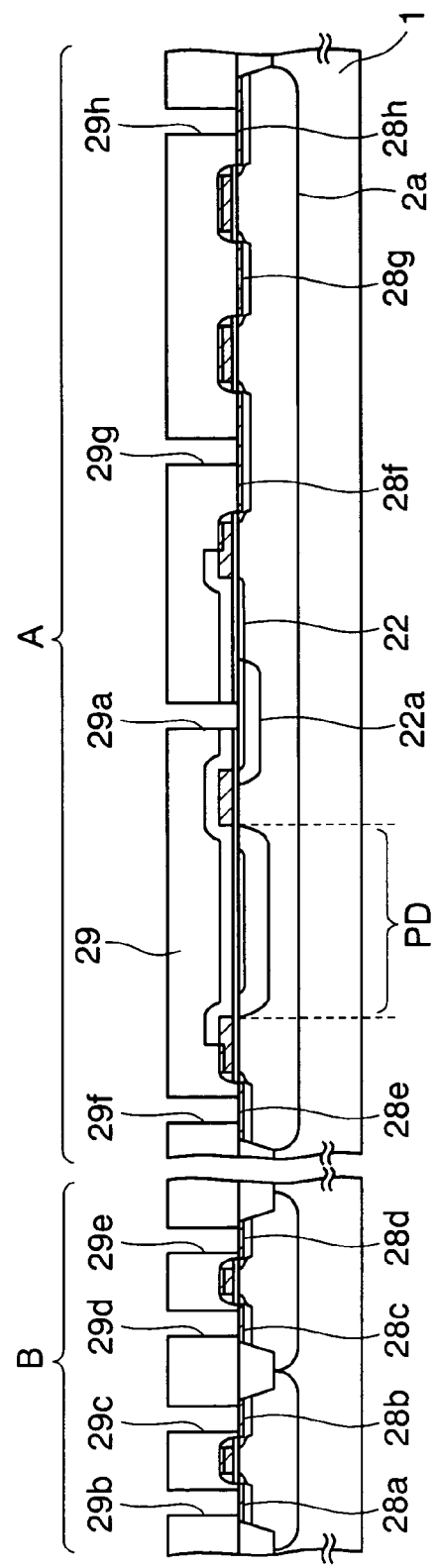

A: voltage difference between photodiode and floating diffusion region 22 when turning ON the transfer gate 12

B: voltage difference between photodiode and floating diffusion region 22 when turning OFF the transfer gate 12 when ending the reset operation of the floating diffusion region 22 when transfering charges from PD to floating diffusion region 22

$\vec{n}_1 \cdot \vec{n}_2 = 1$ $\vec{n}_1 \cdot \vec{n}_2 = 0$ $\vec{n}_1 \cdot \vec{n}_2 = -1$

L1>L2

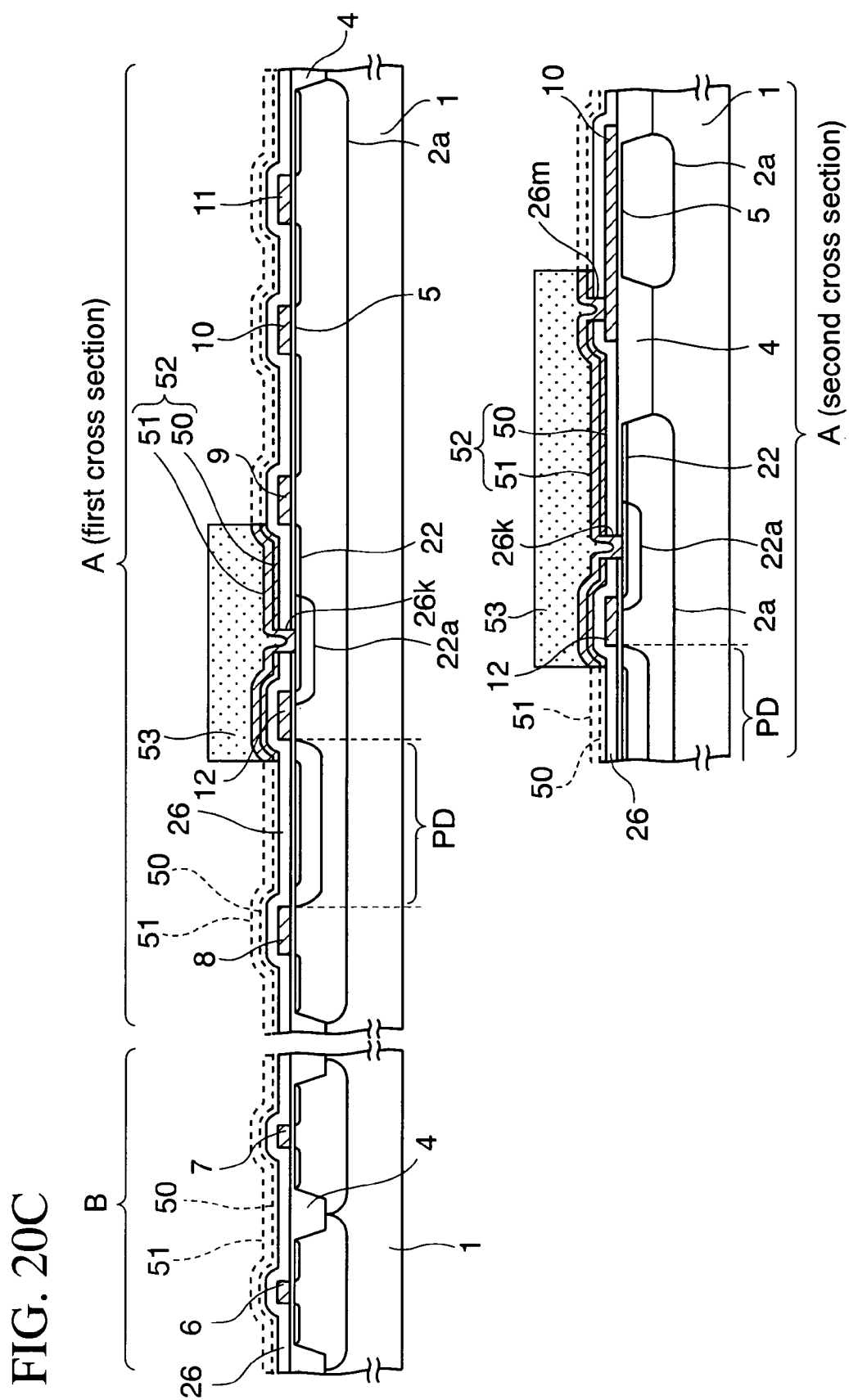

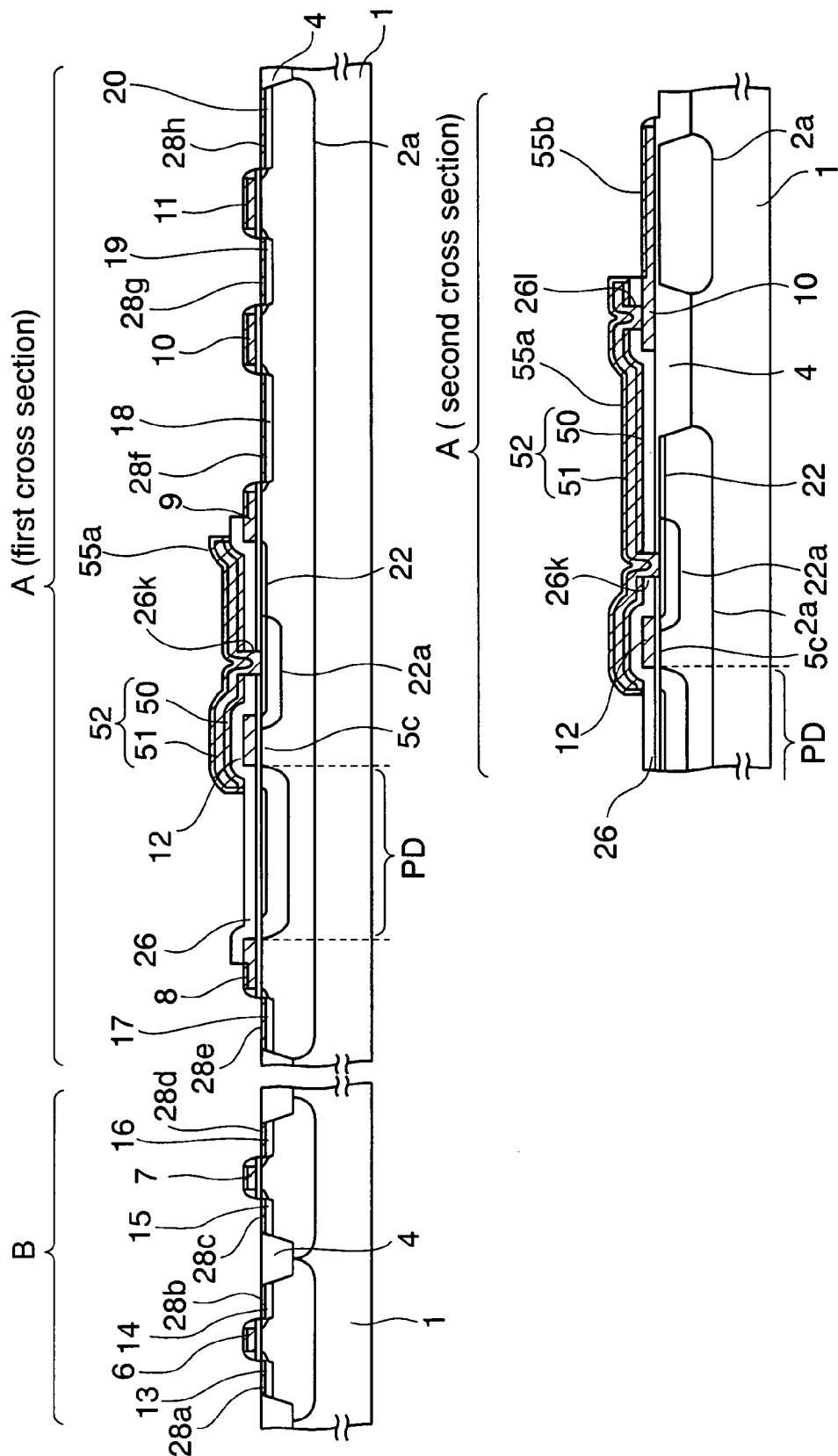

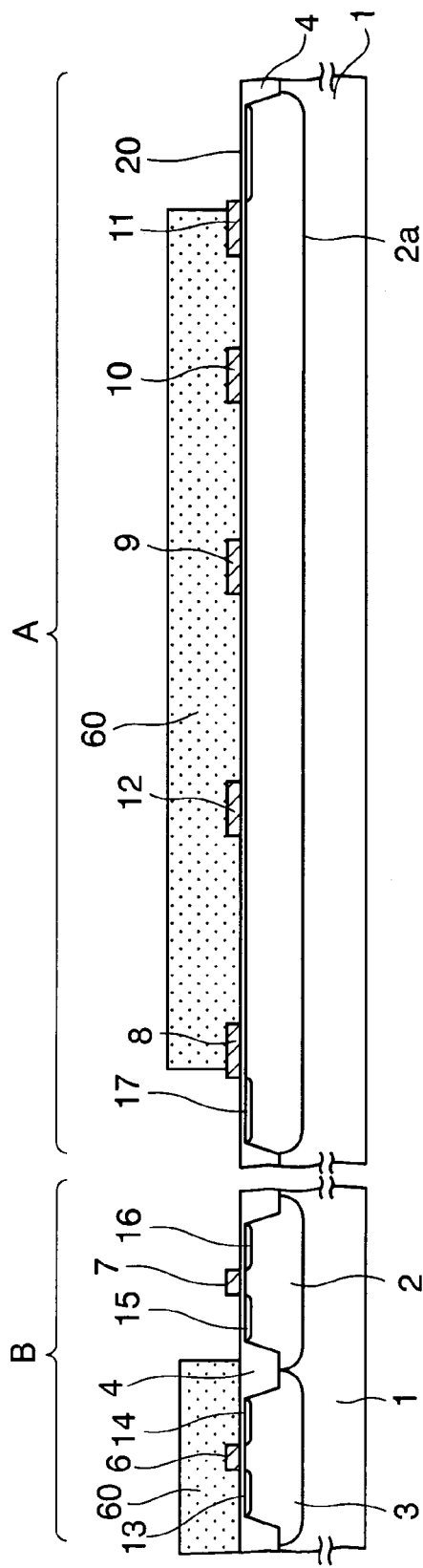
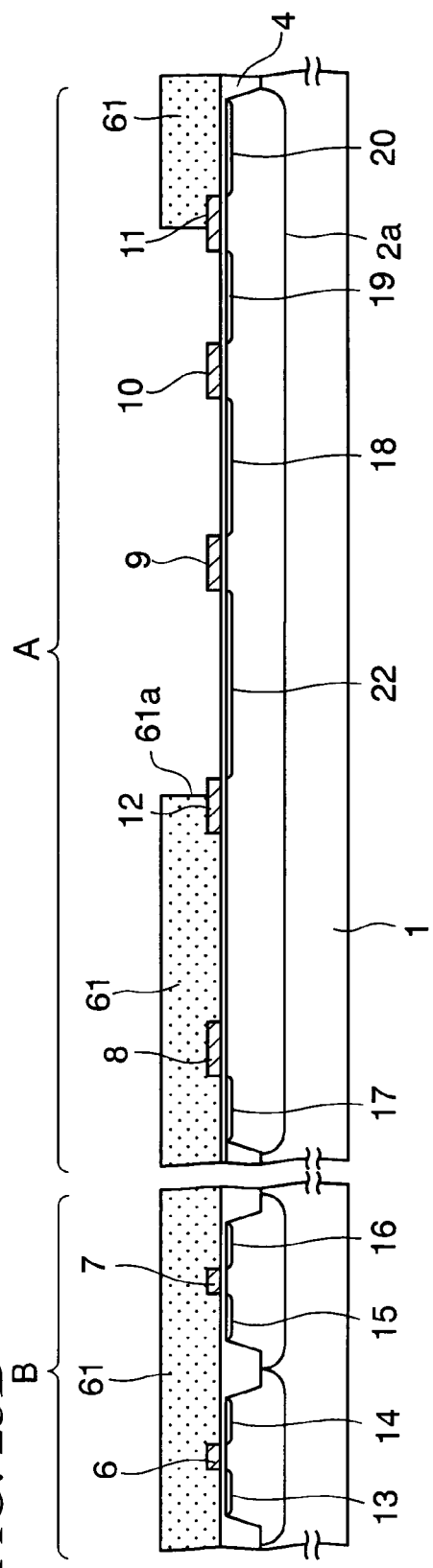

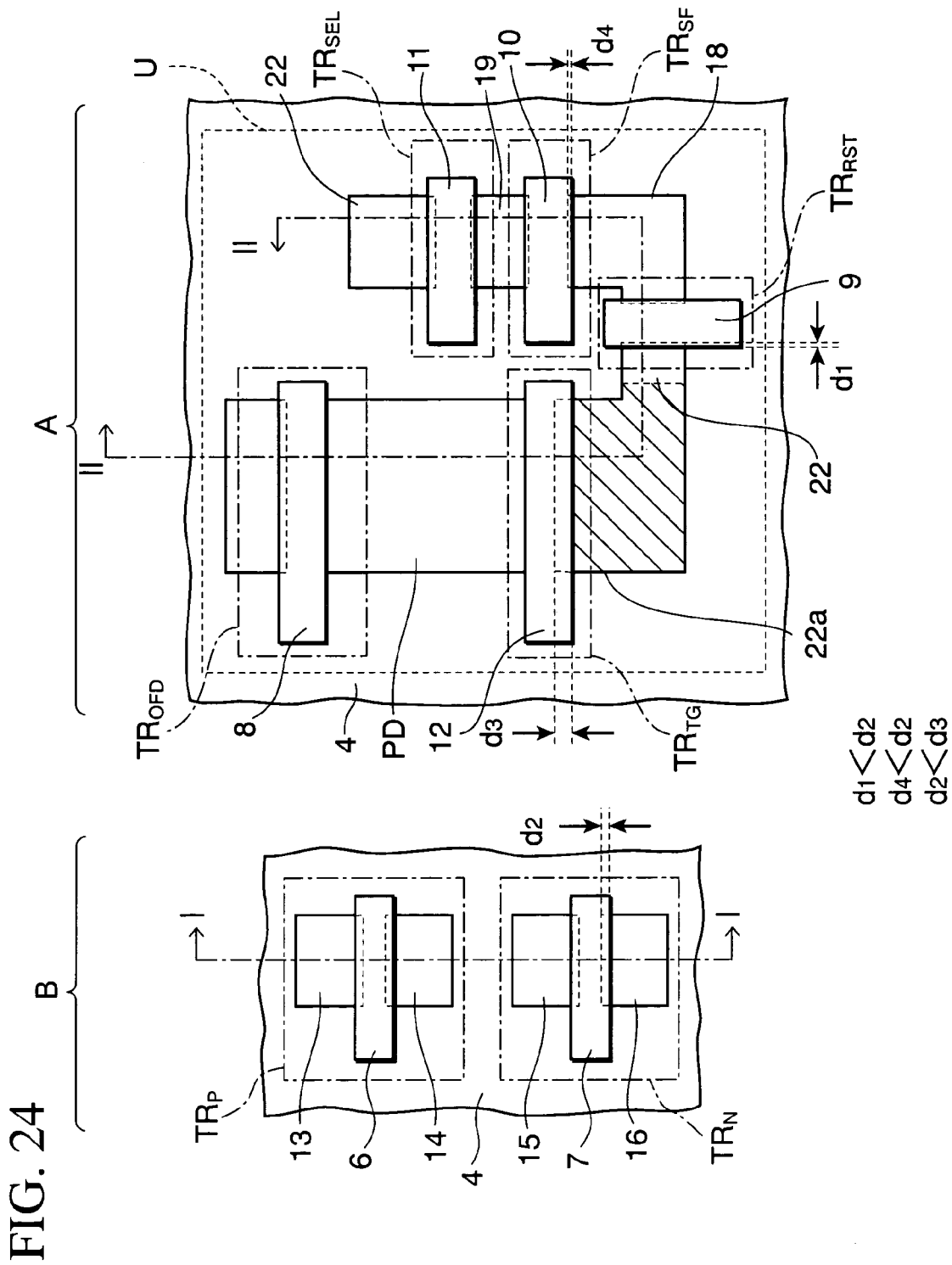

step (ii) : reset of the diffusion region 22
step (iv) : raise in voltage of the vertical signal line
step (v) : charge transfer from photodiode PD to floating diffusion region 22
step (vii) : standby state
step (viii) : read out signal

IMAGING DEVICE AND MANUFACTURING METHOD THEREOF

CROSS-REFERENCE TO RELATED APPLICATIONS

This application is based on and claims priority of Japanese Patent Application No. 2003-335484 filed on Sep. 26, 2003, the entire contents of which are incorporated herein by reference.

BACKGROUND OF THE INVENTION

1. Field of the Invention

The present invention relates to an imaging device and a manufacturing method thereof. More specifically, the present invention relates to a CMOS imaging device capable of performing charge transfer efficiently and to a manufacturing method thereof.

2. Description of the Related Art

In recent years, mobile devices such as cellular phones have kept becoming more and more multifunctional. Among other things, a camera phone capable of easily taking a moving picture and a static image has been widespread, due to reflection of user's interests. It is necessary for such a mobile device to save power so as to be durable for long-time use. Moreover, as for a camera (hereinafter, referred to as an imaging element) mounted on the cellular phone, it is preferable to adopt a CMOS image sensor, which is more suitable for lowering power consumption in comparison with a CCD. The CMOS image sensor has an advantage of being inexpensive because it can be fabricated by a CMOS process required for forming a peripheral circuit, as well as an advantage of consuming less power.

There are some types in a structure of the CMOS image sensor. One of the structure types is disclosed in FIG. 1 of Patent Document 1. According to the structure, electrons generated in a photodiode pass under a transfer gate and are transferred to a floating diffusion region, charges in the floating diffusion region are converted into a voltage in a drive transistor, and the voltage is outputted as a signal voltage to the outside.

Need exists, in the CMOS image sensor, not to lower its charge transfer efficiency, even if the voltage thereof comes to be lowered. In consideration of this point, in Patent Document 1, the transfer gate is extended onto the floating diffusion region as shown in FIG. 6 of the document, and thus a capacitive coupling between the transfer gate and the floating diffusion region is increased. According to this structure, a potential of the floating diffusion region is raised to a positive potential of the transfer gate due to the capacitive coupling described above when a channel of the transfer gate is turned on, resulting in efficient transfer of the electrons from the channel of the transfer gate to the floating diffusion region.

On the other hand, in Patent Document 2, conductivity of a surface layer of a silicon substrate, which serves as the channel of the transfer gate, is set at the N type as shown in FIG. 1 of the document. Thus, the channel and the floating diffusion region are set at the same conductive type, and the charges are allowed to be transferred smoothly from the transfer gate to the floating diffusion region.

Besides the above, technologies relating to the present invention are also disclosed in Patent documents 3 to 5.

(Patent Document 1)
Japanese Patent Laid-Open No. 2003-101006

(Patent Document 2)
Japanese Patent Laid-Open No. 2003-115580

(Patent Document 3)
Japanese Patent Laid-Open No. Hei 8(1996)-335688

(Patent Document 4)
Japanese Patent Laid-Open No. 2000-152083

(Patent Document 5)
Japanese Patent Laid-Open No. 2002-110957

However, Patent Document 1 described above does not go beyond disclosing the structure of extending the transfer gate onto the floating diffusion region, and does not discover a method for realizing such a structure.

Meanwhile, in Patent Document 2, the conductivity of the entire silicon substrate under the transfer gate is set at the N type. Therefore, the channel of the transfer gate becomes prone to be turned on, and the electrons accumulated in the photodiode become prone to overflow to the floating diffusion region through the transfer gate. In such a case, an amount of electrons capable of being accumulated in the photodiode is reduced, and a value of the signal voltage obtained by converting the electrons to a voltage is also reduced. Accordingly, a ratio (S/N ratio) of the signal voltage value and a noise voltage value becomes reduced, causing a possibility that noise of the imaging device is increased.

SUMMARY OF THE INVENTION

According to a first aspect of the present invention, there is provided an imaging device comprising: a photodiode and a floating diffusion region formed to be spaced from each other on a surface layer of a pixel region of a semiconductor substrate; and a transfer gate having either of a concave and convex portion toward the floating diffusion region, the transfer gate being formed above the semiconductor substrate between the photodiode and the floating diffusion region by interposing a gate insulating film therebetween.

According to a second aspect of the present invention, there is provided an imaging device comprising: a photodiode; a floating diffusion region; a transfer transistor that transfers charges generated in the photodiode to the floating diffusion region; a power source line to which a first voltage is applied; a reset transistor that resets a voltage of the floating diffusion region to the first voltage; a signal line; a selection transistor in which a drain is electrically connected to the power source line; a detection transistor in which a drain is electrically connected to a source of the selection transistor, a source is electrically connected to the signal line, and a gate is electrically connected to the floating diffusion region; and a voltage supply circuit that selectively outputs a second voltage and a third voltage higher than the second voltage to the signal line, wherein the second voltage is a voltage at which the detection transistor is turned to an ON state when the second voltage is outputted to the signal line, the floating diffusion region is reset to the first voltage, and the selection transistor is in an OFF state.

According to a third aspect of the present invention, there is provided an imaging device comprising: a photodiode; a floating diffusion region; a transfer transistor that transfers charges generated in the photodiode to the floating diffusion region; a power source line to which a first voltage is applied; a reset transistor that resets a voltage of the floating diffusion region to the first voltage; a signal line; a selection transistor in which a drain is electrically connected to the power source line; a detection transistor in which a drain is electrically connected to a source of the selection transistor, a source is electrically connected to the signal line, and a gate is electrically connected to the floating diffusion region; and a voltage supply circuit that selectively outputs a second voltage and a third voltage higher than the second voltage, wherein the second voltage is a voltage at which the detection transistor is left in an OFF state when the second voltage is outputted to the signal line, the floating diffusion region is reset to the first voltage, and the selection transistor is in an OFF state.

According to a fourth aspect of the present invention, there is provided a method of manufacturing an imaging device comprising: forming a first insulating film on a semiconductor substrate; forming a transfer gate and a gate electrode of a reset transistor at an interval on the first insulating film; forming a first resist pattern over the semiconductor substrate, the first resist pattern having a first window in which a first side face of the transfer gate and a second side face of the gate electrode are exposed; forming a floating diffusion region on a surface layer of the semiconductor substrate between the transfer gate and the gate electrode by introducing an impurity into a surface layer of the semiconductor substrate through the first window; removing the first resist pattern; after removing the first resist pattern, forming a second resist pattern over the semiconductor substrate, the second resist pattern covering the second side face of the gate electrode and having a second window in which the first side face of the transfer gate are exposed; forming a highly doped region in the floating diffusion region by introducing the impurity into the surface layer of the semiconductor substrate through the second window of the second resist pattern; removing the second resist pattern; forming a photodiode in the surface layer of the semiconductor substrate beside a third side face of the transfer gate, the third face being opposite with the first side face; and forming a drain region of the reset transistor by introducing an impurity into the surface layer of the semiconductor substrate beside a fourth side face of the gate electrode, the fourth side face being opposite with the second side face.

According to the fifth aspect of the present invention, there is provided a method of manufacturing an imaging device comprising: forming an insulating film on a semiconductor substrate; forming a transfer gate and a gate electrode of a reset transistor at an interval on the insulating film; forming a resist pattern over the semiconductor, the resist pattern having a window in which a first side face of the transfer gate and a second side face of the gate electrode are exposed, the first side face and the second side face locating under the different edges of the window; forming a floating diffusion region in a surface layer of the semiconductor substrate between the transfer gate and the gate electrode by introducing an impurity into the surface layer of the semiconductor substrate through the window; forming a highly doped region in the floating diffusion region by ion-implanting an impurity into the surface layer of the semiconductor substrate through the window while tilting the semiconductor substrate to a direction where a shadow of the window of the resist pattern appears from the second side face of the gate electrode; removing the resist pattern; forming a photodiode in the surface layer of the semiconductor substrate beside a third side face of the transfer gate, the third side face being opposite with the first side face; and forming a drain region of the reset transistor by introducing an impurity into the surface layer of the semiconductor substrate beside a fourth side face of the gate electrode, the forth side face being opposite with the second side face.

According to the above-described first aspect of the present invention, an opposite area of the transfer gate and the floating diffusion region can be made large by the transfer gate having concave or convex portion, and an overlap capacitance between the transfer gate and the floating diffusion region can be increased. Hence, when a predetermined potential is applied to the transfer gate to turn on a channel under the transfer gate, a potential of the floating diffusion region is drawn to a potential of the transfer gate to be deepened by the above-described overlap capacitance, and charges generated in the photodiode can be efficiently transferred to the floating diffusion region.

In addition, by returning the potential of the transfer gate to an original potential so as to turn off the channel thereunder, the potential of the floating diffusion region returns to an original potential. Accordingly, since a state where a potential difference between the floating diffusion region and the semiconductor substrate is high does not last for a long time, a junction leakage between the semiconductor substrate and the floating diffusion region can be prevented, and a highly reliable imaging device can be provided.

Moreover, a reset transistor which uses the floating diffusion region as a source region may be provided in the pixel region, and a peripheral circuit may be provided in a peripheral circuit region of the semiconductor substrate. In this case, it is preferable that, in the lateral direction of the semiconductor substrate, a gate electrode of the reset transistor overlap the floating diffusion region by a first width, and a gate electrode of a periphery transistor overlap either of a source region and drain region of the peripheral transistor by a second width wider than the first width.

With such a structure, an overlap capacitance between the gate electrode of the reset transistor and the floating diffusion region is made smaller than an overlap capacitance between the source/drain regions and gate electrode of the peripheral transistor. Hence, when the charges generated in the photodiode are transferred to the floating diffusion region in a state where the reset transistor is in an OFF state, it becomes difficult for the potential of the floating diffusion region to be drawn toward the gate voltage of the reset transistor. Together with the above, in the case where the floating diffusion region is reset to a reset voltage, the voltage of the floating diffusion region can be restricted from being lowered through the above-described overlap capacitance when the reset transistor is changed from an ON state to an OFF state. Therefore, the potential of the floating diffusion region, which is viewed from the charges, is not made shallow, and the charge transfer from the photodiode to the floating diffusion region can be performed efficiently.

Moreover, it is preferable that the transfer gate overlap the floating diffusion region by a third width wider than the above-described second width and narrower than a gate length of the above-described transfer gate in the lateral direction of the above semiconductor substrate.

With such a structure, the overlap capacitance between the transfer gate and the floating diffusion region is made larger. Accordingly, the potential of the floating diffusion region can be deepened similarly to the first aspect of the present invention, and thus the charge transfer can be performed efficiently. In addition, the overlap width (third width) is shortened more than a gate length of the transfer gate, and accordingly, conductivity of the entire surface under the transfer gate is not set at the N type as in Patent Document 2. Hence, in the case where the charges are electrons, it is possible to completely turn off the channel under the transfer gate by setting the potential of the gate electrode at grand potential. Therefore, a sufficient amount of charges can be reserved in the photodiode before the transfer, and the S/N ratio of the signal can be made larger than in Patent Document 2.

Furthermore, the gate length of the transfer gate is made longer than a gate length of the reset transistor. Thus, even if the transfer gate is overlapped largely with the highly doped region as described above, the length of the channel under the transfer gate is elongated in comparison with the case where the respective gate lengths of the transfer gate and the reset transistor are equal to each other. Accordingly, a short channel effect under the transfer gate can be restricted, and characteristics of the transfer gate can be prevented from being largely varied for each unit pixel.

Moreover, it is preferable that a channel width of the transfer gate be made wider than a channel width of the reset transistor. With such a structure, an overlap area of the transfer gate with the floating diffusion region can be made relatively larger than an overlap area of the gate of the reset transistor with the floating diffusion region. Accordingly, it becomes easy to deepen the potential of the floating diffusion region, and the charge transfer can be performed far more efficiently.

Furthermore, a highly doped region may be formed in the floating diffusion region closer to the transfer gate, an impurity concentration of the highly doped region being higher than other portions of the floating diffusion region, and an element isolation insulating film may be formed on a surface layer of the semiconductor substrate defining at least one edge of the highly doped region. In this case, an insulating film is formed on the highly doped region, a hole is formed in the insulating film, and a conductive plug electrically connected to the highly doped region is formed in the hole.

According to this, even if the hole is positionally shifted to reach an end of the element isolation insulating film and to cut the element isolation insulating film to some extent at the time of forming the hole, it becomes difficult for the conductive plug to reach the semiconductor substrate under the highly doped region because the highly doped region is formed deeply at the high concentration in the semiconductor substrate. Thus, it becomes difficult for the junction leakage between the silicon substrate and the floating diffusion region to occur under the conductive plug in comparison with the case of forming only a thin and shallow floating diffusion region without forming the highly doped region, and reliability of the imaging device can be enhanced.

Note that a detection transistor in which a gate electrode is electrically connected to the floating diffusion region may be formed in the pixel region. In this case, it is preferable that a gate electrode of the detection transistor be overlapped with a source/drain region of the detection transistor by a fourth width narrower than the above-described second width. According to this, an overlap capacitance between the source and gate of the detection transistor is made smaller than that of the peripheral circuit. Accordingly, the gate voltage of the detection transistor can be made to sensitively response to the variations of the charges in the floating diffusion region, and an output voltage in response to an amount of the charges can be outputted from the source region of the detection transistor with a good sensitivity. Furthermore, an overlap width between the source and gate of the detection transistor is narrower in comparison with that of the peripheral circuit. Accordingly, even if the gate length of the detection transistor is shortened as a result of an increased miniaturization of the device, a short channel effect of the detection transistor can be restricted more than that of the peripheral circuit, and thus the characteristics of the detection transistors can be prevented from being varied among the unit pixels.

Moreover, the transfer gate and the floating diffusion region may be covered with an insulating film whose upper surface is uneven. In this case, it is preferable to provide a conductive pattern formed on the insulating film and in the hole to be electrically connected to the floating diffusion region and covering the transfer gate and the floating diffusion region.

With such a structure, unnecessary light that is going to be incident onto the floating diffusion region can be shielded by the conductive pattern, thus making it possible to prevent noise from being generated in the floating diffusion region.

In addition, in cooperation with the overlap capacitance between the transfer gate and the floating diffusion region, the overlap capacitance between the conductive pattern and the transfer gate functions so as to deepen the potential of the floating diffusion region, and accordingly, the charge transfer can be performed far more efficiently.

Furthermore, the conductive pattern is formed on the insulating film whose upper surface is made uneven without being planarized. Accordingly, an opposite area of the conductive pattern and the transfer gate can be made large owing to roughness of a lower surface of the conductive pattern, and the overlap capacitance therebetween can be increased.

Moreover, in comparison with the case where another planarized insulating film is formed on the insulating film and the conductive pattern is formed thereon, a distance between the conductive pattern and the floating diffusion region can be shortened. Accordingly, it becomes far more difficult for extra light to invade the floating diffusion region, and the above-described light shielding effect can be enhanced.

Note that a highly doped region whose impurity concentration is higher than other portions of the floating diffusion region may be formed in the floating diffusion region in a portion extending from a side of the transfer gate to a portion under the above-described hole.

In this case, it is preferable to form an amorphous silicon film as a lowermost layer of the conductive pattern. With such a structure, the junction leakage between the highly doped region and the semiconductor substrate under the hole can be reduced in comparison with the case where the conductive pattern is constituted of a metal film and an electrical connection between the metal film and the highly doped region is performed by the conductive plug in the hole and the like.

According to the above-described second aspect of the present invention, as the above-described second voltage, adopted is a voltage at which the detection transistor is turned to an ON state when the second voltage is outputted to the signal line, the floating diffusion region is reset to the first voltage, and the selection transistor is in an OFF state. According to this, at the time of the charge transfer, the potential of the floating diffusion region can be deepened through the capacitance between the channel and gate of the detection transistor by raising the potential of the signal line from the second voltage to the third voltage, and hence the charge transfer efficiency can be enhanced.

In addition, it is when the potential of the signal line is raised from the second voltage to the third voltage that the potential of the floating diffusion region is deepened. Other than this time, the above-described capacitance between the channel and the gate is not formed. Hence, a state where a potential difference between the floating diffusion region and the semiconductor substrate is large does not last long. Therefore, the junction leakage between the floating diffusion region and the semiconductor substrate can be reduced.

Furthermore, according to this, it is not necessary to provide a large overlap capacitance between the transfer gate and the floating diffusion region, and accordingly, a floating capacitance of the signal line can be prevented from being increased due to the overlap capacitance, and thus a signal delay of the signal line can be reduced.

According to the above-described third aspect of the present invention, as the above-described second voltage, adopted is a voltage at which the detection transistor is left in an OFF state when the second voltage is outputted to the signal line, the floating diffusion region is reset to the first voltage, and the selection transistor is in an OFF state. According to this, the voltage of the floating diffusion region is raised toward the second voltage of the signal line by the overlap capacitance between the gate and source of the detection transistor, and hence the potential of the floating diffusion region, which is viewed from the charges, is deepened, so the charge transfer can be performed efficiently.

Furthermore, the capacitance between the channel and gate of the detection transistor is not created in a state where the second voltage is outputted to the signal line. Accordingly, the floating capacitance of the signal line connected to the source of the detection transistor is not increased by the above-described capacitance between the channel and the gate, and thus the signal delay of the signal line can be reduced.

Note that, in the above-described second and third aspects of the present invention, the second voltage is supplied from a voltage supply circuit to the signal line, and the reset transistor is turned to an ON state, whereby the voltage of the floating diffusion region is reset to the first voltage. Moreover, the reset transistor is turned to an OFF state, and the third voltage is supplied from the voltage supply circuit to the signal line, whereby the voltage of the floating diffusion region is raised. Furthermore, the transfer transistor is turned to an ON state, whereby the charges generated in the photodiode is transferred to the floating diffusion region. According to these operations, it becomes easy to obtain the respective advantages described above.

Moreover, in any of the above-described aspects of the present invention, it is only at the time of the charge transfer that the potential of the floating diffusion region is deepened. Therefore, even if a standby time, which starts after the charge transfer and ends before the signal reading, is elongated to some extent, for example, 1 millisecond or more, the junction leakage between the floating diffusion region and the semiconductor substrate can be reduced.

Furthermore, in a method where charge transfer from the photodiode to the floating diffusion region is performed for all rows collectively, followed by reading out a source voltage of the detection transistor as a signal voltage for each row, each row has a different standby time from the charge transfer to the reading out and the standby time is elongated in more rear rows. However, in the present invention, the junction leakage is reduced as described above, and accordingly, this method can be suitably adopted.

According to the above-described fourth aspect of the present invention, the highly doped region is formed in the floating diffusion region. Accordingly, an impurity in the highly doped region is diffused into the semiconductor substrate below the transfer gate, and thus a large overlap capacitance can be created between the floating diffusion region and the transfer gate, and hence an imaging device in which the charge transfer efficiency is enhanced can be manufactured.

Moreover, after forming the, highly doped region, a silicide layer may be formed on a surface layer of the above-described drain region while covering the floating diffusion region with the second insulating film, and a third insulating film covering the silicide layer and the floating diffusion region may be formed. In this case, it is preferable to form a first hole for getting contact with the highly doped region and a second hole for getting contact with the silicide layer in the third insulating film. Then, by employing fist and second etching conditions different from each other for the first and second holes, contact characteristics of the respective holes can be prevented from being varied by the fact that one hole is cut deeper than the other hole due to a difference between materials under the respective holes.

According to the above-described fifth aspect of the present invention, at the time of forming the highly doped region by angled ion-implantation, the highly doped region is not formed in the floating diffusion region closer to the gate electrode of the reset transistor. Therefore, the impurity is hardly diffused under the gate electrode of the reset transistor, and accordingly, the overlap capacitance between the gate electrode of the reset transistor and the floating diffusion region can be reduced.

In this case, the angled ion-implantation is performed while tilting the semiconductor substrate to a direction where the impurity is implanted under the first side face of the transfer gate, and thus the impurity is implanted under the transfer gate. Accordingly, the highly doped region can be overlapped with the transfer gate before the impurity is diffused. Hence, when the impurity is diffused by a heat treatment process, the highly doped region overlaps the transfer gate largely in comparison with the fourth aspect of the present invention, and accordingly, the overlap capacitance between the highly doped region and the transfer gate is made further larger, and the charge transfer efficiency can be further enhanced.

BRIEF DESCRIPTION OF THE DRAWINGS

FIGS. 4A to 4L are cross-sectional views of principal portions of the imaging device in steps of a manufacturing process in accordance with the first embodiment of the present invention;

FIGS. 20A to 20G are cross-sectional views of principal portions of an imaging device in steps of a manufacturing process in accordance with a fifth embodiment of the present invention;

FIG. 23A and FIG. 23B are cross-sectional views of principal portions of an imaging device in steps of a manufacturing process in accordance with a seventh embodiment of the present invention;

FIG. 24 is a plan view of the principal portions of the imaging device at some midpoint of the manufacturing process in accordance with the seventh embodiment of the present invention;

DETAILED DESCRIPTION OF THE PREFERRED EMBODIMENTS

The best mode for practicing the present invention will be described below in detail with reference to the accompanying drawings.

(First Embodiment)

First, an imaging device according to a first embodiment of the present invention will be described.

Figure 1:
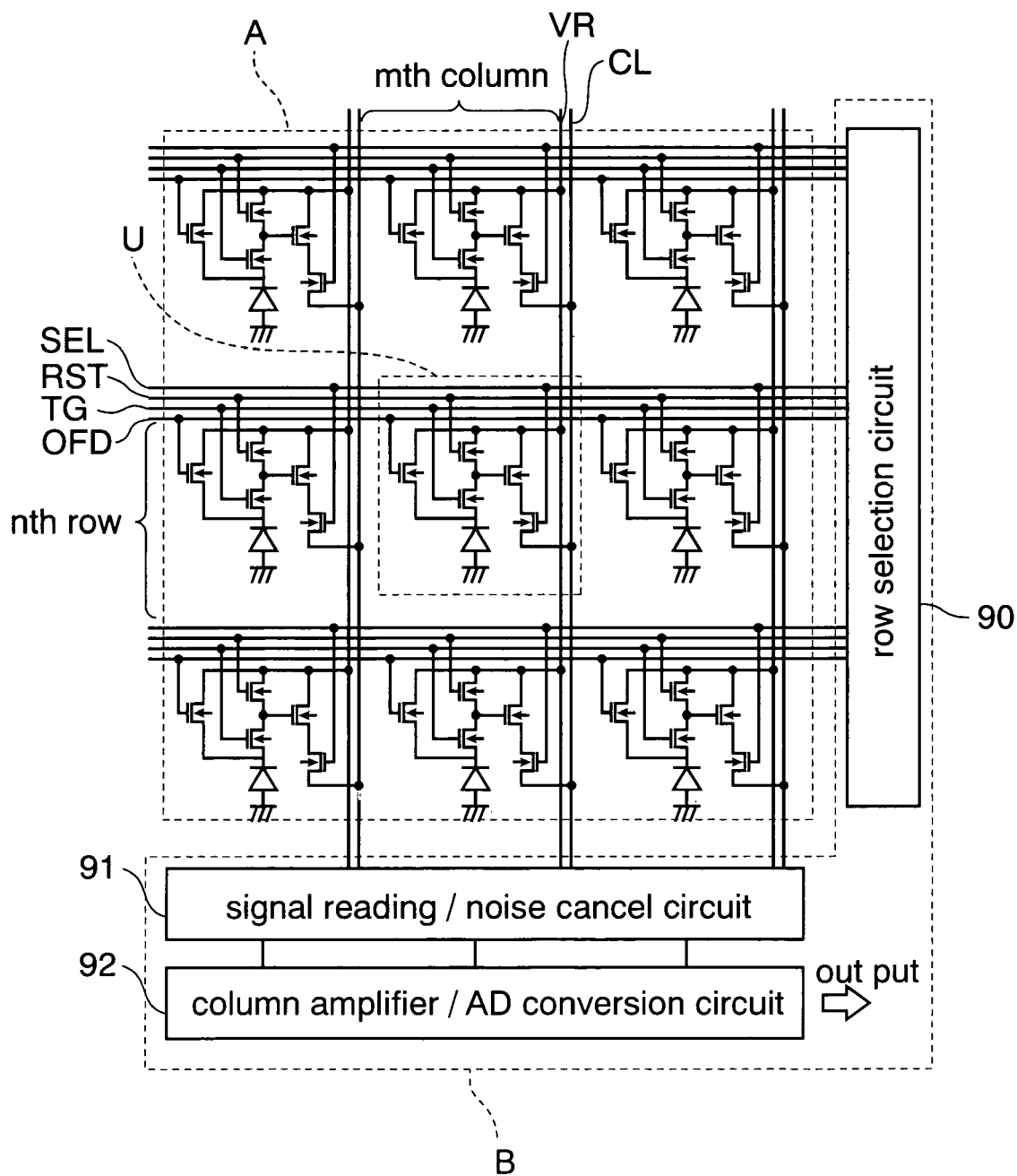
FIG. 1 is a circuit diagram of an imaging device according to a first embodiment of the present invention.

FIG. 1 is a circuit diagram of the imaging device according to this embodiment.

This imaging device is a CMOS image sensor, and can take both of a moving picture and a static image.

As shown in FIG. 1, this image sensor is broadly divided into a pixel region A and a peripheral circuit region B when viewed from the above. A plurality of unit pixels U are repeatedly arrayed in row and column directions on the pixel region A.

On the other hand, a row selection circuit 90, a signal reading/noise cancel circuit 91, and a column amplifier/AD conversion circuit 92 are formed on the peripheral circuit region B, as shown in the figure. Row selection line SEL, reset line RST, transfer gate line TG, and overflow drain line OFD, which is common to the unit pixels U in one row, is electrically connected to the row selection circuit 90. A vertical signal line CL, which is common to the unit pixels in one column, is electrically connected to the signal reading/noise cancel circuit 91.

Signal voltages read out of the respective unit pixels U are inputted to the signal reading/noise cancel circuit 91 through the vertical signal line CL. The signal voltages include noise because of variations in transistors manufactured in the unit pixels U. The signal reading/noise cancel circuit 91 performs correlated double sampling (CDS) in order to remove the noise, and thereafter, outputs clear signal voltages without the noise to the column amplifier/AD conversion circuit 92.

The signal voltages are amplified to an appropriate voltage value in the column amplifier/AD conversion circuit 92, and then outputted to the outside of the image sensor.

Figure 2:
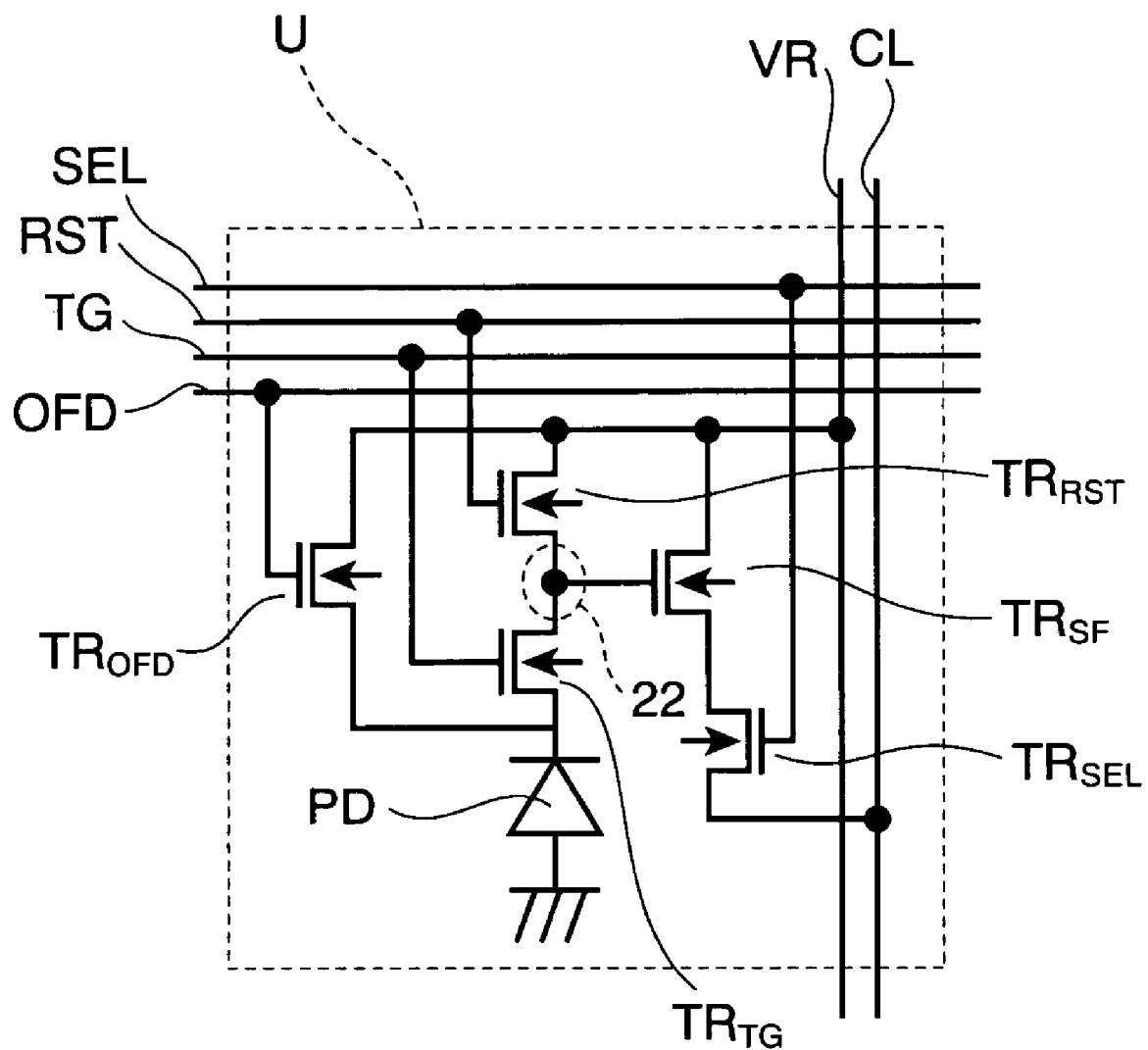
FIG. 2 is a circuit diagram of a unit pixel of the imaging device according to the first embodiment of the present invention.

FIG. 2 is a circuit diagram of the unit pixel U.

As shown in FIG. 2, the unit pixel U includes a photodiode PD which generates electrons in accordance with an amount of received light, and a transfer transistor $TR_{TG}$ for transferring electrons generated in the photodiode PD to a floating diffusion region 22 in a subsequent stage. The floating diffusion region 22, also serving as a source of a reset transistor $TR_{RST}$, is formed by introducing an N-type impurity onto a silicon substrate, and is electrically connected to a gate electrode of a detection transistor $TR_{SF}$. Then, a drain of a selection transistor $TR_{SEL}$ is electrically connected to a source of the detection transistor $TR_{SF}$.

According to such a circuit configuration, the detection transistor $TR_{SF}$ functions as a source follower. Accordingly, a gate voltage of the detection transistor $TR_{SF}$ is changed in accordance with the amount of electrons accumulated in the floating diffusion region 22, and an output voltage in accordance with the amount of light received by the photodiode can be obtained from the source of the $TR_{SF}$.

Next, an operation of the imaging device according to this embodiment will be briefly described with reference to FIG. 3. Note that, in the description below, FIGS. 1 and 2 are also referred to in combination with FIG. 3.

Figure 3:
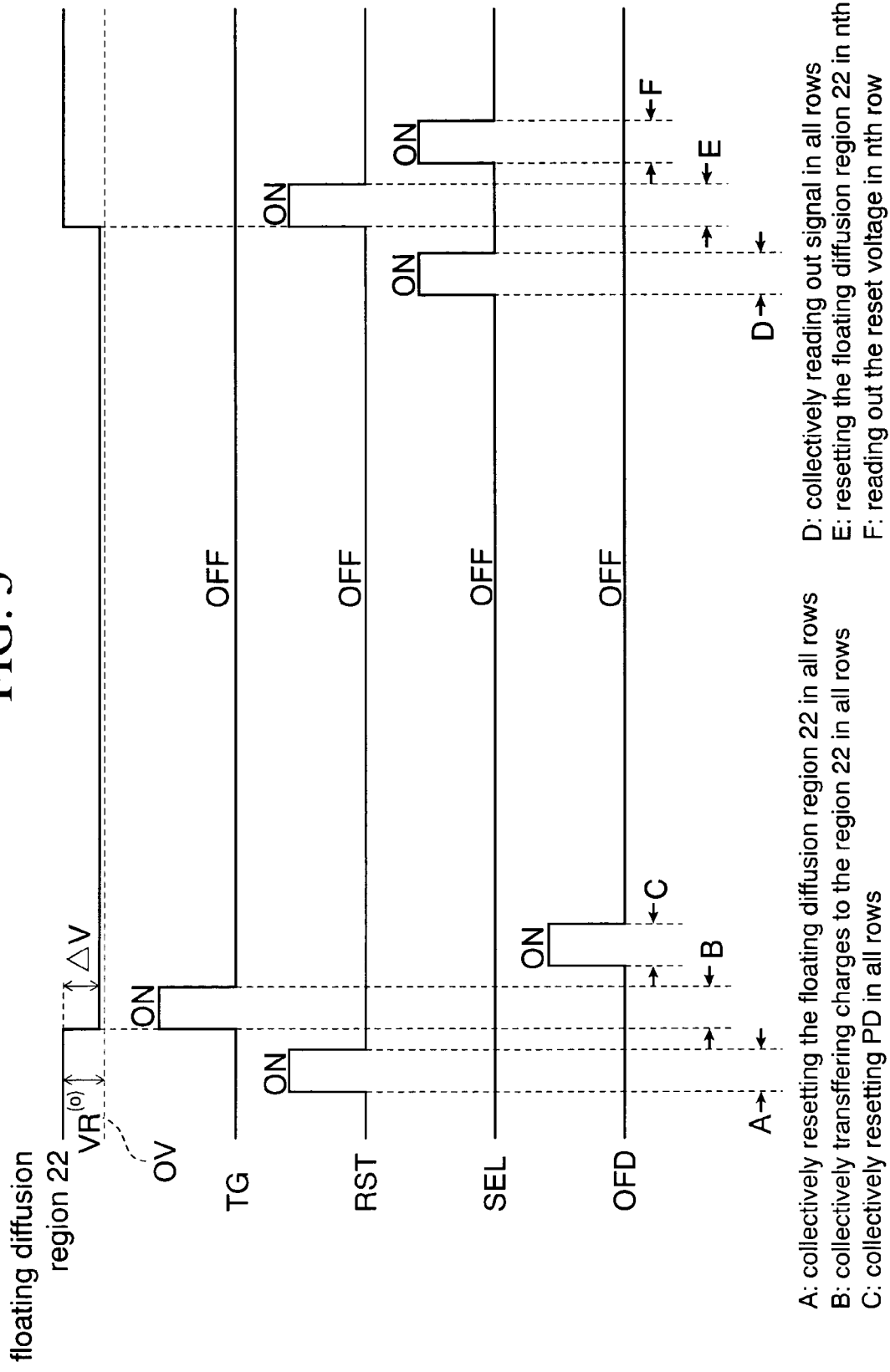
FIG. 3 is a timing chart showing an operation of the imaging device according to the first embodiment of the present invention.

FIG. 3 is a timing chart showing the operation of this CMOS image sensor.

As shown in FIG. 3, in a first step, the reset lines RST (see FIG. 2) in all the rows are set at a high level, and the reset transistors $TR_{RST}$ in all the rows are set to an ON state collectively. Thus, charges which have remained in the floating diffusion region 22 are discharged to the outside through the reset transistors $TR_{RST}$, and potentials of the floating diffusion regions 22 in all the rows are reset to a reset voltage $VR^{(0)}$ (for example, 1.8V) of power source lines VR collectively. Thereafter, the reset lines RST in all the rows are set at a low level, and the reset transistors $TR_{RST}$ of all the unit pixels U are turned to an OFF state. Note that, in this step, the transistors other than the reset transistor $TR_{RST}$ in FIG. 2 remain OFF.

Next, the transfer gate lines TG in all the rows are set at the high level, and the transfer transistors $TR_{TG}$ in all the unit pixels U are turned to an ON state collectively. Consequently, in all the unit pixels U, the electrons accumulated in the photodiodes PD are transferred to the floating diffusion regions 22 through the channels of the transfer transistors $TR_{TG}$ collectively. Furthermore, the transfer of the electrons lowers the potentials of the floating impurity regions 22 by V in accordance with the amount of the transferred electrons.

Thereafter, the transfer gate lines TG of all the rows are returned to the low level, and the transfer transistors $TR_{TG}$ of all the pixels are turned to an OFF state collectively.

Subsequently, the overflow drain lines OFD in all the rows are set at the high level, and the overflow drain transistors $TR_{OFD}$ of all the unit pixels U are turned to an ON state collectively, and the electrons remaining in the photodiodes PD are discharged to the outside from the overflow drain transistors $TR_{OFD}$. Thereafter, the overflow drain lines OFD of all the rows are set at the low level, and the overflow drain transistors $TR_{OFD}$ are turned to an OFF state collectively.

Subsequently, the row selection line SEL in an n-th row is set at the high level, and all the selection transistors $TR_{SEL}$ in the n-th row, which are connected to the row selection line SEL, are turned to an ON state collectively. Thus, source voltages of the detection transistors $TR_{SF}$ in the respective rows will be outputted as signal voltages in unison to the vertical signal line CL connected to the concerned rows. The outputted signal voltages reflect the amount of light received by the photodiodes PD, and is sample-held in the signal reading/noise cancel circuit 91 (see FIG. 1). Thereafter, the row selection line SEL in the n-th row is set at the low level, and the selection transistors $TR_{SEL}$ in the n-th row are turned to an OFF state.

Next, the reset line RST in the n-th row is set at the high level again, and the reset transistors in the n-th row are set to an ON state. Consequently, the electrons in the floating diffusion regions 22 are discharged to the outside through the reset transistors $TR_{RST}$, and the potentials of the floating diffusion regions 22 are reset again to the reset voltage $VR^{(0)}$ (approximately 1.8V). Thereafter, the reset line RST is set at the low level, and the reset transistors $TR_{RST}$ are turned to the OFF state.

Subsequently, the row selection line SEL in the n-th row is set at the high level again, and the selection transistors $TR_{SEL}$ in the n-th row are set to an ON state. Thus, signal voltages in the case where signal charges do not exist in the floating diffusion regions 22 (hereinafter, referred to as dark voltages) are outputted to the signal reading/noise cancel circuit 91 (see FIG. 1) from the vertical signal lines CL in the respective rows.

CDS is performed in the signal reading/noise cancel circuit 91, in which differences between signal voltage sample-held therein and above-described dark voltages is obtained. Thus, the noise included in the signal voltages is canceled, and the signal voltages in which the noise is lowered are outputted to the subsequent stage.

After reading the signals in the n-th row as described above, the same reading is also performed sequentially for the rows in the n+1-th row. Thus, the signal voltages of all the pixels are obtained, and one static image is obtained.

Next, a manufacturing method of the imaging device according to the present embodiment will be described.

FIGS. 4A to 4L are cross-sectional views of principal portions of an imaging device in steps of a manufacturing process in conformity with the present embodiment.

Note that FIGS. 5 to 8 are also referred to below in combination. FIGS. 5 to 8 are plan views showing the principal portions of the imaging device in the steps of the manufacturing process in conformity with the present embodiment.

First, a process until obtaining a cross-sectional structure shown in FIG. 4A will be described.

First, a trench for shallow trench isolation (STI) is formed in a surface of a P-type silicon substrate 1, and an $SiO_2$ film is buried into the trench as an element isolation insulating film 4. A structure of element isolation is not limited to the STI, and local oxidation of silicon (LOCOS) may also be used for the element isolation.

Next, ion implantation is performed for the silicon substrate 1 while covering the entire surface of the pixel region A with a resist pattern (not shown), and thus a P well 2 and an N well 3 are formed in the silicon substrate 1 of the peripheral circuit region B. Note that boron is used as a P-type impurity, and that phosphorus is used as an N-type impurity. These impurities are separately implanted by use of different resist patterns for each well.

Next, after a resist pattern covering the entire surface of the peripheral circuit region B is formed on the silicon substrate 1, boron is ion-implanted into the pixel region A as the P-type impurity, and thus a P well 2a is formed in the pixel region A.

Thereafter, a thermal oxidation film is formed on the surface of the silicon substrate 1 to a thickness of 5 to 10 nm, and the thermal oxidation film is used as a first insulating film 5.

Next, a polysilicon film is formed on the entire surface of the first insulating film 5 to a thickness of 100 to 250 nm by a thermal CVD method using $SiH_4$ gas. Thereafter, the polysilicon film is patterned by a photolithography method, and thus first to sixth gate electrodes 6 to 11 and a transfer gate 12 are formed at intervals. The transfer gate 12 functions as the gate electrode of the transfer transistor $TR_{TG}$ (see FIG. 2).

Next, a process until obtaining a cross-sectional structure shown in FIG. 4B will be described. First, a resist pattern (not shown) having a window on the N well 3 is formed on the silicon substrate 1, and boron, as the P-type impurity, is ion-implanted into the N well 3 while using the resist pattern as a mask. Thus, first and second P-type diffusion regions 13 and 14 is formed on both sides of the first gate electrode 6. Thereafter, the above-described resist pattern is removed.

Subsequently, a first resist pattern 43 is formed. The first resist pattern 43 covers a portion of the silicon substrate 1, which extends from the third gate electrode 8 to the fourth gate electrode 9, and covers the N well 3. Then, phosphorus is ion-implanted into the silicon substrate 1 under conditions where acceleration energy is 20 keV and a dose amount is $4 \times 10^{13}$ cm$^{-2}$, while using the first resist pattern as a mask. At the time of this ion implantation, the second to sixth gate electrodes 7 to 11 and the transfer gate 12 serve as masks, and accordingly, first to sixth N-type diffusion regions 15 to 20 is formed on sides of these gate electrodes in a self-aligning manner.

Thereafter, the first resist pattern 43 is removed.

Figure 4C:
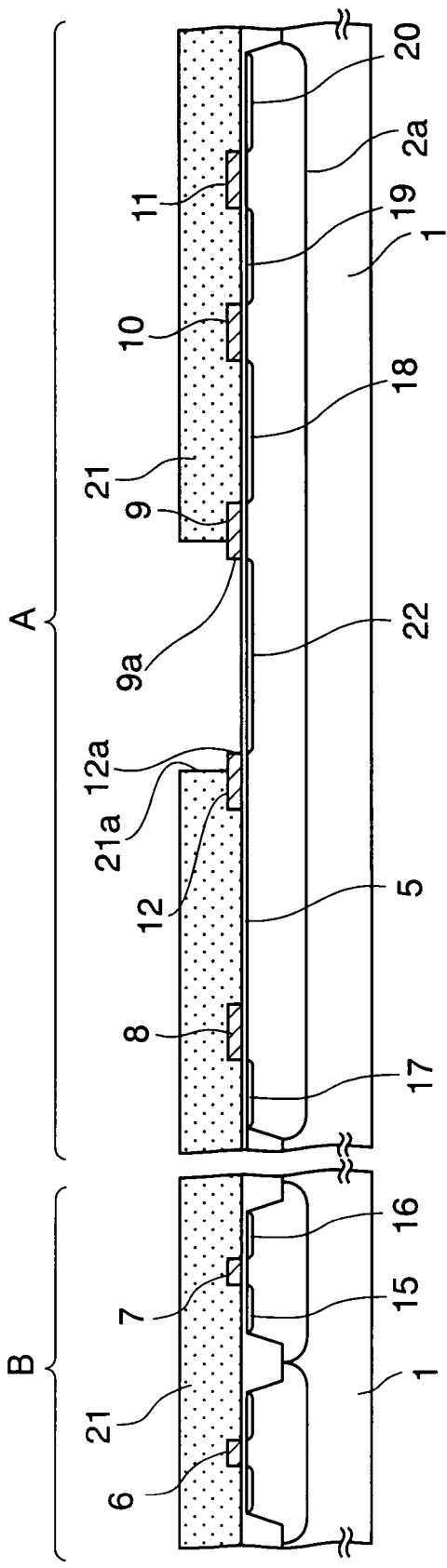

Next, as shown in FIG. 4C, a second resist pattern 21 having a first window 21a between the transfer gate 12 and the fourth gate electrode 9 is formed above the semiconductor substrate 1. The first window 21a is opened so as to have a size sufficient to expose a first side face 12a of the transfer gate 12 and a second side face 9a of the fourth gate electrode 9 that is opposite to the transfer gate 12.

Thereafter, N-type impurity, such as phosphorus, is ion-implanted into a surface layer of the semiconductor substrate 1 through the first window 21a by use of conditions where a concentration of the impurity is lower than that in the first to sixth N-type diffusion regions 15 to 20, for example, where the acceleration energy is 20 keV and the dose amount is $0.5 \times 10^{13}$ to $1 \times 10^{13}$ cm$^{-2}$. Thus, the floating diffusion region 22 is formed in the self-aligning manner between the sides of the gates 9 and 12 exposed to the first window 21 while using these gates as masks.

Thereafter, the second resist pattern 21 is removed.

Figure 5:
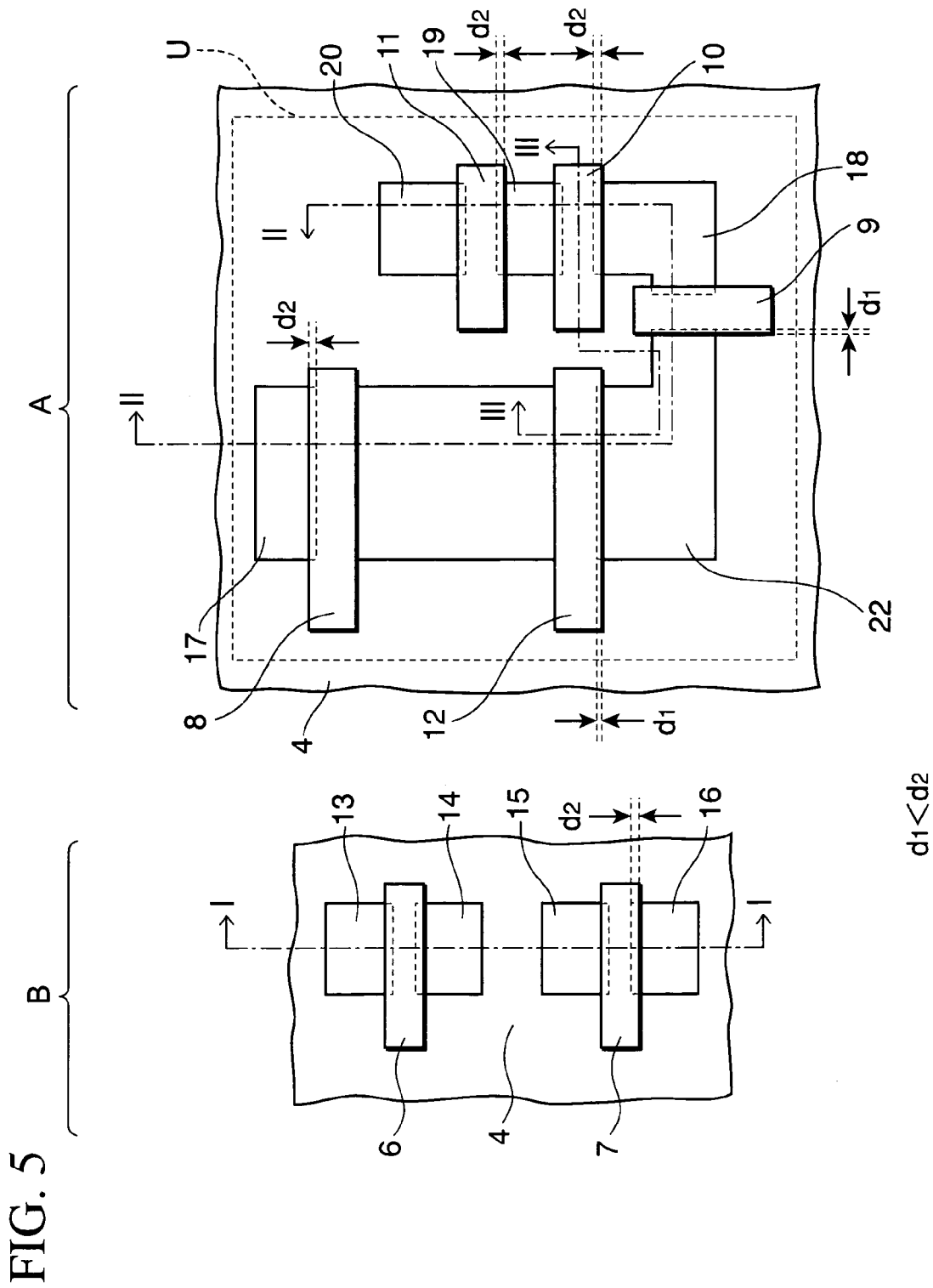
FIGS. 5 to 8 are plan views of the principal portions of the imaging device in the steps of the manufacturing process in accordance with the first embodiment of the present invention.

A plan view after the end of this process becomes as shown in FIG. 5. The cross-sectional view of the peripheral circuit region B of FIG. 4C shown in the above corresponds to a cross section along a line I—I of FIG. 5, and the cross-sectional view of the pixel region A thereof corresponds to a cross section along a line II—II of FIG. 5.

As shown in FIG. 5, a periphery of the unit pixel U is surrounded by the element isolation insulating film 4, and the unit pixel U has a plane layout in which both of the floating diffusion region 22 and the fourth N-type diffusion region 18 are bent in an L shape. When such a plane layout is employed, the unit pixels U can be arrayed in high density in matrix while widening a light receiving area of each photodiode formed between the third gate electrode 8 and the transfer gate 12, and a higher density of the device can be achieved.

Incidentally, when a heat treatment process is performed after the end of the above-described ion implantations, phosphorus in the floating diffusion region 22 is diffused in a lateral direction of the silicon substrate 1, and diffused under the transfer gate 12 and the fourth gate electrode 9. Hence, when viewed from above the silicon substrate 1, the floating diffusion region 22 overlaps both the transfer gate 12 and the fourth gate electrode 9 with a width d1. The width d1 becomes 0.00 to 0.05 μm under the above-described ion implantation conditions. However, it is preferable to set the width d1 at 0.03 μm by optimizing the ion implantation conditions appropriately.

For a similar reason, the first to sixth N-type diffusion regions 15 to 20 formed previously before the floating diffusion region 22 are seen to overlap the second to sixth gate electrodes 7 to 11 with a width d2. However, since an impurity concentration of these first to sixth N-type diffusion regions is higher than that of the floating diffusion region 22, the N-type diffusion regions 15 to 20 spread more than the floating diffusion region 22 in the lateral direction. Consequently, the overlap width d2 becomes wider than the first width d1 and, becomes approximately 0.05 μm for example.

Figure 4D:
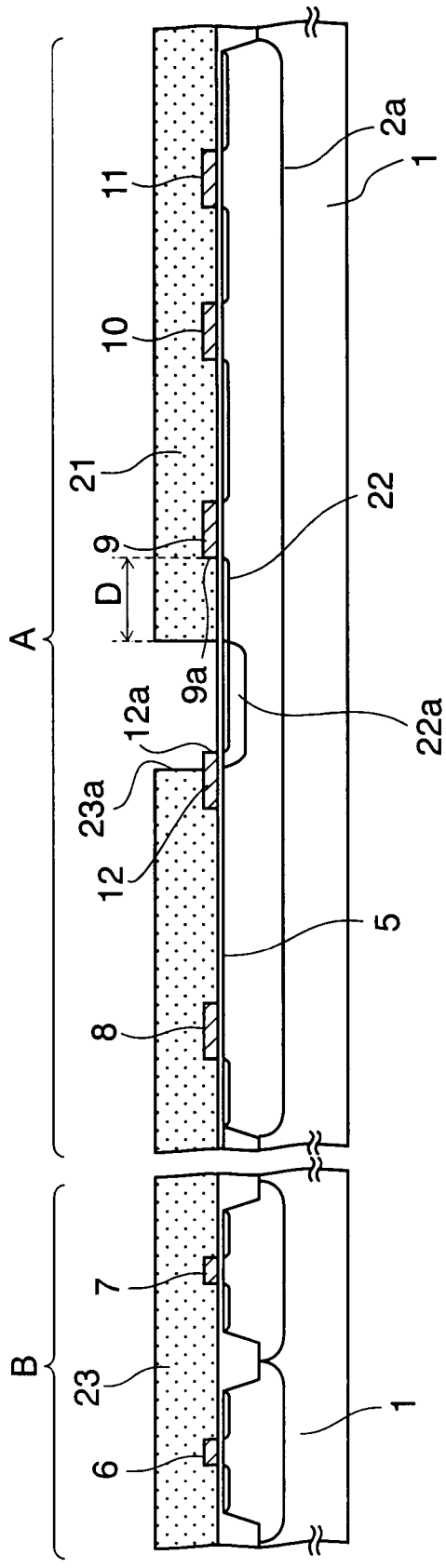

Subsequently, as shown in FIG. 4D, a third resist pattern 23 is formed above the silicon substrate 1. The third resist pattern covers the second side face 9a of the fourth gate electrode 9, and has a second window 23a, from which the first side face 12a of the transfer gate 12 exposes. The second window 23a is formed so as to be spaced from the second side face 9a by a sufficient distance D, for example, 0.2 μm or more.

Then, N-type impurity, such as phosphorus, is ion implanted into the surface layer of the silicon substrate 1 through the second window 23a under the conditions where the impurity concentration is increased more than in the case of forming the first to sixth N-type diffusion regions 15 to 20 and the floating diffusion region 22, for example, conditions where the acceleration energy 20 keV and the dose amount is $1 \times 10^{14}$ to $2 \times 10^{15}$ cm$^{-2}$. Thus, a highly doped region 22a is formed in the floating diffusion region 22 closer to the transfer gate 12.

In the case of this ion implantation, the transfer gate 12 exposed to the second window 23a serves as a mask, and therefore, the highly doped region 22a is formed in the self-aligning manner with respect to the transfer gate 12 immediately after the ion implantation. However, the phosphorus concentration in the highly doped region 22a is high, and accordingly, phosphorus in the highly doped region 22a is diffused much under the transfer gate 12 when the heat treatment process is performed. Thus, a structure in which the highly doped region 22a is extended under the transfer gate 12 is obtained.

Meanwhile, in the highly doped region 22a closer to the fourth gate electrode 9, the second window 22a is spaced from the fourth gate electrode 9 by the sufficient distance D. Accordingly, phosphorus in the highly doped region 22a is not diffused under the fourth gate electrode 9, or the highly doped region 22a is not extended under the fourth gate electrode 9.

Thereafter, the third resist pattern 23 is removed.

Figure 6:
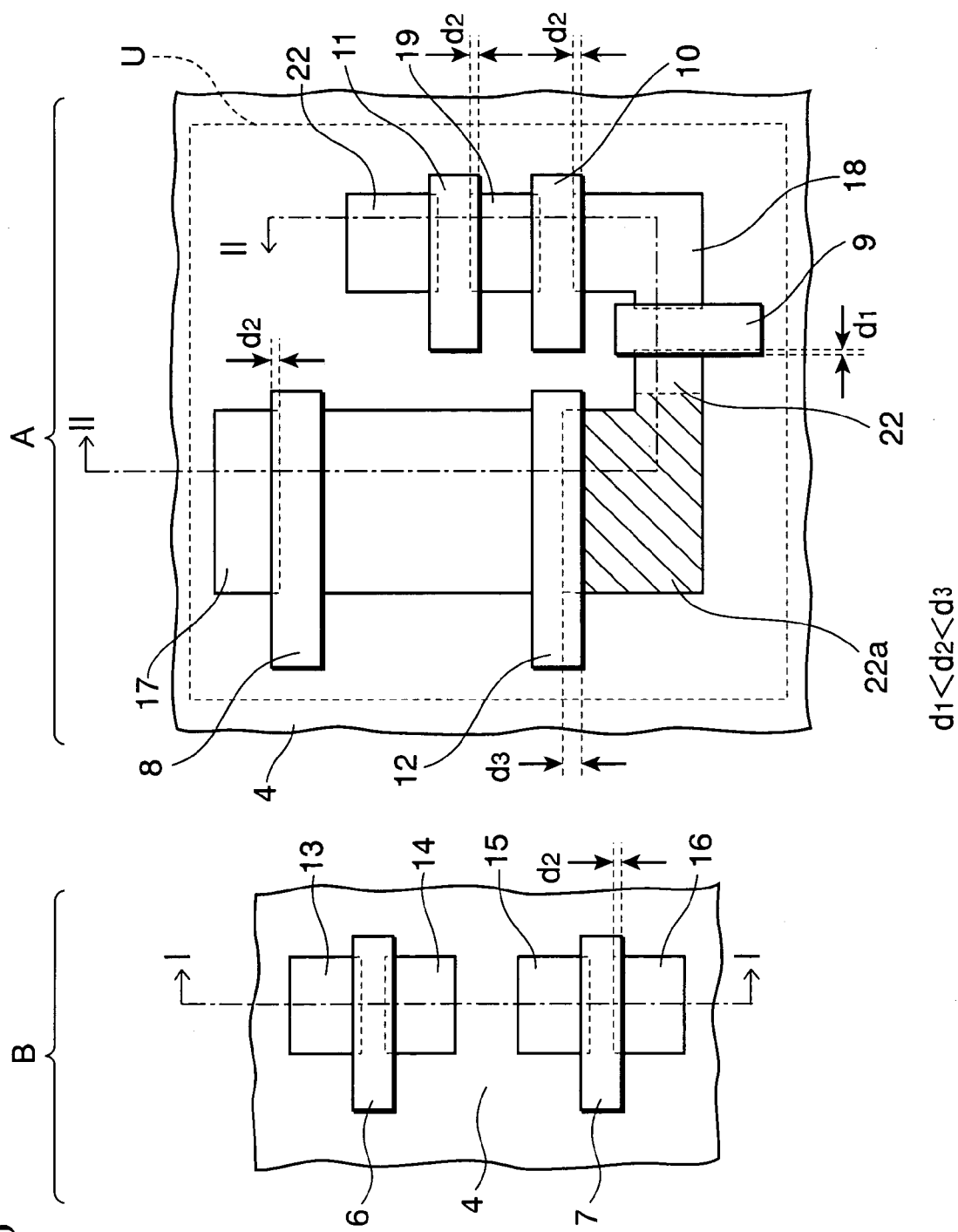

A plan view after the end of this process becomes as shown in FIG. 6. The cross-sectional view of the peripheral circuit region B of FIG. 4D shown in the above corresponds to a cross section along a line I—I of FIG. 6, and the cross-sectional view of the pixel region A thereof corresponds to a cross section along a line II—II of FIG. 6.

As shown in FIG. 6, both edges of the highly doped region 22a are defined by the element isolation insulating film 4. Then, the highly doped region 22a overlaps the transfer gate 12 with a third width d3. The impurity concentration of the highly doped region is set higher in comparison with that of the first to sixth N-type diffusion regions 15 to 20 and the floating diffusion region 22. Therefore, the width d3 is widened more than the widths d1 and d2 mentioned above. The width d3 becomes approximately 0.05 to 0.30 μm under the above-described ion implantation conditions. However, it is preferable to set the width at approximately 0.15 μm by optimizing the ion implantation conditions appropriately.

It should be noted that a relationship among the widths d1 to d3 is represented as d1<d2<d3 according to the above processes.

Next, a process until obtaining a cross-sectional structure shown in FIG. 4E will be described.

First, phosphorus is ion-implanted plural times, for example, twice to four times into the photodiode forming region between the third gate electrode 8 and the transfer gate 12 under conditions where the acceleration energy is 30 to 300 keV and the dose amount is $1 \times 10^{12}$ to $5 \times 10^{12}$ cm$^{-2}$. Thus, an embedded N-type diffusion layer 24 is formed. By performing the ion implantation plural times as described above, the embedded N-type diffusion layer 24 can be formed deeply into the substrate, and a concentration profile of the impurity can be made uniform in the depth direction.

Thereafter, boron is ion-implanted into the surface layer of the embedded N-type diffusion layer 24 under conditions where the acceleration energy is 10 to 30 keV and the dose amount is approximately $1 \times 10^{13}$ cm$^{-2}$, and thus a P$^+$ shield layer 25 is formed. Thus, a P$^+$NP-type embedded photodiode PD constructed from the P-type silicon substrate 1, the embedded N-type diffusion layer 24 and the P$^+$ shield layer 25 is formed beside the side of the third side face 12b opposite with the first side face 12a. The P$^+$ shield layer 25 prevents the N-type diffusion layer 24 thereunder from being brought into wide contact with the first insulating film 5 made of SiO$_2$, and plays a role of reducing a junction leakage along an interface between the embedded N-type diffusion layer 25 and the first insulating film 5.

Note that phosphorus and boron is separately ion-implanted using different resists in the above ion implantation.

Figure 4E:
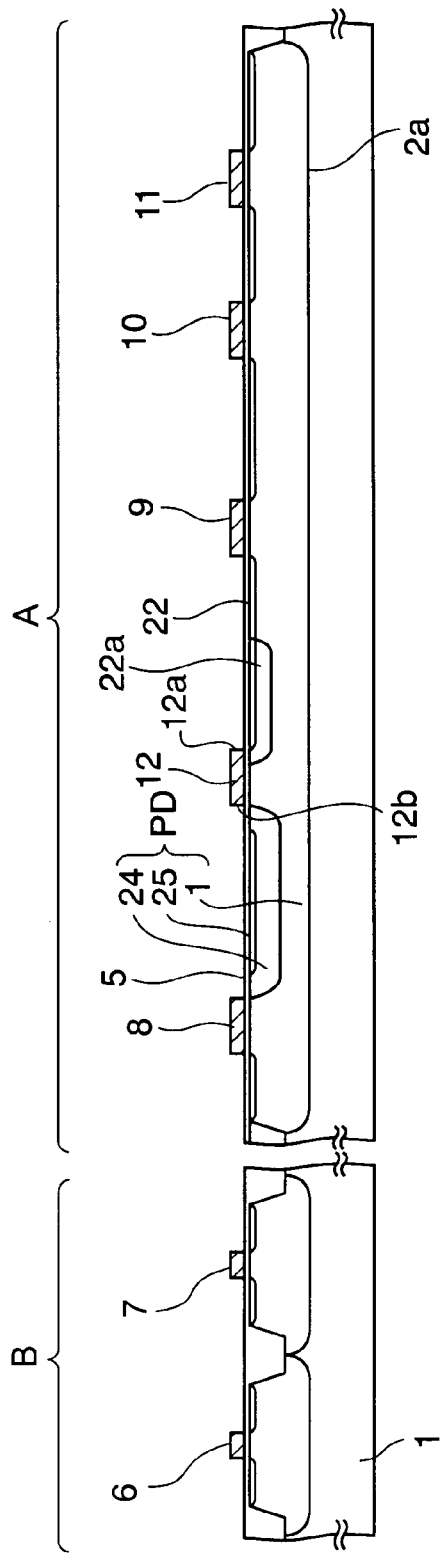
Figure 4F:
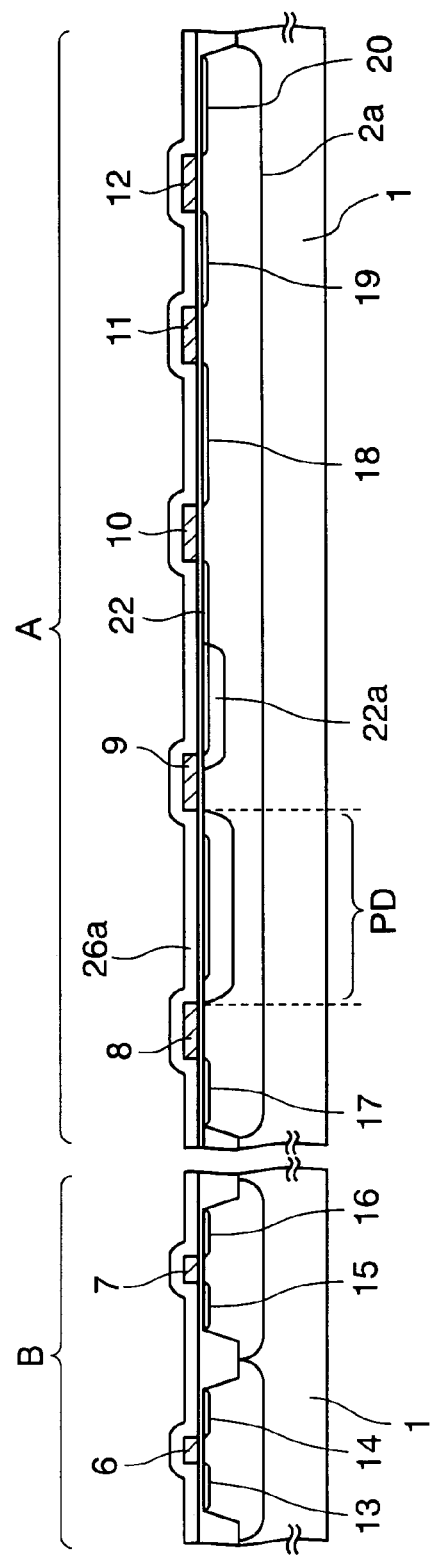

Next, as shown in FIG. 4F, as a second insulating film 26 covering the first to sixth gate electrodes 6 to 11, the diffusion regions 13 to 20 and the floating diffusion region 22, an SiO$_2$ film is formed to a thickness of approximately 100 nm by the CVD method. Note that a silicon nitride film formed by a reduced pressure CVD method may be used as the second insulating film 26. In the case of forming the silicon nitride film as described above, a substrate temperature at the time of deposition is maintained at, for example, 700 to 800° C.

Thereafter, as shown in FIG. 4G, a fourth resist pattern 27 covering the second insulating film 26 on the floating diffusion region 22 and photo diode (PD) are formed, and then the first and second insulating films 5 and 26 are anisotropically etched by reactive ion etching (RIE) while using the fourth resist pattern 27 as a mask. Consequently, the second insulating film 26 is left as insulating sidewalls 26a to 26j on the side surfaces of the respective gate electrodes 6 to 11, and the first insulating film 5 is patterned to be left as gate insulating films 5a to 5e under the respective gate electrodes 6 to 11.

Note that the second insulating film 26 under the fourth resist pattern 27 is left without being etched. Moreover, the gate insulating film 5c is common to the third and fourth gate electrodes 8 and 9 and the transfer gate 12.

Thereafter, the fourth resist pattern 27 is removed.

Next, a process until obtaining a cross-sectional structure shown in FIG. 4H will be described.

First, phosphorus is ion-implanted in high concentration into the first to sixth N-type diffusion regions 15 to 20 while using the second to sixth gate electrodes 7 to 11 and the insulating sidewalls 26c to 26j formed on the side surfaces thereof as masks under conditions where the acceleration energy is 20 keV and the dose amount is $2 \times 10^{15}$ cm$^{-2}$. Thus, the respective N-type diffusion regions 15 to 20 are made into lightly doped drain (LDD) structures. Furthermore, boron is ion-implanted into the first and second P-type diffusion regions 13 and 14, and these regions 13 and 14 are also made into the LDD structures.

Subsequently, after removing natural oxidation films formed on surfaces of each diffusion layers 13 to 20 and gate electrodes 6 to 11 by HF treatment or the like, a cobalt layer is formed on the entire surface to a thickness of approximately 5 to 30 nm by a sputtering method. Note that a refractory metal layer, such as titanium layer and nickel layer, may be formed in place of the cobalt layer.

Next, rapid thermal anneal (RTA), in which the substrate temperature is 500 to 600° C. and a treatment time is approximately 30 to 90 seconds, is performed to react the cobalt layer and silicon with each other, and thus cobalt silicide layers 28a to 28h are formed on the surfaces of the each diffusion layers 13 to 20. The cobalt silicide layers are also formed on upper surfaces of the each gate electrodes 6 to 11, and electrical resistances of these gate electrodes 6 to 11 are lowered. Thereafter, unreacted cobalt layers are removed by wet etching.

According to the processes described above, a complementary MOS structure (CMOS) structure, in which peripheral transistors TR$_P$ and TR$_N$ of P-channel and N-channel types are adjacent to each other, is formed in the peripheral circuit region B. The peripheral transistors TR$_P$ and TR$_N$ use the P-type diffusion regions 13 and 14 and the N-type diffusion regions 15 and 16 as their source/drain regions respectively.

Moreover, in the pixel region A, the overflow drain transistor TR$_{OFD}$, the transfer transistor TR$_{TG}$, the reset transistor TR$_{RST}$, the detection transistor TR$_{SF}$, and the selection transistor TR$_{SEL}$ are formed as illustrated. Among these transistors, the transfer transistor TR$_{TG}$ uses the photodiode PD as a source region, and uses the floating diffusion region 22 as a drain region.

Note that the fourth N-type diffusion region 18, exposed to a side of the fourth side face 9b opposite with the second side face 9a, functions as a drain region of the reset transistor TR$_{RST}$. Then, the floating diffusion region 22 functions as the source region of the reset transistor TR$_{RST}$.

Then, the detection transistor TR$_{SF}$ uses the fourth N-type diffusion region 18 as a source region, and uses a fifth N-type diffusion region 19 as a drain region.

Figure 7:
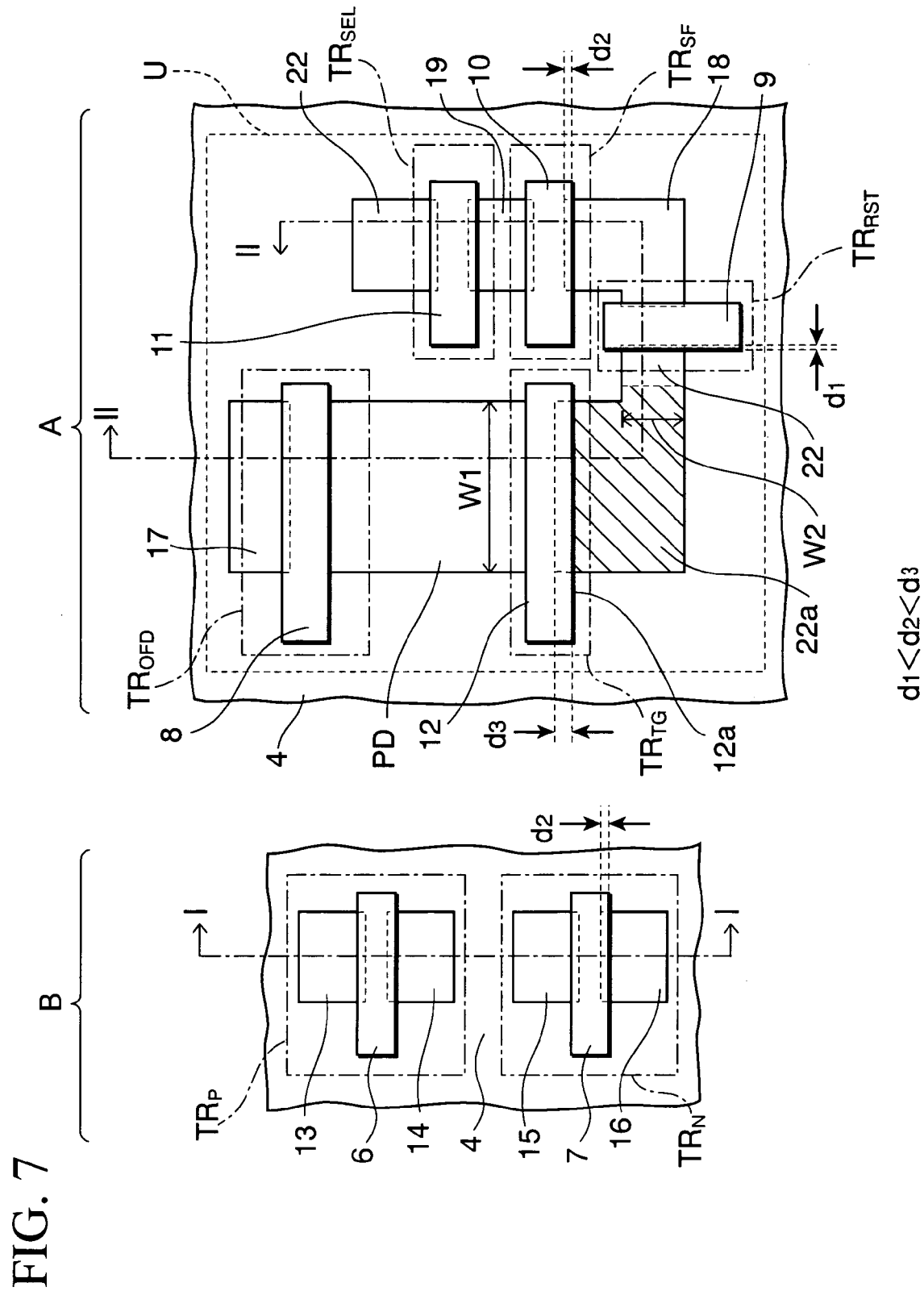

A plan view after the end of this process becomes as shown in FIG. 7. The cross-sectional view of the peripheral circuit region B of FIG. 4H shown in the above corresponds to a cross section along a line I—I of FIG. 7, and the cross-sectional view of the pixel region A thereof corresponds to a cross section along a line II—II of FIG. 7.

Next, a process until obtaining a cross-sectional structure shown in FIG. 4I will be described.

First, an SiO$_2$ film is formed as a third insulating film 29 above the entire surface of the silicon substrate 1 by a high density plasma CVD (HDPCVD) method, and spaces between the respective transistors TR$_P$, TR$_N$, TR$_{OFD}$, TR$_{TG}$, TR$_{RST}$, TR$_{SF}$ and TR$_{SEL}$ are filled with the third insulating film 29. Thereafter, an upper surface of the third insulating film 29 is polished to be planarized by a chemical mechanical polishing (CMP) method, and a thickness of the third insulating film 29 on the plane surface of the silicon substrate 1 is set at approximately 700 nm. An additional SiN film of the thickness about 50 to 100 nm may be formed under the third insulating film 29.

Thereafter, photoresist is coated on the third insulating film 29, and then exposed and developed. Thus, a resist pattern (not shown) having a hole-shaped window is formed on the highly doped region 22a. Subsequently, a first hole 29a is formed in the gate insulating film 5c, the second insulating film 26 and the third insulating film 29 on the highly doped region 22a by RIE using gas mixture of CF$_4$ and CHF$_3$ as an etching gas, under a first etching condition where an etch rate for SiO$_2$ is higher than that for silicon. In the case where the additional SiN is formed under the third insulating film 29, similar etching condition is applicable.

Thereafter, the resist pattern on the third insulating film 29 is removed.

Next, a process until obtaining a cross-sectional structure shown in FIG. 4J will be described.

First, a resist pattern (not shown) having a hole-shaped window on the respective cobalt silicide layers 28a to 28f and 28h is formed on the third insulating film 29. Then, second holes 29b to 29h are formed on the respective cobalt silicide layers 28a to 28f and 28h by RIE using the gas mixture of $CF_4$ and $CHF_3$ as etching gas, under a second etching condition where the etch rate for $SiO_2$ is higher than that for the cobalt silicide.

Incidentally, though the first hole 29a and the second holes 29b to 29h are formed under the different etching conditions in the above, it is conceivable that the respective holes 29a and 29b are formed simultaneously under the same etching condition in place of the above. However, according to this method, while the etching is stopped under the second holes 29b to 29h by the cobalt silicide layers 28a to 28f serving as etching stoppers, a film serving as the etching stopper is not present under the first hole 29a. Accordingly, the silicon substrate 1 under the first hole 29a is dug, bringing a disadvantage in that contact characteristic of the first hole 29a is varied.

On the contrary, as described above, the first hole 29a and the second holes 29b to 29h are formed separately, and the first hole 29a is formed under the first etching condition where silicon serves as the etching stopper, thus making it possible to stop the etching for the first hole 29a on the upper surface of the silicon substrate 1, and to prevent the contract characteristics of the first hole 29a from being varied for each of the unit pixels U.

Note that a similar advantage to the above can be obtained even if a forming order of the holes is made reverse to the above, in which the first hole 29a is formed under the first etching condition after forming the second holes 29b to 29h under the second etching conditions.

Next, a process until obtaining a cross-sectional structure shown in FIG. 4K will be described.

First, by the sputtering method, a Ti film and a TiN film are formed as a glue film in this order on inner surfaces of the first and second holes 29a and 29b to 29h and the upper surface of the third insulating film 29. Each of the Ti film and TiN film is formed to a thickness, for example, of 30 nm. Subsequently, a tungsten (W) film is formed on this glue film by a CVD method using $WF_6$ gas, thus completely embedding the insides of the first and second holes 29a and 29b by the W film. Thereafter, extra glue film and W film formed on the upper surface of the third insulating film 29 are removed by the CMP method, and remaining films are left in the first and second holes 29a and 29b to 29h as first and second conductive plugs 30a and 30b to 30h.

The first conductive plug 30a is electrically connected to the highly doped region 22a, and the second conductive plugs 30b to 30h are electrically connected via the cobalt silicide layers 28a to 28h located thereunder to the respective diffusion regions 13 to 20.

Subsequently, as a metal stack film, a Ti film with a thickness of 30 nm, a TiN film with a thickness of 30 nm, an Al film with a thickness of 300 to 500 nm, a Ti film with a thickness of 5 to 10 nm, and a TiN film with a thickness of 50 to 100 nm, are formed in this order by the sputtering method on the respective upper surfaces of the third insulating film and conductive plugs 30a and 30b to 30h. Thereafter, this metal stack layer film is patterned by the photolithography method and formed as first level metal wiring 31 electrically connected to the respective conductive plugs 30a and 30b to 30h.

Figure 8:
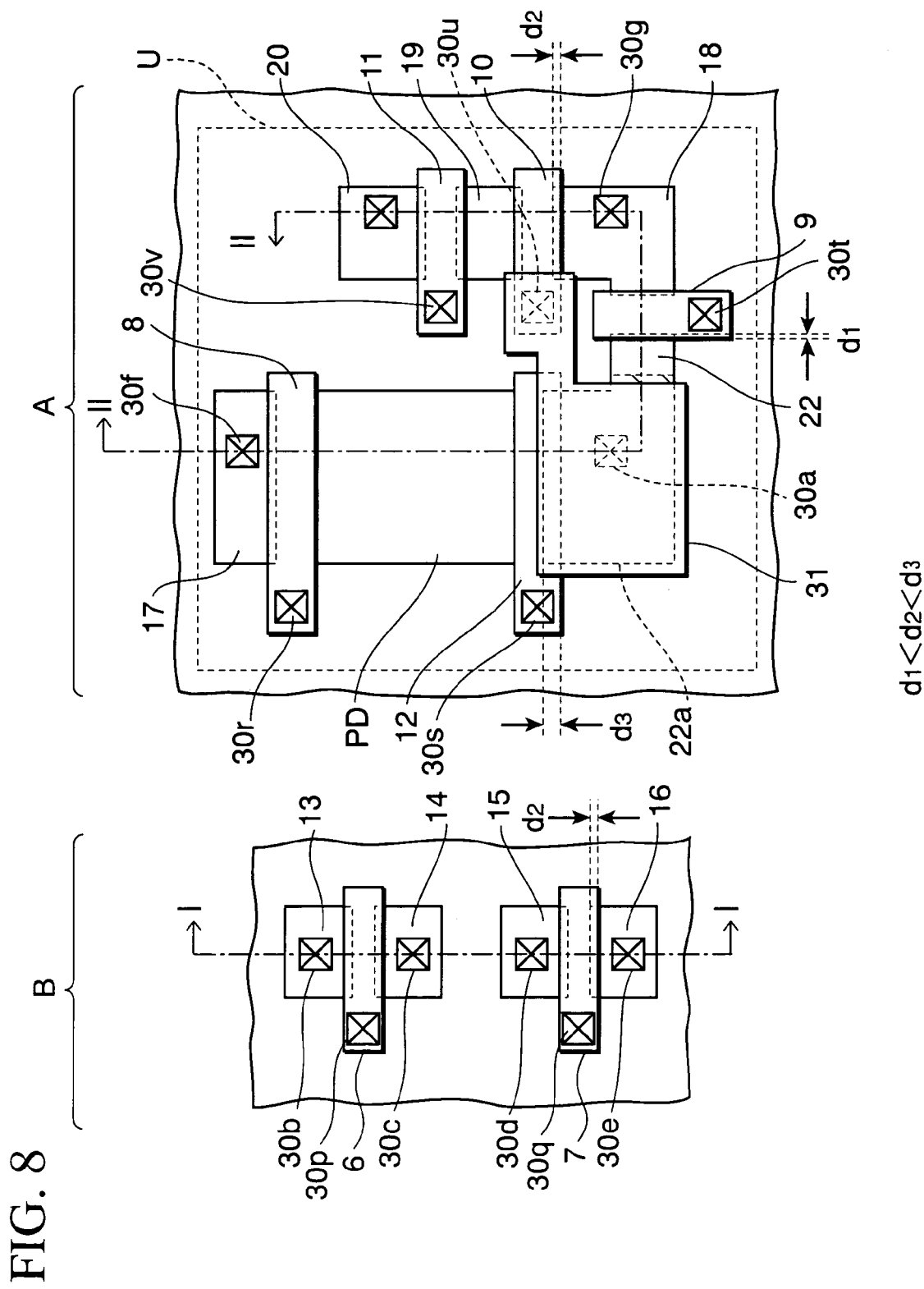

A plan view after the end of this process is as shown in FIG. 8. The cross-sectional view of the peripheral circuit region B of FIG. 4K shown in the above corresponds to a cross section along a line I—I of FIG. 8, and the cross-sectional view of the pixel region A thereof corresponds to a cross section along a line II—II of FIG. 8. However, the second and third insulating films 26 and 29 are omitted in FIG. 8.

Figure 4K:
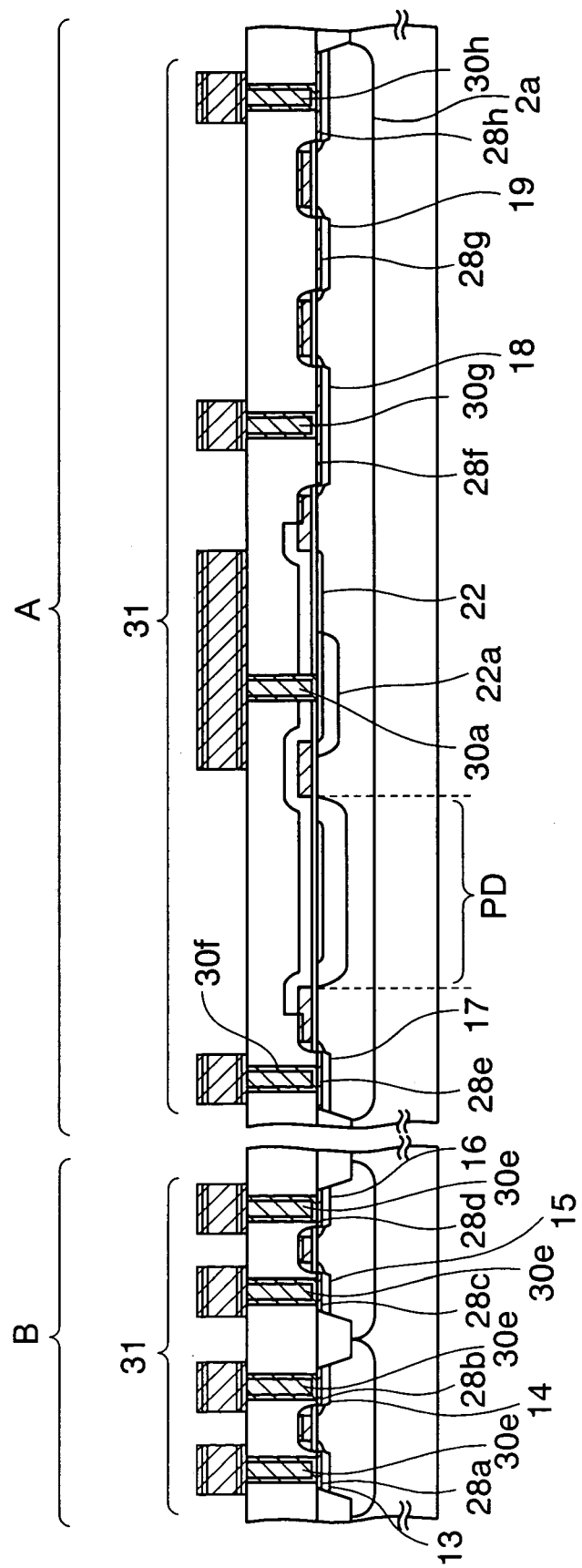

As shown in FIG. 8, although third conductive plugs 30p to 30v are formed on the respective gates 6 to 11, these conductive plugs are formed simultaneously with the second conductive plugs 30b to 30h (see FIG. 4K). Then, the first level metal wiring 31 on the first conductive plug 30a is extended onto the third conductive plug 30u on a fifth gate electrode 10. Thus, a structure in which the floating diffusion region 22 and the gate (fifth gate electrode 10) of the detection transistor $TR_{SF}$ are electrically connected to each other is obtained. Note that the first level metal wiring 31 other than the above is omitted in FIG. 8 for simplifying the drawing.

Figure 4L:
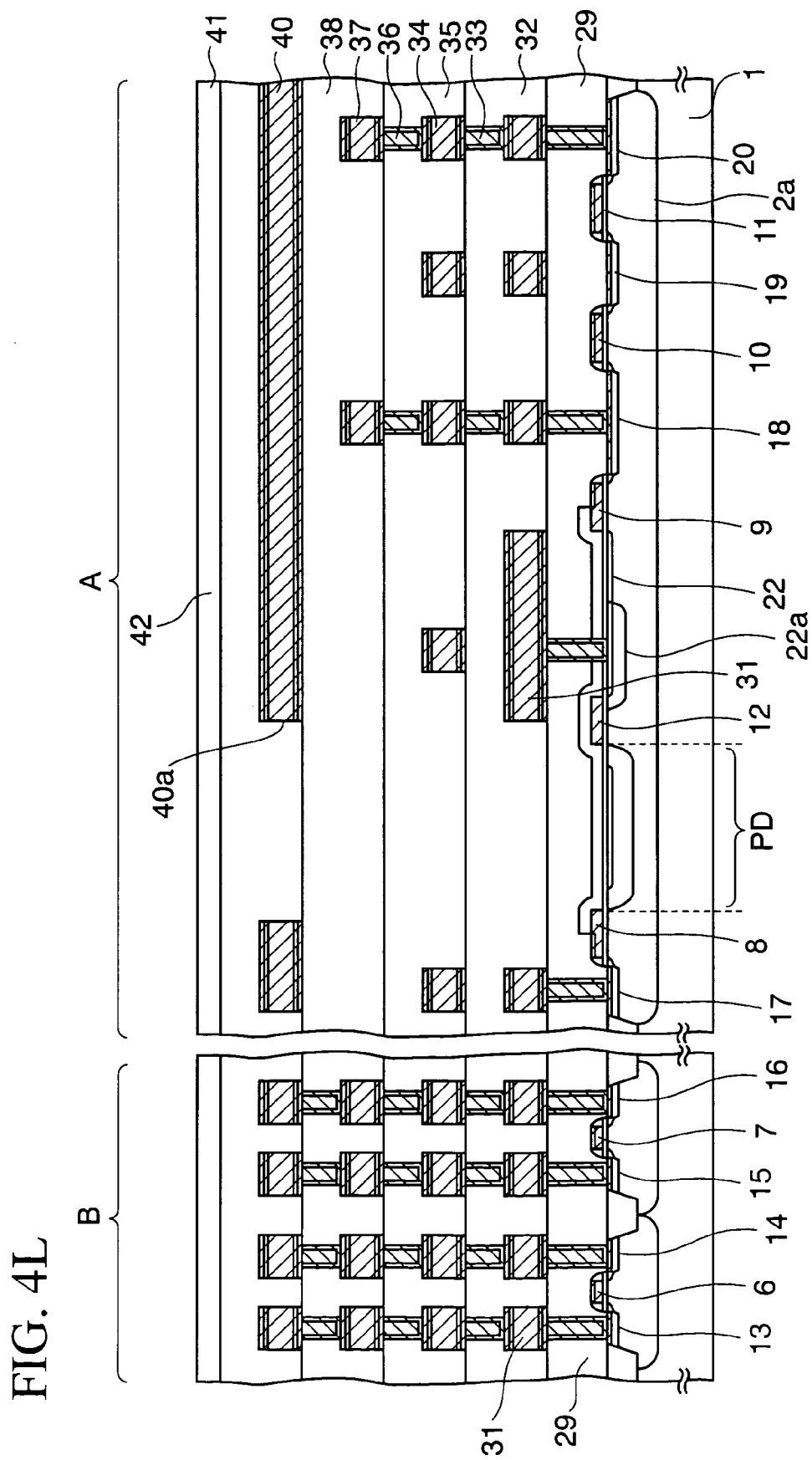

Next, a process until obtaining a cross-sectional structure shown in FIG. 4L will be obtained.

First, an $SiO_2$ film is formed as a fourth insulating film 32 on the first level metal wiring 31 and the third insulating film 29 by the HDPCVD method. Thereafter, an upper surface of the fourth insulating film 32 is polished to be planarized by the CMP method. Subsequently, a similar process to those for the first and second conductive plugs 30a and 30b and the first level metal wiring 31 is performed, thus forming a fourth conductive plug 33 and second level metal wiring 34.

Furthermore, the process as described above is repeatedly performed, and a fifth insulating film 35, fifth conductive plugs 36, third-layer metal wiring 37, a sixth insulating film 38, sixth conductive plugs 39, and fourth-layer metal wiring 40, are formed in this order.

The fourth-layer metal wiring 40, serving as metal wiring on the uppermost layer, has a window 40a above the photodiode PD, and is formed so as to cover the pixel region A of the portion other than the photodiode PD, and also serves to function as a light-shielding film preventing incidence of unnecessary light onto the photodiode PD.

Subsequently, as a seventh insulating film 41 covering the fourth-layer metal wiring 40, a $SiO_2$ film is formed by the HDPCVD method, and an upper surface of the seventh insulating film 41 is polished to be planarized by the CMP method.

Then finally, as a cover film 42 protecting the device, an SiN film is formed to a thickness of approximately 300 to 700 nm on the seventh insulating film 41 by the plasma CVD method.

In accordance with the processes described above, a basic structure of the imaging device according to the present invention is completed. This imaging device is a CMOS image sensor fabricated by the CMOS process.

According to this embodiment described above, as shown in the plan view of FIG. 7, the highly doped region 22a is provided in the floating diffusion region 22, and the side face 12a of the transfer gate 12 is allowed to overlap the floating diffusion region 22 by use of the expansion of the impurity of the highly doped region 22a, and the overlap width d3 is made wider than the overlap width d2 in the peripheral transistor.

Figure 9:
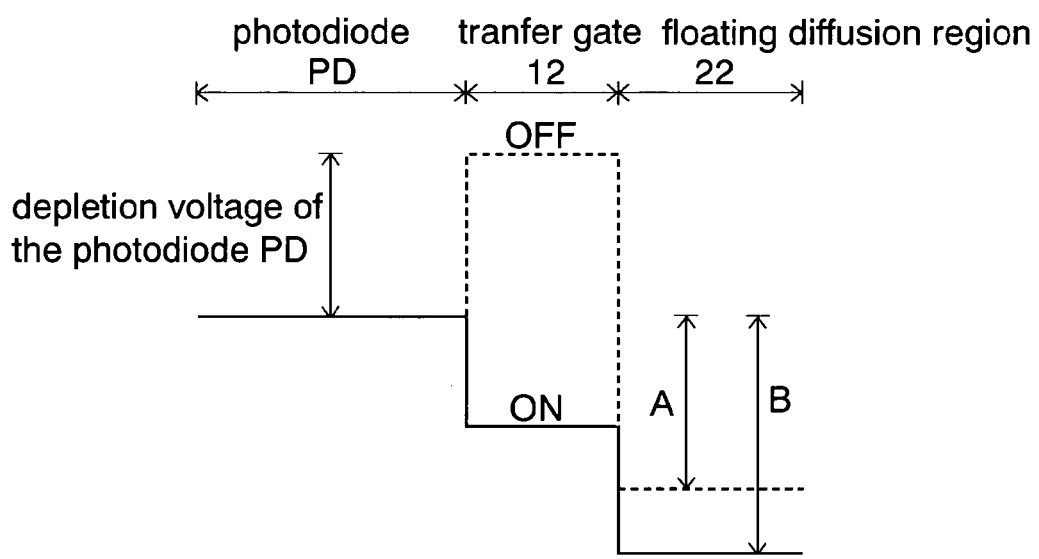
FIG. 9 is a view showing a state of a potential of the imaging device according to the first embodiment of the present invention.

With such a structure, as depicted in FIG. 9 showing a potential, when a positive potential is applied to the transfer gate 12 to turn on the channel under the transfer gate 12, the potential of the floating diffusion region 22 is raised to the positive potential side of the transfer gate 22 by an overlap capacitance between the transfer gate 12 and the floating diffusion region 22. Hence, when viewed from the electrons transferred from the photodiode PD to the floating diffusion region 22, the potential of the floating diffusion region 22 becomes deep and, accordingly, a potential gradient becomes steep along a transfer path of the electrons, thus making it possible to transfer the electrons from the photodiode PD to the floating diffusion region 22 smoothly.

Furthermore, as shown in the timing chart of FIG. 3, the transfer gate line TG is set at the low level at the time other than the charge transfer. Accordingly, the potential of the floating diffusion region 22 is also lowered through the above-described overlap capacitance, thus making it possible to lower a potential difference between the floating diffusion region 22 and the silicon substrate 1, and to reduce the junction leakage therebetween.

Moreover, the third width d3 shown in FIG. 7 is shorter than a gate length of the transfer gate 12, and the conductivity of the entire surface under the transfer gate 12 is not set at the N type as in Patent Document 2. Accordingly, the channel under the transfer gate 12 can be completely turned to an OFF state by setting the transfer gate 12 at a ground potential. Therefore, before the charge transfer, the electrons generated in the photodiode PD do not overflow to the floating diffusion region 22 through the transfer gate 12 as in Patent Document 2. Therefore, before the charge transfer, more electrons can be accumulated in the photodiode PD than in Patent Document 2. Consequently, the magnitude of the signal voltage obtained by converting the electrons into a voltage is increased more than in Patent Document 2, thus making it possible to enhance the transfer efficiency of the electrons while preventing the S/N ratio of the signal voltage from being reduced.

Furthermore, in this embodiment, as shown in the plan view of FIG. 7, the impurity concentration of the portion of the floating diffusion region 22, which locates at the side of the fourth gate electrode 9, is lowered as compared to the N-type diffusion regions 15 and 16 of the peripheral transistor $TR_N$. Hence, impurity of the floating diffusion region 22 is restricted from being diffused under the fourth gate electrode 9, so that the overlap width d1 between the fourth gate electrode 9 and the floating diffusion region 22 is narrowed as compared with the overlap width d2 in the peripheral circuit.

According to this, when the fourth gate electrode 9 of the reset transistor $TR_{RST}$ is switched from ON to OFF in the case of resetting the floating diffusion region 22, an opposite area of the fourth gate electrode 9 and the floating diffusion region 22 is small, and accordingly, the overlap capacitance therebetween is reduced, and it becomes difficult for the potential of the floating diffusion region 22 to be lowered to the ground potential side of the fourth gate electrode 9 via the overlap capacitance. Therefore, when transferring the electrons to the floating diffusion region 22, it is made possible to maintain the deep potential of the floating diffusion region 22, thus making it possible to transfer the electrons smoothly.

Furthermore, as shown in the plan view of FIG. 7, a channel width W1 of the transfer gate 12 is made wider than a channel width W2 of the fourth gate 9. Accordingly, the area of the transfer gate 12, which overlaps the floating diffusion region 22, can be made relatively larger than the area of the fourth gate 9, which overlaps the floating diffusion region 22. Thus, it becomes easy to deepen the potential of the floating diffusion region, and the charge transfer becomes far more efficient.

Moreover, in this embodiment, as shown in the plan view of FIG. 8, the third conductive plug 30a for electrically connecting the fifth gate electrode 10 to the floating diffusion region 22 is provided on the highly doped region 22a. According to this, even if the first hole 29a (see FIG. 4K) for burying the third conductive plug 30a therein is positionally shifted in a gate length direction of the transfer gate 12 to reach an end of the element isolation insulating film 4 (see FIG. 8) and to cut the element isolation insulating film 4 to some extent, it becomes difficult for the third conductive plug 30a to reach the silicon substrate 1 under the highly doped region 22a because the highly doped region 22a is formed deeply at the high concentration. Consequently, it becomes difficult for the junction leakage between the P-type silicon substrate 1 and the N-type floating diffusion region 22 to occur under the third conductive plug in comparison with the case of forming only the thin and shallow floating diffusion region 22 without forming the highly doped region 22a, and image quality of the image sensor can be enhanced.

Furthermore, the third conductive plug 30a is formed on the portion of the highly doped region 22a, which is as wide as the width W1 (see FIG. 7). Accordingly, an alignment margin in the width direction can be allowed to be wide.

Moreover, even if the first hole 29a is not positionally shifted in the gate length direction of the transfer gate 12, by forming the first hole 29a on the highly doped region 22a, even if the surface layer of the silicon substrate 1 is cut to some extent in the case of etching the first hole 29a, the first conductive plug 30a is not brought into direct contact with the silicon substrate 1. Accordingly, processes such as ion implantation of phosphorus into the first hole 29a for the purpose of compensating the contact (acceleration energy: 30 keV; dose amount: approximately $1\times10^{14}$ cm$^{-2}$) and activation annealing for activating the implanted phosphorus (substrate temperature: 800° C.; treatment time: approximately 30 seconds), both of which are necessary in the case where the highly doped region 22a is not formed, can be omitted, and simplification of the processes can be achieved.

Figure 10:
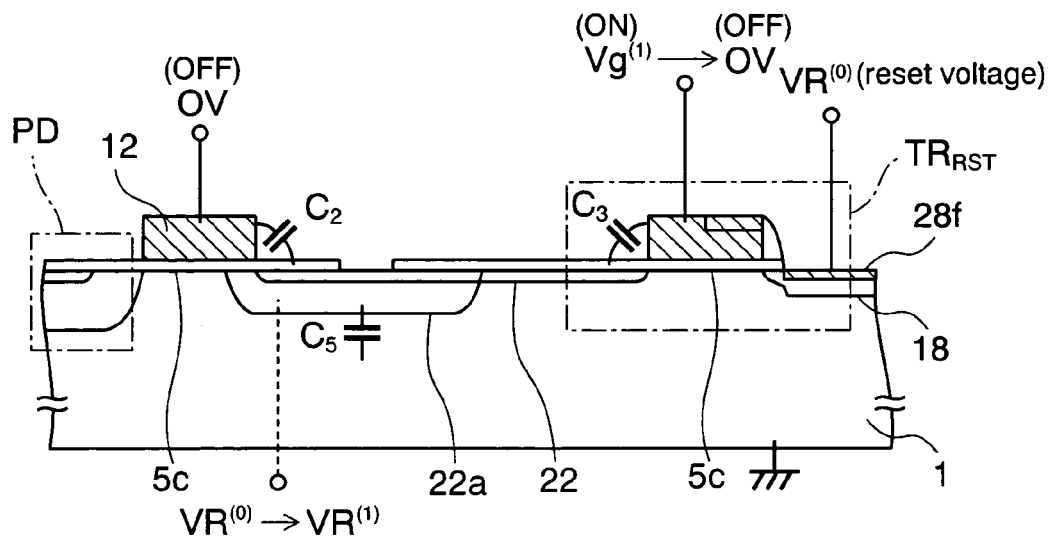
FIG. 10 and FIG. 11 are views where a variety of capacitances are additionally written to the cross section of the imaging device of the first embodiment in order to describe advantages of the first embodiment of the present invention qualitatively.
Figure 11:
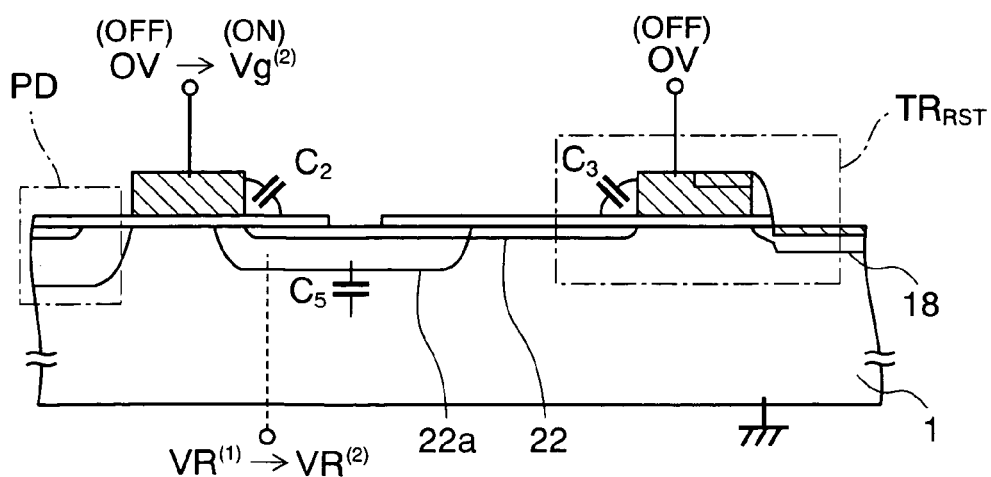

FIG. 10 and FIG. 11 are views where a variety of capacitances $C_2$, $C_3$ and $C_5$ are additionally written to the cross section of the CMOS image sensor of the present embodiment for the purpose of describing the above-described advantages qualitatively. Meanings of the respective coupling capacitances are as follows.

$C_2$ . . . An overlap capacitance between the transfer gate 12 and the floating diffusion region 22

$C_3$ . . . An overlap capacitance between the fourth gate electrode 9 and the floating diffusion region 22

$C_5$ . . . A junction capacitance between the floating diffusion region 22 and the silicon substrate 1

FIG. 10 is a cross sectional view when a reset operation of the floating diffusion region 22 ends. This operation is performed by changing the gate voltage of the fourth gate electrode 9 from $Vg^{(1)}$ of a positive potential to 0V and turning the reset transistor $TR_{RST}$ from ON to OFF state.

At this time, the amounts of electrons in the floating diffusion region when the reset transistor $TR_{RST}$ is in an ON state and an OFF state are represented as:

when $TR_{RST}$ is in ON state:

$$C_2(VR^{(0)}-0)+C_3(VR^{(0)}+Vg^{(1)})+C_5(VR^{(0)}-0) \qquad (1)$$

when $TR_{RST}$ is in OFF state:

$$C_2(VR^{(1)}-0)+C_3(VR^{(1)}-0)+C_5(VR^{(0)}-0) \qquad (2),$$

where a reset voltage is $VR^{(0)}(>0)$, a potential of the floating diffusion region 22 after the reset is $VR^{(1)}$.

By letting the above expressions (1) and (2) equal to each other, the following expression is obtained:

$$VR^{(0)}-VR^{(1)}=C_3\cdot Vg^{(1)}/(C_2+C_3+C_5) \qquad (3)$$

Note that, when the $TR_{RST}$ is turned to an ON state, charges that have originally existed in an inversion layer of a channel portion of the $TR_{RST}$ also actually flow into the floating diffusion region 22. Accordingly, the respective charges in the floating diffusion region 22 in an ON state and OFF state of the $TR_{RST}$ do not become equal to each other as described above. However, under an actual use condition, the channel portion of the $TR_{RST}$ is turned to a state of being close to weak inversion after writing $VR^{(0)}$ into the floating diffusion region 22. Therefore, only a small error occurs even if the expressions (1) and (2) are assumed to be equal.

Next, the case of transferring the charges from the photodiode PD to the floating diffusion region 22 (see FIG. 11) is considered. This transfer operation is performed by changing the voltage of the transfer gate 12 from 0V to $Vg^{(2)}$ of a positive potential, whereby switching the channel under the transfer gate 12 from OFF to ON state.

When the gate 12 is turned to an ON state as described above, all the electrons accumulated in the photodiode PD are transferred to the floating diffusion region 22, and the photodiode PD and the channel under the transfer gate are turned to a depleted state.

Moreover, the amounts of electrons in the floating diffusion region 22 in the respective cases where the channel under the transfer gate 12 is in an ON state and an OFF state are represented as:

when transfer gate 12 is in OFF state:

$$C_2(VR^{(1)}-0)+C_3(VR^{(1)}-0)+C_5(VR^{(1)}-0) \quad (4)$$

when transfer gate 12 is in ON state:

$$C_2(VR^{(2)}-Vg^{(1)})+C_3(VR^{(2)}-0)+C_5(VR^{(2)}-0) \quad (5)$$

where $VR^{(2)}$ denotes the potential of the floating diffusion region 22 after the charge transfer.

If the amount of electrons transferred from the photodiode PD to the floating transfer region 22 is Q (<0 for electrons), the amount of electrons in the floating diffusion region 22, which is increased due to the transfer, is equal to Q, and therefore, the following equation is obtained:

(the amount of electrons in floating diffusion region 22 in ON state of transfer gate 12)=(the amount of electrons in floating diffusion region 22 in OFF state of transfer gate 12)+Q Based on the above and the expressions (4) and (5), the following equation is obtained:

$$VR^{(2)}-VR^{(1)}=C_2 \cdot Vg^{(2)}/(C_2+C_3+C_5)+Q/(C_2+C_3+C_5) \quad (6)$$

Then, based on the expressions (3) and (6), a difference between the reset voltage $VR^{(0)}$ and the voltage $VR^{(2)}$ of the floating diffusion region 22 after the charge transfer is represented as:

$$VR^{(2)}-VR^{(0)}=(C_2 \cdot Vg^{(2)}+Q-C_3 \cdot Vg^{(1)})/(C_2+C_3+C_5) \quad (7)$$

From this equation (7), it can be understood that $VR^{(2)}-VR^{(0)}$ is proportional to the amount Q of electrons transferred. Interpreting the proportionality as conversion efficiency (or sensitivity) from the amount of electrons to the voltage, the following equation can be obtained:

$$\text{Conversion efficiency (sensitivity)}=1/(C_2+C_3+C_5) \quad (8)$$

Figure 12:
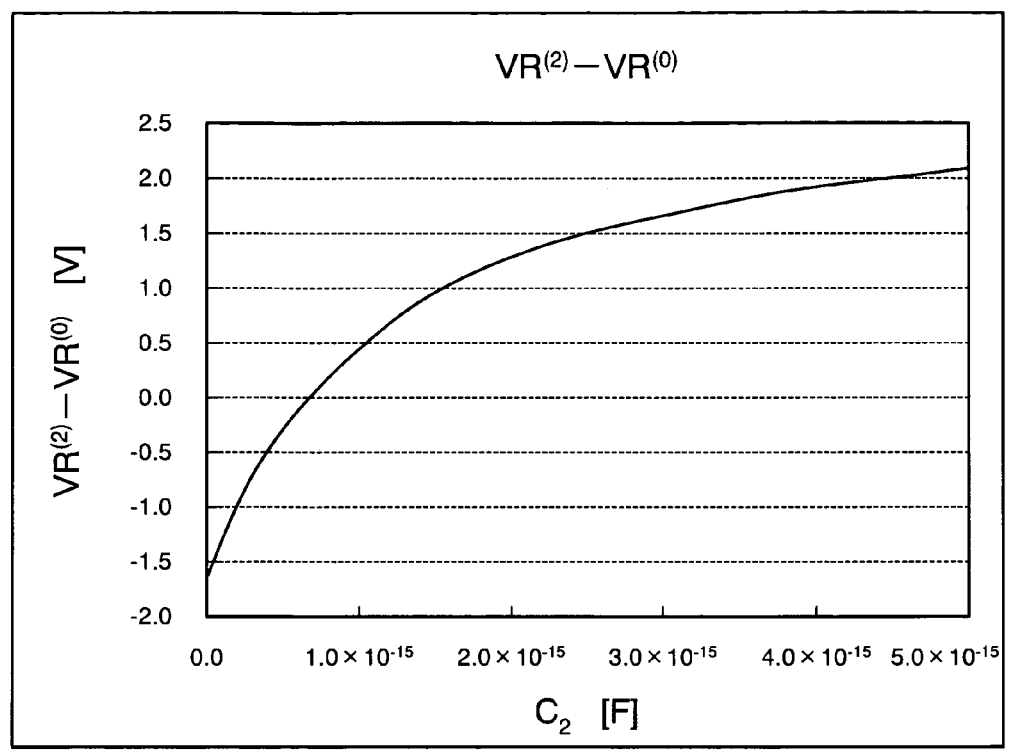
FIG. 12 is a graph showing $C_2$ (overlap capacitance between a transfer gate and a floating diffusion region) dependency of a difference ($VR^{(2)}-VR^{(0)}$) between depths of potentials in a floating diffusion region before and after charge transfer in the first embodiment of the present invention.
Figure 13:
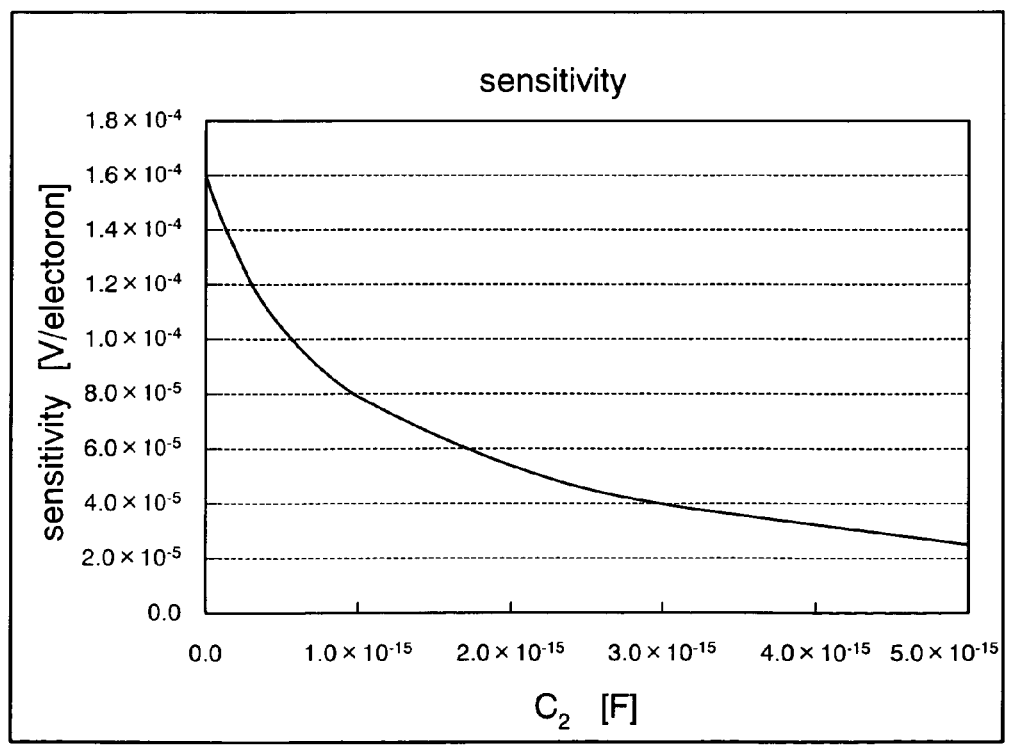
FIG. 13 is a graph showing $C_2$ dependency of a sensitivity in the first embodiment of the present invention.

FIG. 12 is a graph showing $C_2$ dependency of $VR^{(2)}-VR^{(0)}$, and FIG. 13 is a graph showing $C_2$ dependency of the conversion efficiency (sensitivity).

In each of these graphs, the following conditions are postulated:

$$Vg^{(1)}=Vg^{(2)}=2.8V; C_3=0.3fF; C_5=0.7fF; \text{ and}$$

$$Q=-8\times10^{-16}(\text{amount of charges corresponding to } 5{,}000 \text{ electrons}).$$

As shown in FIG. 12, $VR^{(2)}-VR^{(0)}$ is increased as $C_2$ is increased. Because $VR^{(2)}-VR^{(0)}$ indicates how the potential of the floating diffusion region 22 is deepened at the time of charge transfer, as $C_2$ is increased, that is, as the transfer gate 12 overlaps the floating diffusion region 12 by a wider area, the electrons will be able to be transferred from the photodiode PD to the floating diffusion region 22 more efficiently.

Meanwhile, as shown in FIG. 13, the transfer efficiency (sensitivity) is reduced as $C_2$ is increased, and the sensitivity is lowered.

In this connection, consider a product of the equation (7) and the equation (8) as an index in which both the transfer efficiency and the sensitivity are reflected. Because the equations (7) and (8) monotonously increase and decrease with $C_2$ respectively, their product has a maximum value. When a value of $C_2$ giving the maximum value is defined as $C_{2max}$, the following equation is obtained based on a condition of $d((7)\times(8))/d(C_2)=0$:

$$C_{2max}=(1+2Vg^{(1)}/Vg^{(2)})C_3+C_5-2Q/Vg^{(2)} \quad (9).$$

Figure 14:
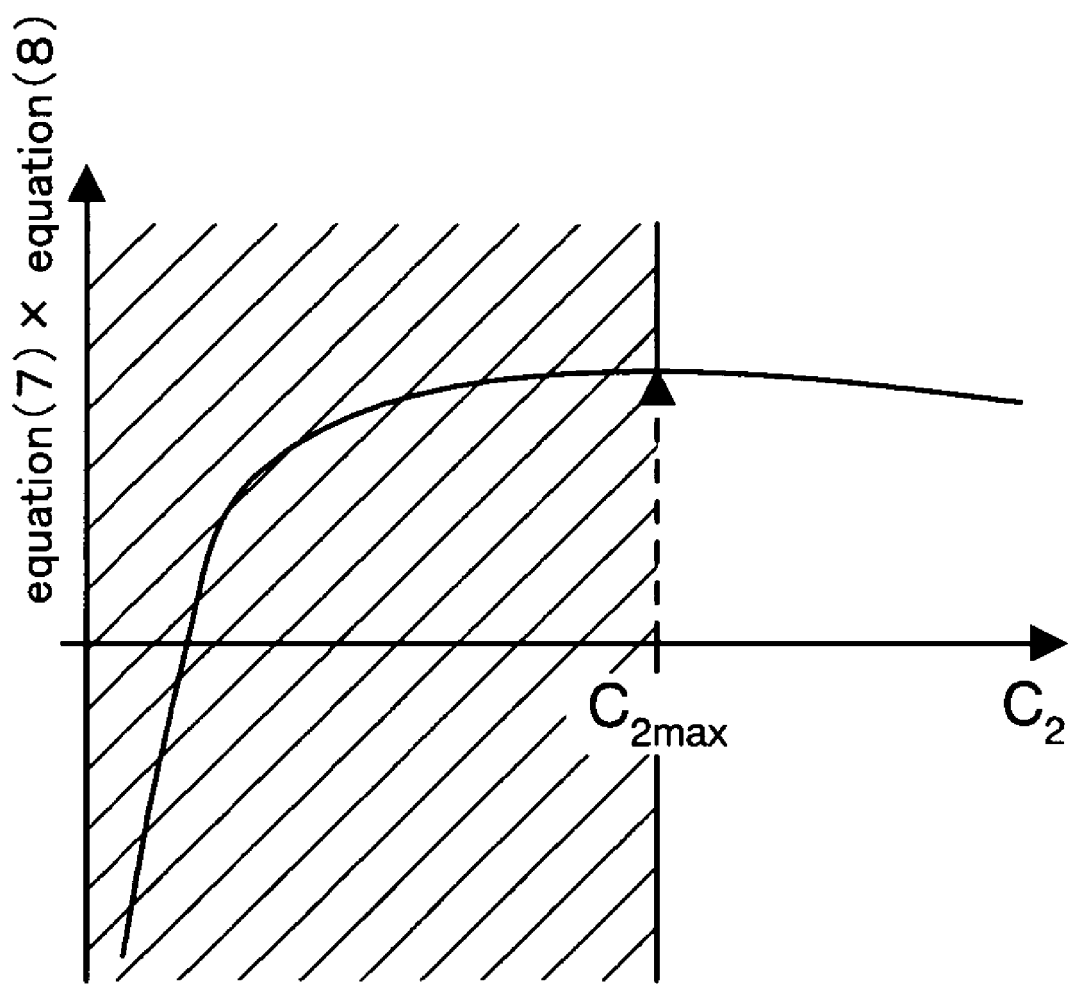
FIG. 14 is a graph showing $C_2$ dependency of a product of an equation (7) and an equation (8) in the first embodiment of the present invention.

A graph showing the product of the equations (7) and (8) becomes as shown in FIG. 14. The charge transfer efficiency and the sensitivity can be made compatible with each other by adjusting $C_2$ in a range of $C_2<C_{2max}$ (hatched portion).

Moreover, when the overlap width d1 between the floating diffusion region 22 and the fourth gate electrode 9 is narrowed to reduce $C_3$, $C_{2max}$ is reduced based on the equation (9), and accordingly, the performance of the pixels can be optimized in a higher sensitivity region based on the equation (8).

(Second Embodiment)

Figure 15:
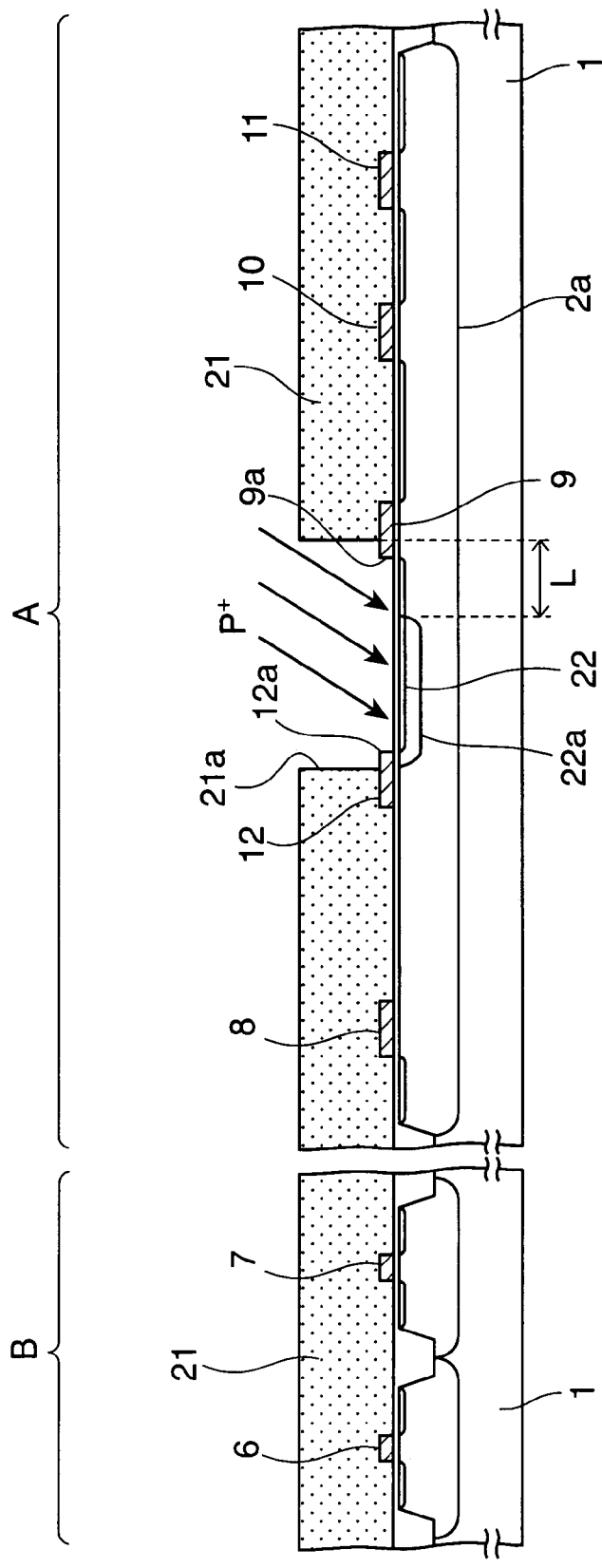
FIG. 15 is a cross-sectional view of principal portions of an imaging device at some midpoint of a manufacturing process in conformity with a second embodiment of the present invention.

Next, a second embodiment of the present invention will be explained with reference to FIG. 4C and FIG. 15. FIG. 15 is a cross-sectional view of principal portions of an imaging device at some midpoint of a manufacturing process according to the present embodiment.

In the first embodiment, the ion implantation is performed twice by use of the two resist patterns (second and third resist patterns 21 and 23), thus forming the floating diffusion region 22 including the highly doped region 22a.

On the contrary to this, the highly doped region 22a is formed by following method in this embodiment.

First, performing the process of FIG. 4C, which is described in the first embodiment, the floating diffusion region 22 is formed by use of a first resist pattern 21 with a thickness of approximately 1 μm.

Subsequently, as shown in FIG. 15, while tilting the silicon substrate 1 to such a direction where a shadow of the first resist pattern 21 is extended from the second side face 9a of the fourth gate electrode 9 (for example, at a tilt angle of 20°), phosphorus are ion-implanted slantwise onto the surface layer of the silicon substrate 1 through a first window 21a under conditions where the acceleration energy is 20 keV and the dose amount is $1\times10^{15}$ to $2\times10^{15}$ cm$^{-2}$. Thus, the highly doped region 22a is formed.

Note that the tilt angle in such angled ion implantation means an angle (<90°) made by an introduction direction of phosphorus with respect to a normal line of the silicon substrate 1.

According to the above-described method, a shadow of the first window 21a appears by a length L, for example, by approximately 0.36 μm. The highly doped region 22a is not formed on the shadowed portion, and the concentration of phosphorus remains low there. Thus, the overlap capacitance between the floating diffusion region 22 and the fourth gate electrode 9 can be reduced, and similar advantages to those of the first embodiment can be obtained.

Particularly, by making the length L of the shadow longer, for example, making L at 0.2 μm or more, phosphorus in the highly doped region 22a comes not to reach under the fourth gate electrode 9 even if phosphorus is diffused. Accordingly, the overlap capacitance between the floating diffusion region 22 and the gate electrode 9 can be reduced securely.

Note that, when the thickness of the first resist pattern is 1 μm, making it possible to set the length L of the shadow of the first resist pattern 21 at 0.2 μm or more by setting the tilt angle at 10° or more.

Furthermore, according to this method, phosphorus is implanted under the first side face 12a of the transfer gate 12, and accordingly, the highly doped region 22a can be overlapped with the transfer gate 12 before phosphorus is diffused. Hence, when phosphorus is diffused with the elapse of time, the highly doped region 22a overlaps the transfer gate 12 more largely in comparison with that in the first embodiment, thus making it possible to enhance the charge transfer efficiency further than the first embodiment.

Incidentally, it is preferable to determine as to which of the method using the two resist patterns (first embodiment) and the method using the angled ion implantation (this embodiment) is to be employed based on the plane layout of the unit pixels U.

Figure 16A:
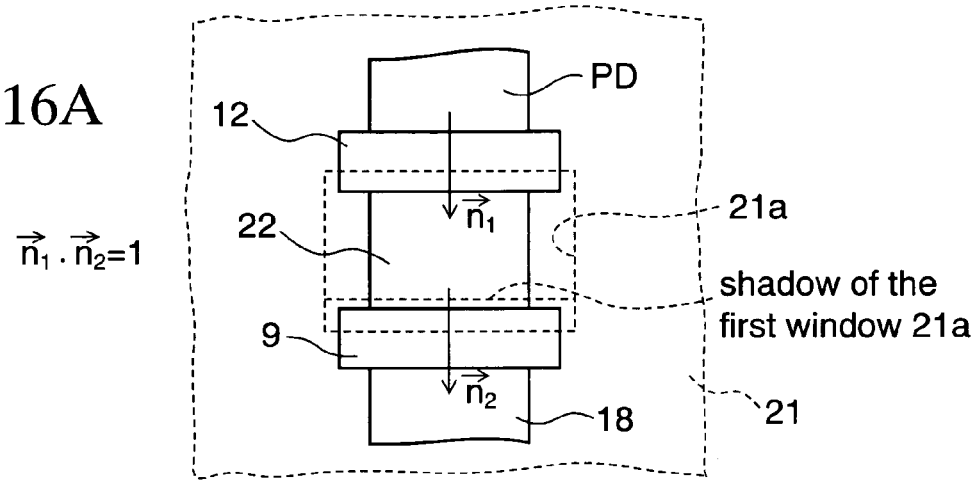
FIG. 16A and FIG. 16B are plane layouts of imaging devices to which both of the first and second embodiments of the present invention are suitably applied.
Figure 16B:
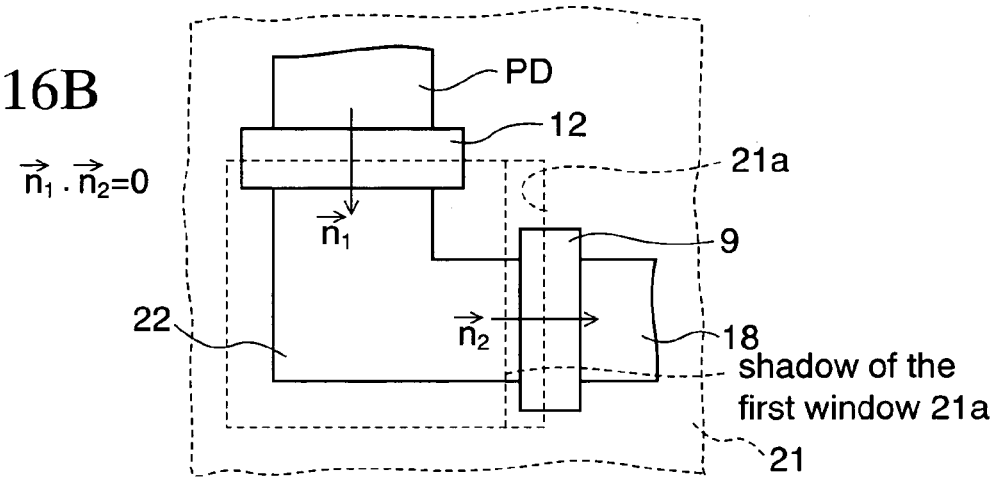

As shown in FIG. 16A and FIG. 16B, considering unit vectors n1 and n2 whose directions correspond to moving direction of charges flowing under gates 9, 12 respectively, both the first and second embodiment may be employed when an inner product n1·n2 of unit vectors n1 and n2 becomes 0 or a positive value.

It should be noted that, in FIGS. 16A and 16b, the first side face of the transfer gate 12 and the second side face of the fourth gate 9 locates under the different edges of the window 21a.

Figure 16C:
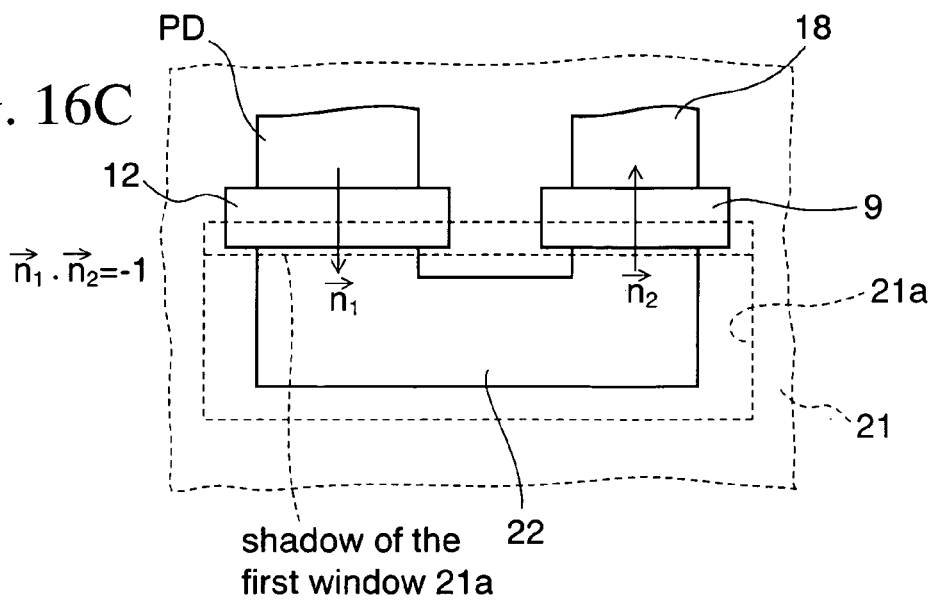
FIG. 16C is a plane layout of an imaging device to which only the first embodiment is suitably applied.

On the contrary, as shown in FIG. 16C, when the angled ion implantation is performed on such a layout where the above-described inner product n1·n2 becomes negative, the shadow of the first window 21a of the first resist pattern 21 is also appeared on the floating diffusion region 22 closer to the transfer gate 12. Accordingly, the highly doped region 22a is separated from the transfer gate 12, causing a possibility that a large overlap capacitance cannot be created therebetween. Hence, in this case, it is preferable to form the floating diffusion region 22 and the highly doped region 22a by use of the two resist patterns as in the first embodiment.

It should be noted in FIG. 16c that the first side face of the transfer gate 12 and the second side face of the fourth gate 9 locates under the same edge of the window 21a.

(Third Embodiment)

In this embodiment, a modification example of the plane layout of the transfer gate 12 described in the first embodiment will be explained.

Figure 17:
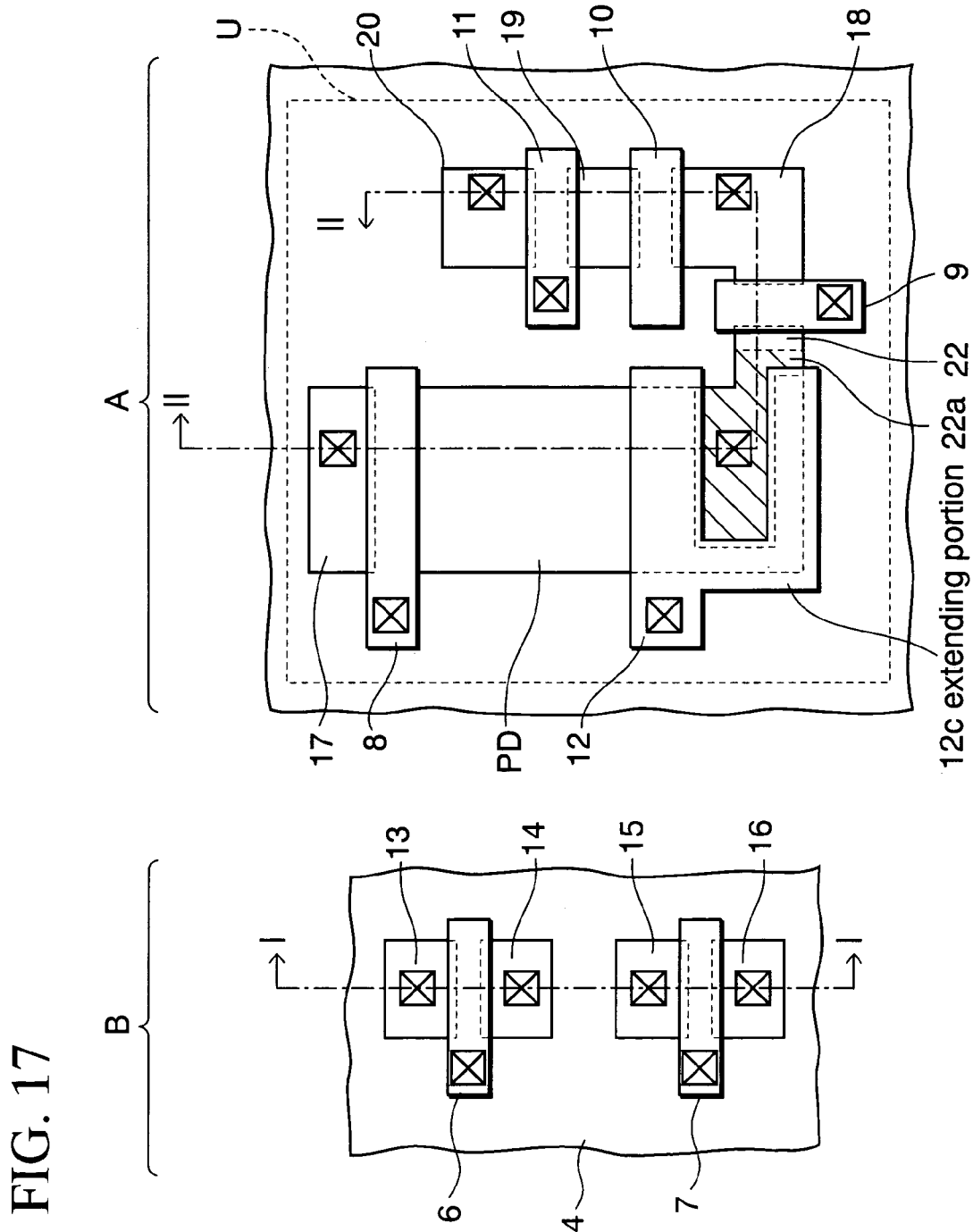
FIG. 17 is a plan view of principal portions of an imaging device according to a third embodiment of the present invention.

FIG. 17 is a plan view of principal portions of an imaging device according to the present embodiment. In FIG. 17, the same reference numerals are used for the members described in the first embodiment.

As shown in FIG. 17, in this embodiment, an extending portion 12c extending along the edge of the floating diffusion region 22 when viewed from above the silicon substrate 1 is provided in the transfer gate 12. According to this structure, the opposite area of the transfer gate 12 and floating diffusion region 22 can be widened more in comparison with the first embodiment, and the overlap capacitance therebetween is further increased. Therefore, the charge transfer efficiency from the photodiode PD to the floating diffusion region 22 can be further enhanced.

Note that, if the overlap capacitance between the transfer gate 12 and the floating diffusion region 22 can be secured to be sufficiently large by providing a concave or convex portion to the transfer gate 12 in this manner, it is not necessary to form the highly doped region 22a.

Figure 18A:
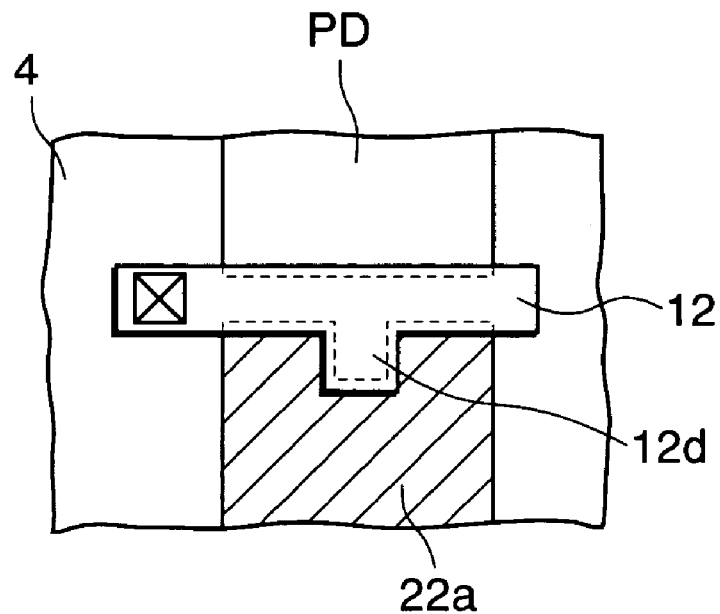
FIG. 18A and FIG. 18B are plan views showing modification examples of the imaging device according to the third embodiment of the present invention.

Moreover, as shown in FIG. 18A, in place of the above-described plane layout, a projection portion projecting to the floating diffusion region 22 may be provided in the transfer gate 12.

Figure 18B:
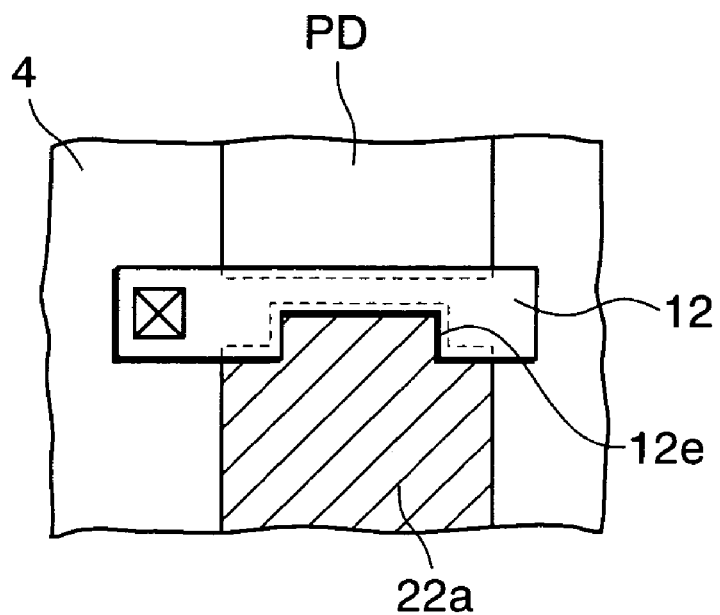

Furthermore, as shown in FIG. 18B, a concave portion concaved toward the photodiode PD may be provided in the transfer gate in the portion overlapping the floating diffusion region 22.

According to the structures shown in FIG. 18A and FIG. 18B, the same advantages as in the case of FIG. 17 can be obtained.

(Fourth Embodiment)

In the first and second embodiments, the gate length of the transfer gate 12 is drawn to be approximately equal to the gate length of the fourth gate 10 constituting the reset transistor $TR_{RST}$. However, the present invention is not limited to this.

Figure 19:
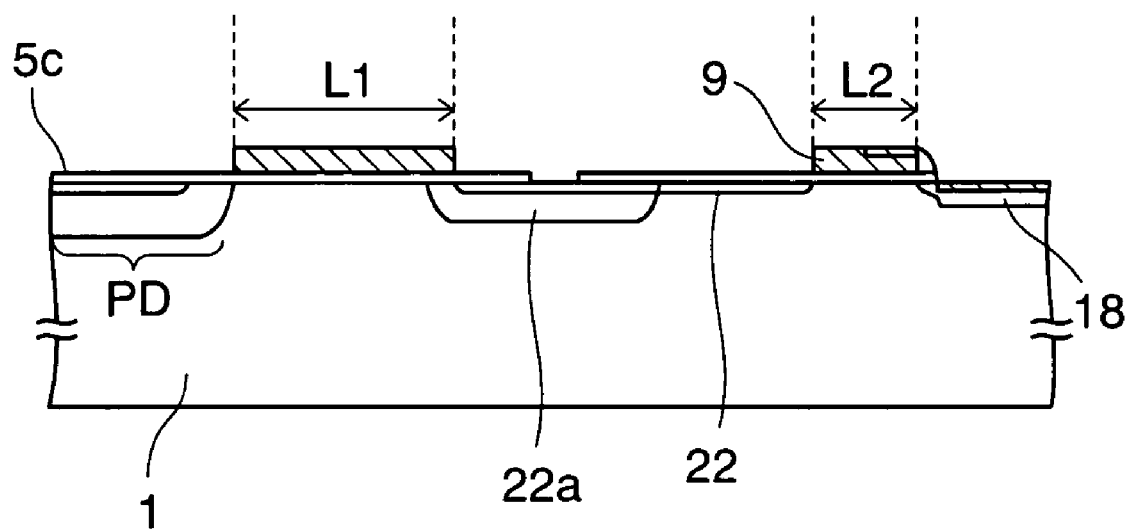
FIG. 19 is a cross-sectional view of principal portions of an imaging device according to a fourth embodiment of the present invention.

For example, as shown in FIG. 19, a gate length L1 of the transfer gate 12 may be made longer than a gate length L2 of the fourth gate 10.

According to this structure, even if the transfer gate 12 and the highly doped region 22a are largely overlapped with each other, the channel length under the transfer gate 12 is made longer than in the case where the gate lengths of the respective gates 10 and 12 are equal to each other, and accordingly, a short channel effect under the transfer gate 12 can be restricted, and the characteristics of the transfer gates 12 can be prevented from being largely varied for each of the unit pixels U.

(Fifth Embodiment)

Next, a manufacturing method of an imaging device according to a fifth embodiment of the present invention will be described.

FIGS. 20A to 20G are cross-sectional views of principal portions of an image device in steps of a manufacturing process according to the present embodiment. In these drawings, the same reference numerals as those in the first embodiment are used for members already described in the first embodiment, and description thereof will be omitted below.

Note that, in these drawings, first cross sections and second cross sections of the pixel region A are drawn in combination for the purpose of assisting the understanding of the invention. Among them, the first cross sections correspond to the cross-sectional view along the line II—II of FIG. 5, and the second cross sections correspond to the cross-sectional view along the line III—III of FIG. 5.

Figure 21:
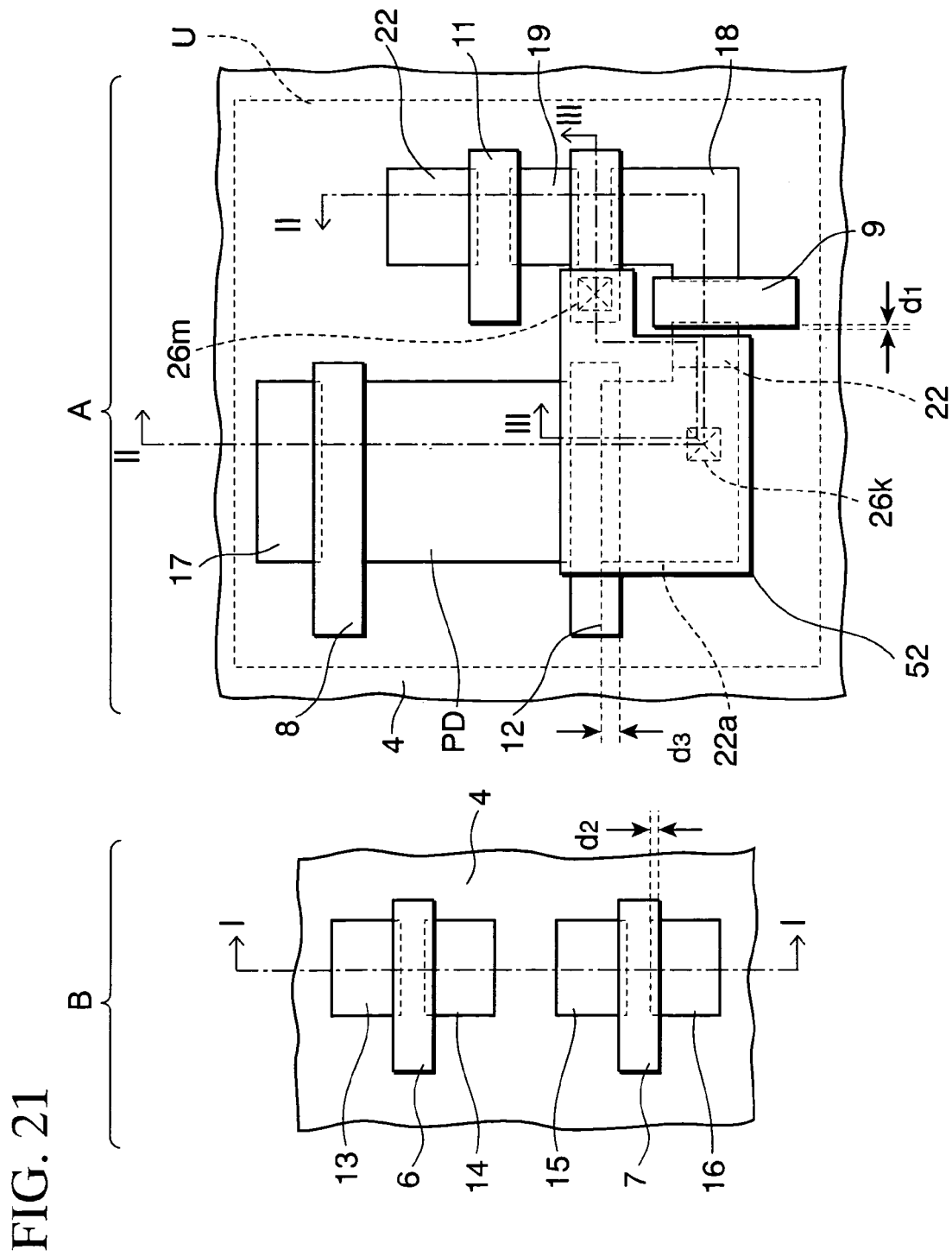
FIG. 21 is a plan view of the principal portions of the imaging device at some midpoint of the manufacturing process in accordance with the fifth embodiment of the present invention.

Moreover, FIG. 21 will also be referred to below as needed. FIG. 21 is a plan view of principal portions of an imaging device at some midpoint of a manufacturing process according to the present embodiment.

Figure 20A:
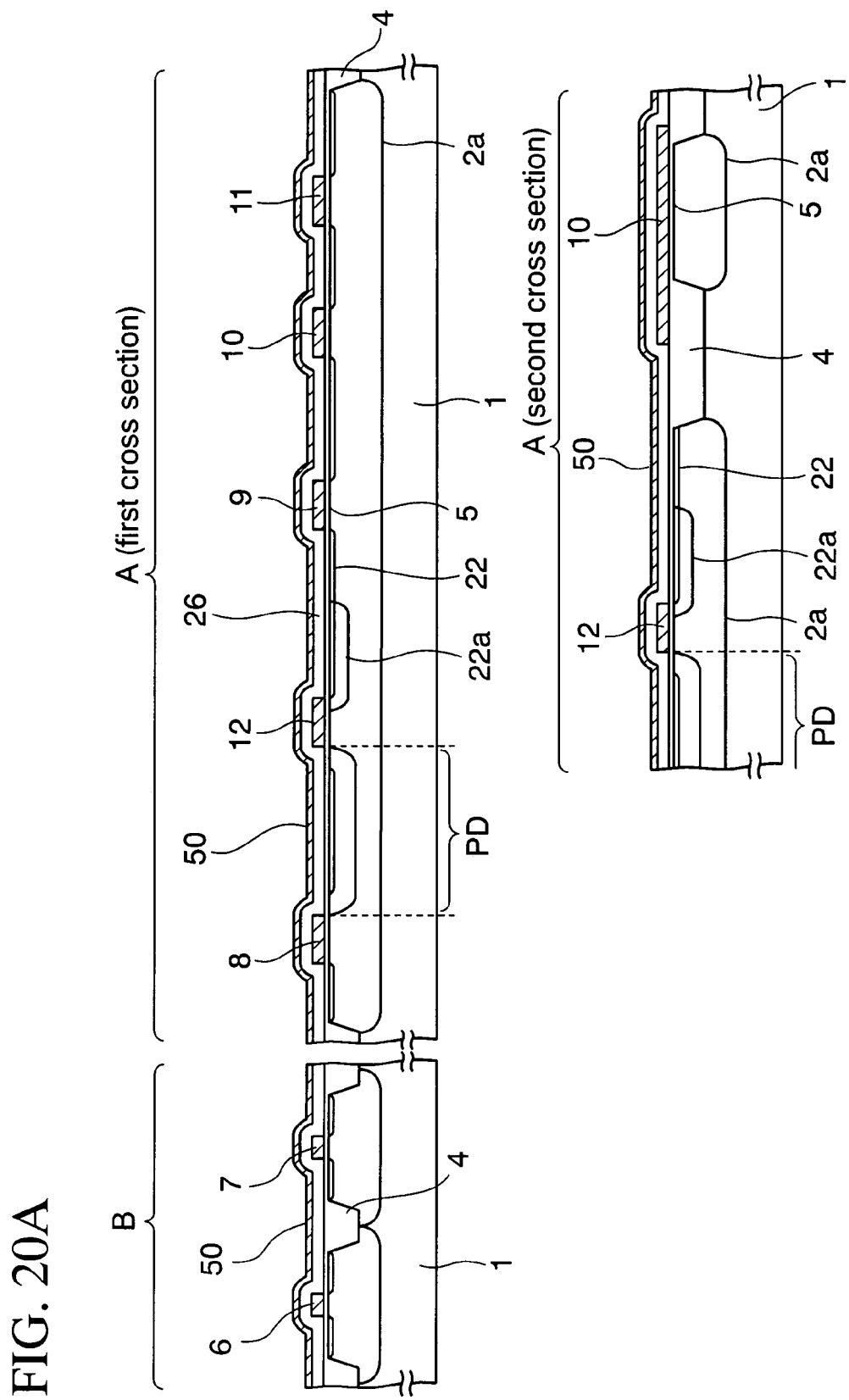

First, the process of FIG. 4F, which has been described in the first embodiment, is performed. Then, as shown in FIG. 20A, a phosphorus-doped amorphous silicon film is formed to a thickness of 50 nm on the second insulating film 26 by a thermal CVD method using a gas mixture of $SiH_4$ and $PH_3$ while maintaining a substrate temperature at 400 to 600° C. The formed amorphous silicon film is used as a first conductive film 50.

Figure 20B:
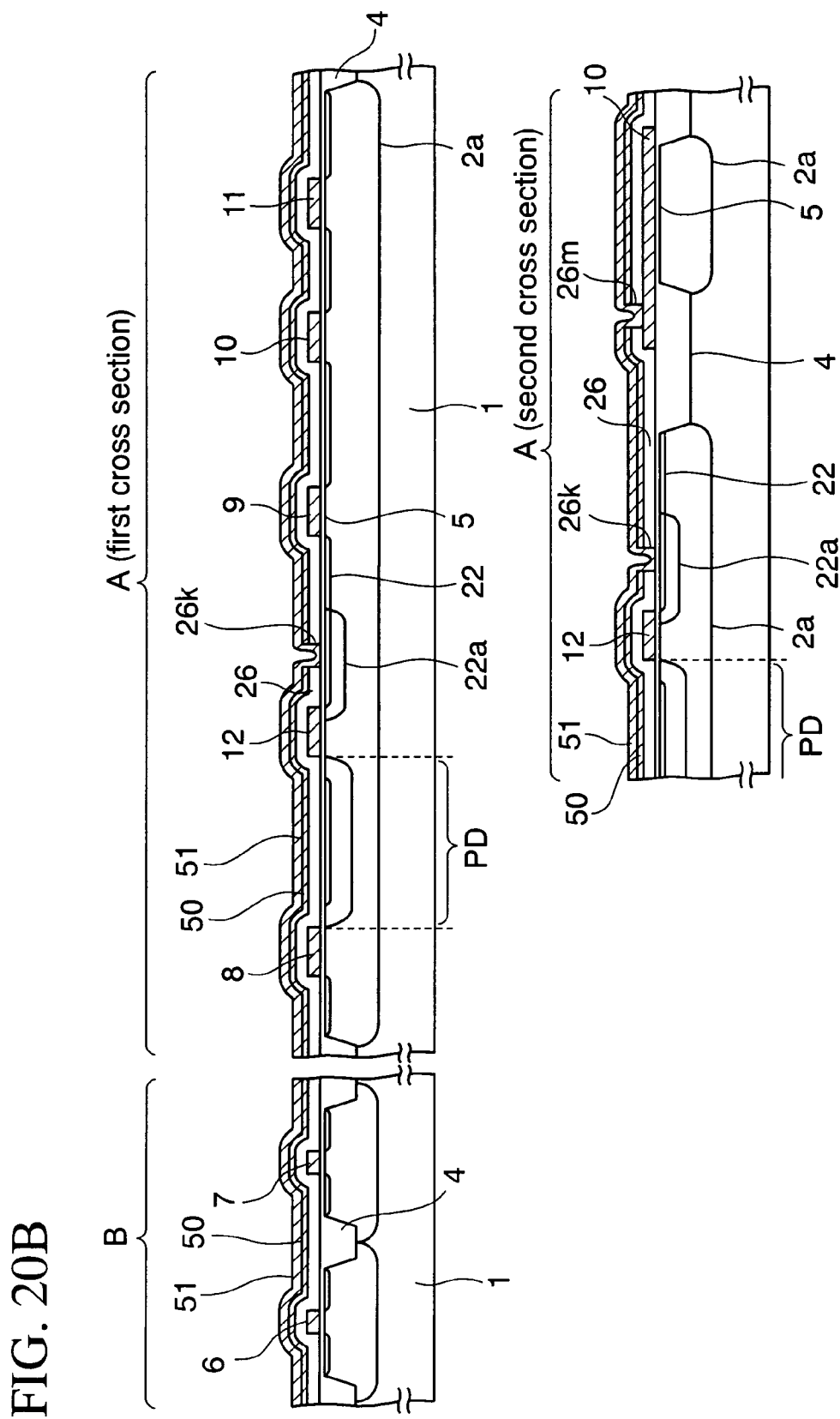

Next, a process until obtaining a cross-sectional structure shown in FIG. 20B will be described.

First, a resist pattern (not shown) is formed on the first conductive film 50. In the resist pattern, hole-shaped windows are formed on the highly doped region 22a and the fifth gate electrode 10. Subsequently, while using this resist pattern as a mask, holes are formed in the first conductive film 50 under the windows of the resist pattern by RIE in which a gas containing chlorine is used as an etching gas. Next, a third hole 26k and a fourth hole 26m are formed in the first and second insulating films 5 and 26 under the holes of the first conductive film 50 by RIE using a gas mixture of $CF_4$ and $CHF_3$ as an etching gas. Thereafter, the resist pattern is removed.

Subsequently, natural oxidation film of a thickness of several nanometers, which are formed on bottom surfaces of the third and fourth holes 26k and 26m, are etched by an HF solution, and clean surfaces of silicon are exposed from the respective holes 26k and 26m. The concentration of the HF solution is adjusted, for example, in several percents.

In the case of this HF treatment, the second insulating film 26 made of $SiO_2$ is covered with the first conductive film 50 having etching resistance to HF, and accordingly, the thickness of the film 26 is not reduced by etching. However, if the second insulating film 26 is formed to be sufficiently thick by previously foreseeing such film reduction, the first conductive film 50 may be omitted.

Thereafter, a phosphorus-doped amorphous silicon film is formed to a thickness of 50 nm on the inner surfaces of the third and fourth holes 26k and 26m and the first conductive film 50 by employing the same deposition conditions as those for the first conductive film 50, and the formed amorphous silicon film is used as the second conductive film 51.

Next, as shown in FIG. 20C, a fifth resist pattern 53 covering the floating diffusion region 22 is formed on the second conductive pattern 51. Then, by RIE using the gas mixture of $CF_4$ and $CHF_3$ as the etching gas, the first and second conductive films 50 and 51 at portions which are not covered with the fifth resist pattern 53 are removed by etching, and the respective conductive films 50 and 51 are left as a conductive pattern 52 under the fifth resist pattern 53.

This conductive pattern 52 functions as wiring electrically connecting the highly doped region 22a and the fifth gate electrode 10 through the third and fourth holes 26k and 26m.

Thereafter, the fourth resist pattern 53 is removed.

A plan view after the end of this process becomes as shown in FIG. 21. The cross section of the peripheral circuit region B of FIG. 20C explained in the above corresponds to a cross-sectional view along a line I—I of FIG. 21. A pixel region A (first cross section) of FIG. 20C corresponds to a cross-sectional view along a line II—II of FIG. 21. A pixel region (second cross section) thereof corresponds to a cross sectional view along a line III—III of FIG. 21.

Figure 20D:
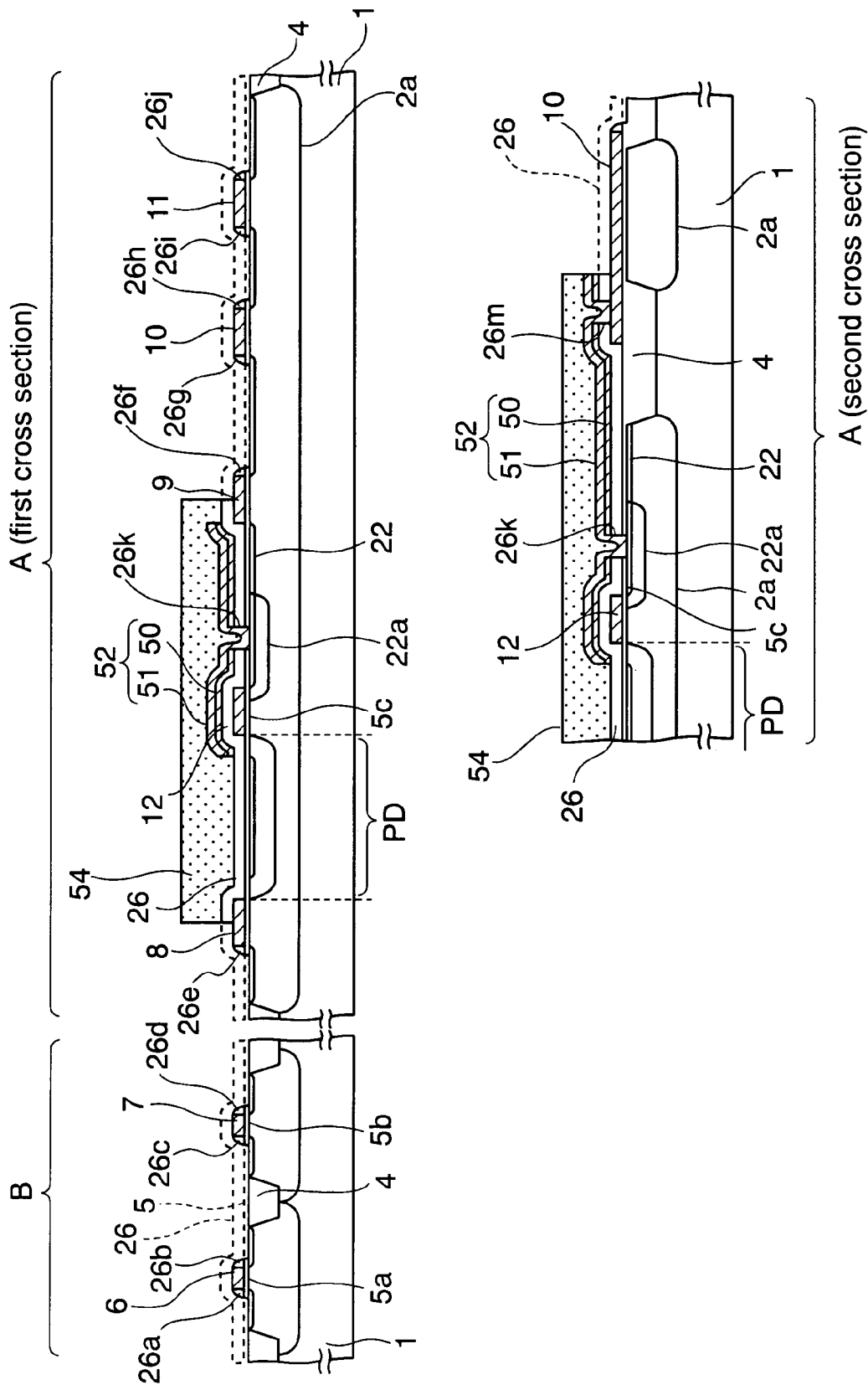

Next, as shown in FIG. 20D, a sixth resist pattern 54 covering the photodiode PD, the floating diffusion region 22 and the conductive pattern 52 is formed on the second insulating film 26. Then, the first and second insulating films 5 and 26 are anisotropically etched by RIE while using the sixth resist pattern 54 as a mask. Consequently, the second insulating film 26 is left as the insulating sidewalls 26a to 26j on the side faces of the respective gate electrodes 6 to 11. Moreover, the first insulating film 5 is patterned and left as the gate insulating films 5a to 5e on the lower surfaces of the gate electrodes 6 to 11.

Note that the second insulating film 26 under the sixth resist pattern 54 remains without being etched. Moreover, the gate insulating film 5c becomes common to the third and fourth gate electrodes 8 and 9 and the transfer gate 12.

Thereafter, the sixth resist pattern 54 is removed.

Subsequently, a process until obtaining a cross-sectional structure shown in FIG. 20E will be explained.

First, phosphorus is ion-implanted into the first to sixth N-type diffusion regions 15 to 20 at high concentration under conditions where the acceleration energy is 20 keV and the dose amount is $2\times10^{15}$ $cm^{-2}$ while using, as masks, the second to sixth gate electrodes 7 to 11 and the insulating sidewalls 26c to 26j formed on the side faces thereof. Thus, the respective N-type diffusion regions 15 to 20 are formed into an LDD structure. Furthermore, under similar conditions to the above, boron are ion-implanted into the first and second P-type diffusion regions 13 and 14, and these P-type diffusion regions 13 and 14 are formed into the LDD structure.

Subsequently, natural oxidation films formed on the respective surfaces of the diffusion layers 13 to 20, gate electrodes 6 to 11 and conductive pattern 52 are removed by the HF treatment and the like, and then a cobalt layer is formed to a thickness of about 5 to 30 nm on the entire surface by the sputtering method.

Next, RTA under the conditions where the substrate temperature is 500 to 600° C. and the treatment time is approximately 30 to 90 seconds is performed to react cobalt and silicon each other. Consequently, electrical resistances of the respective diffusion region 13 to 20, conductive pattern 52 and sixth gate insulating film 11 will be lowered because the cobalt silicide layers 28a to 28h, 55a and 55b are formed on the surfaces thereof. Thereafter, an unreacted cobalt layer is removed by wet etching.

Next, a process until obtaining a cross-sectional structure shown in FIG. 20F will be described.

First, an $SiO_2$ film is formed as the third insulating film 29 by the HDPCVD method on the insulating sidewalls 26a to 26j and the cobalt silicide layers 28a to 28h. Thus, the spaces between the respective transistors $TR_P$, $TR_N$, $TR_{OFD}$, $TR_{TG}$, $TR_{RST}$, $TR_{SF}$ and $TR_{SEL}$ are filled with the third insulating film 29. Thereafter, the upper surface of the third insulating film 29 is polished to be planarized by the CMP method, and the thickness of the third insulating film 29 is set at approximately 700 nm on the plane surface of the silicon substrate 1.

Subsequently, photoresist is coated on the third insulating film 29, and then exposed and developed. Thus, a resist pattern (not shown) having hole-shaped windows are formed on the cobalt silicide layers 28a to 28f and 28h.

Thereafter, while using the above-described resist pattern as a mask, the third insulating film 29 is etched by RIE using gas mixture of $CF_4$ and $CHF_3$ as the etching gas, thus forming the second holes 29b to 29h on the cobalt silicide layers 28a to 28f and 28h.

Next, a process until obtaining a cross-sectional structure shown in FIG. 20G will be described.

First, by the sputtering method, a Ti film and a TiN film are sequentially formed as glue film on the inner surfaces of the second holes 29b to 29h and the upper surface of the third insulating film 29. Respective thickness of the Ti film and the TiN film are, for example, set at 30 nm both. Subsequently, a W film is formed on this glue film by the CVD method using $WF_6$ gas, and the insides of the second holes 29b to 29h are completely filled with the W film. Thereafter, extra glue film and W film formed on the upper surface of the third insulating film 29 are removed by the CMP method, and the remaining films are left as the second conductive plugs 30b to 30h in the respective holes 29b to 29h.

Subsequently, as metal stack films, a Ti film with a thickness of 30 nm, a TiN film with a thickness of 30 nm, an Al film with a thickness of 300 to 500 nm, a Ti film with a thickness of 5 to 10 nm, and a TiN film with a thickness of 50 to 100 nm, are formed in this order by the sputtering method on the respective upper surfaces of the third insulating film 29 and first conductive plugs 30b to 30h. Thereafter, the metal stack films are patterned by the photolithography method, and thus the first level metal wiring 31 electrically connected to the first conductive plugs 30b to 30h are formed.

Thereafter, the process of FIG. 4L, which has been described in the first embodiment, is performed, and thus a basic structure of the imaging device according to this embodiment is completed.

Figure 20F:
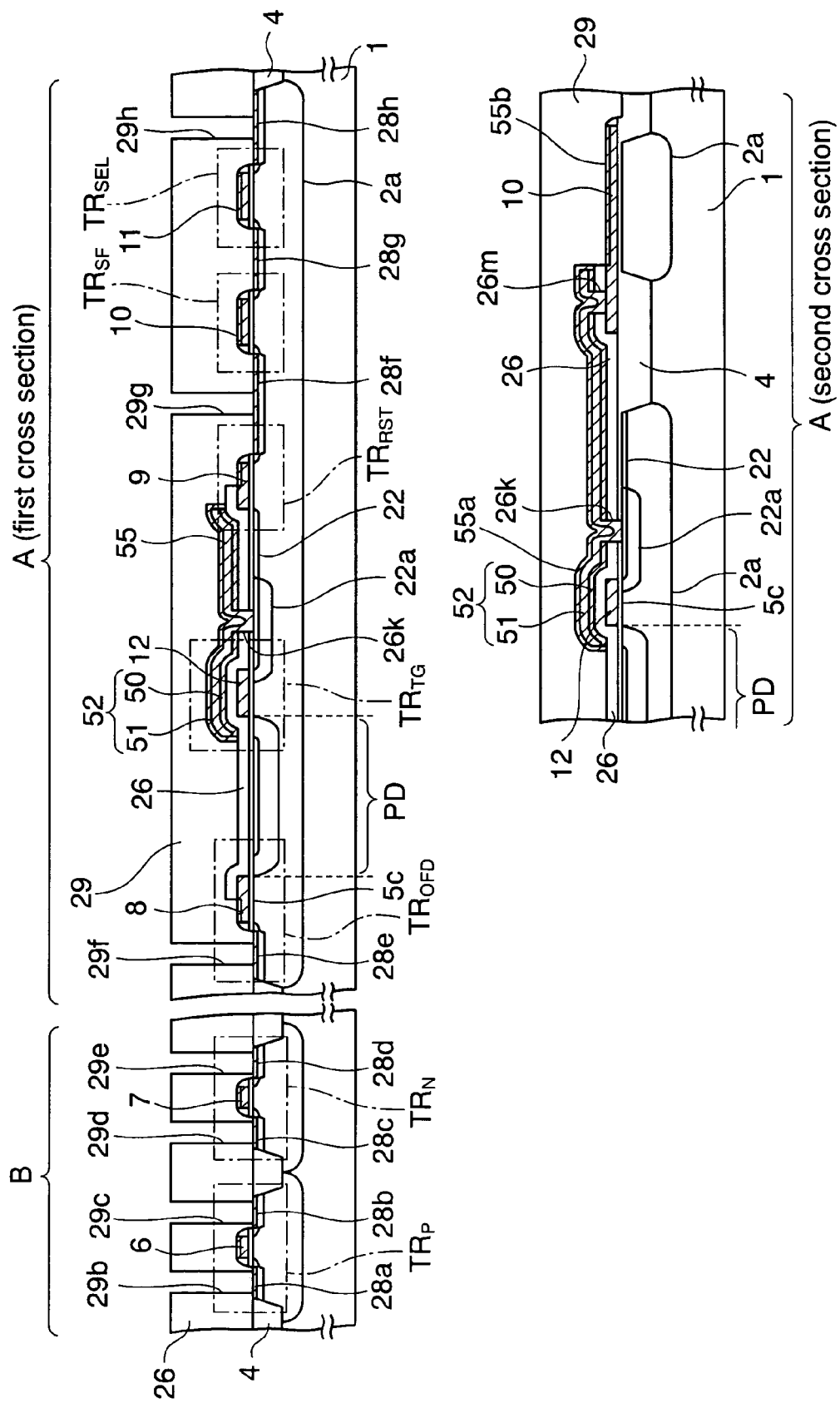
Figure 20G:
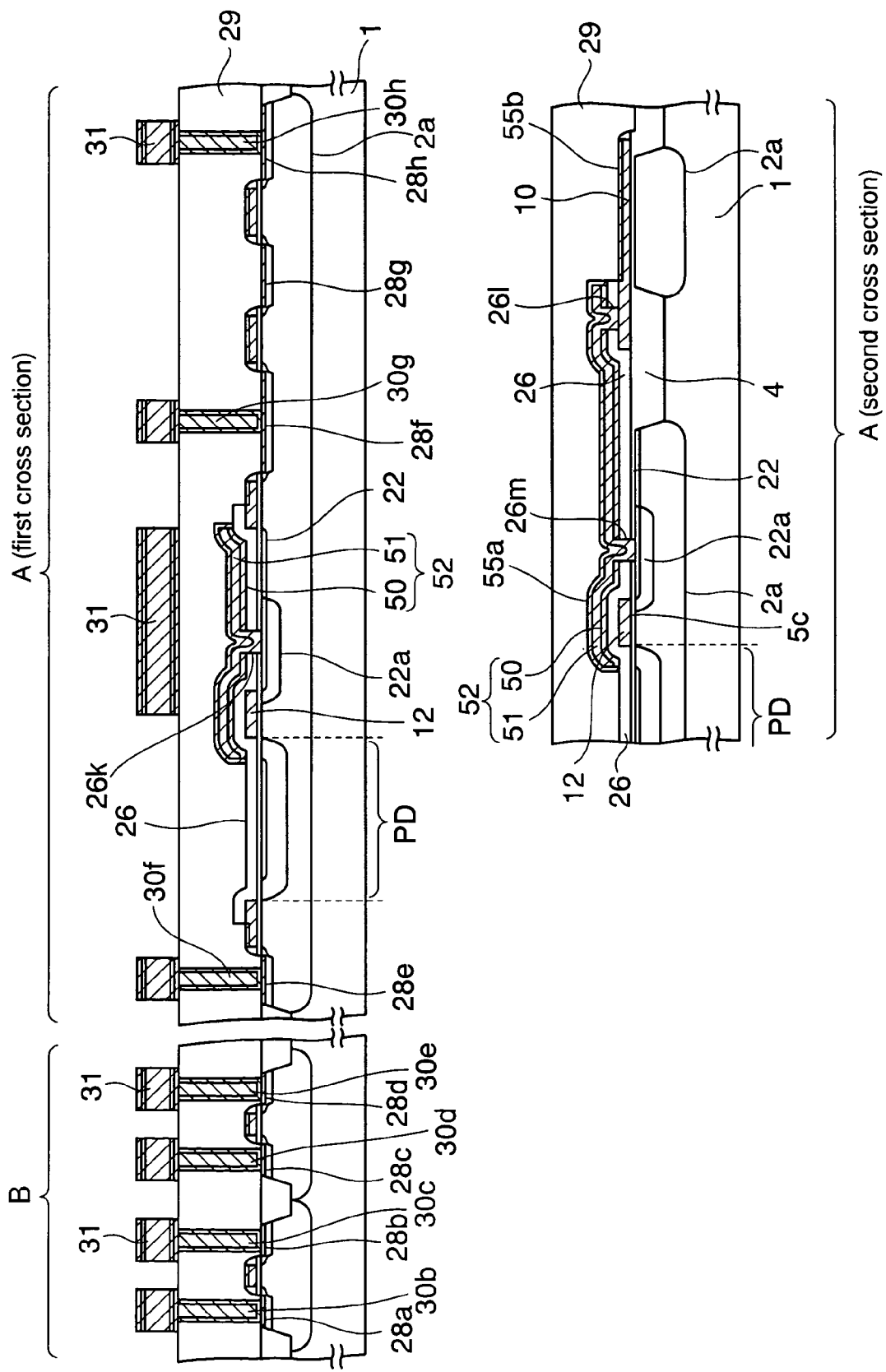

According to the above-described embodiment, as shown in FIG. 20G, the conductive pattern 52 is formed so as to cover the transfer gate 12, and accordingly, large overlap capacitance can be created between the conductive pattern 52 and the transfer gate 12. In cooperation with the overlap capacitance between the transfer gate 12 and the highly doped region 22a, the overlap capacitance between the conductive pattern 52 and gate 12 draws the potential of the floating diffusion region 22 toward the positive potential of the gate 12 at the time of charge transfer more largely than in the fist embodiment, and accordingly, the charge transfer from the photodiode PD to the floating diffusion region 22 can be performed far more smoothly.

In addition, the conductive pattern 52 is formed on the upper surface of the second insulating film 26 that remains uneven without being planarized. Accordingly, in comparison with the case where the second insulating film 26 is planarized, an area of the lower surface of the conductive pattern 52 can be increased, and the overlap capacitance between the conductive pattern 52 and the transfer gate 12 can be increased.

Furthermore, in this embodiment, the conductive pattern 52 is formed so as to cover the transfer gate 12 and the floating diffusion region 22. Accordingly, unnecessary light that is going to be incident onto the floating diffusion region 22 can be shielded by the conductive pattern 52, thus making it possible to prevent noise from being generated in the floating diffusion region 22.

Moreover, the conductive pattern 52 is directly formed on the second insulating film 26 without forming an insulating film for planarization on the second insulating film 26. Accordingly, in comparison with the case where the insulating film for planarization is formed and the conductive pattern 52 is formed thereon, a distance between the conductive pattern 52 and the floating diffusion region 22 can be shortened. Consequently, it becomes far more difficult for extra light to invade the floating diffusion region 22, and the above-described light shielding effect can be enhanced.

Incidentally, in this embodiment, the conductive pattern 52 is constituted of phosphorus-doped amorphous silicon, and further, the conductive pattern 52 is formed in the third hole 26k and brought into contact with the highly doped region 22a.

In place of such a structure, it is conceivable that, after forming a conductive plug in the third hole 26k, a metal stack film constituted mainly of an aluminum film is formed on the respective upper surfaces of the conductive plug and second insulating film 26, and that the metal stack film is patterned to form the conductive pattern 52. Such a structure corresponds to a structure shown in FIG. 7 of Patent Document 1.

However, in this structure, it is necessary to form a Ti film as a glue film of the conductive plug in the third hole 26k, and undesirably, the silicon substrate 1 exposed to the bottom surface of the third hole 26k reacts with the Ti film to form a titanium silicide layer. The titanium silicide layer reaches some depth from the surface of the silicon substrate 1. Therefore, the lower surface of the titanium silicide layer will be close to a PN junction between the N-type highly doped region 22a and the P-type silicon substrate 1. In such a case, charges in the highly conductive titanium silicide layer become prone to escape to the silicon substrate 1 through the above-described PN junction, thus causing a possibility that a junction leakage in this PN junction is increased.

On the contrary to this, in this embodiment, the first conductive film 50 made of an amorphous silicon film is formed as the lowermost layer of the conductive pattern 52, and is brought into direct contact with the floating diffusion region 22 in the third hole 26k. Accordingly, such a silicide layer as described above is not formed on the bottom surface of the third hole 26k, the junction leakage can be restricted from being increased, and a reliable CMOS sensor can be provided.

(Sixth Embodiment)

In the fifth embodiment, as shown in FIG. 20G, the conductive pattern 52 is extended onto the fifth gate electrode 10, and the floating diffusion region 22 and the fifth gate electrode 10 are electrically connected to each other by the conductive pattern 52.

In this embodiment, the floating diffusion region 22 and the fifth gate electrode 10 are electrically connected to each other without the conductive pattern 52 being interposed therebetween but with the first level metal wiring 31 being interposed therebetween.

Figure 22A:
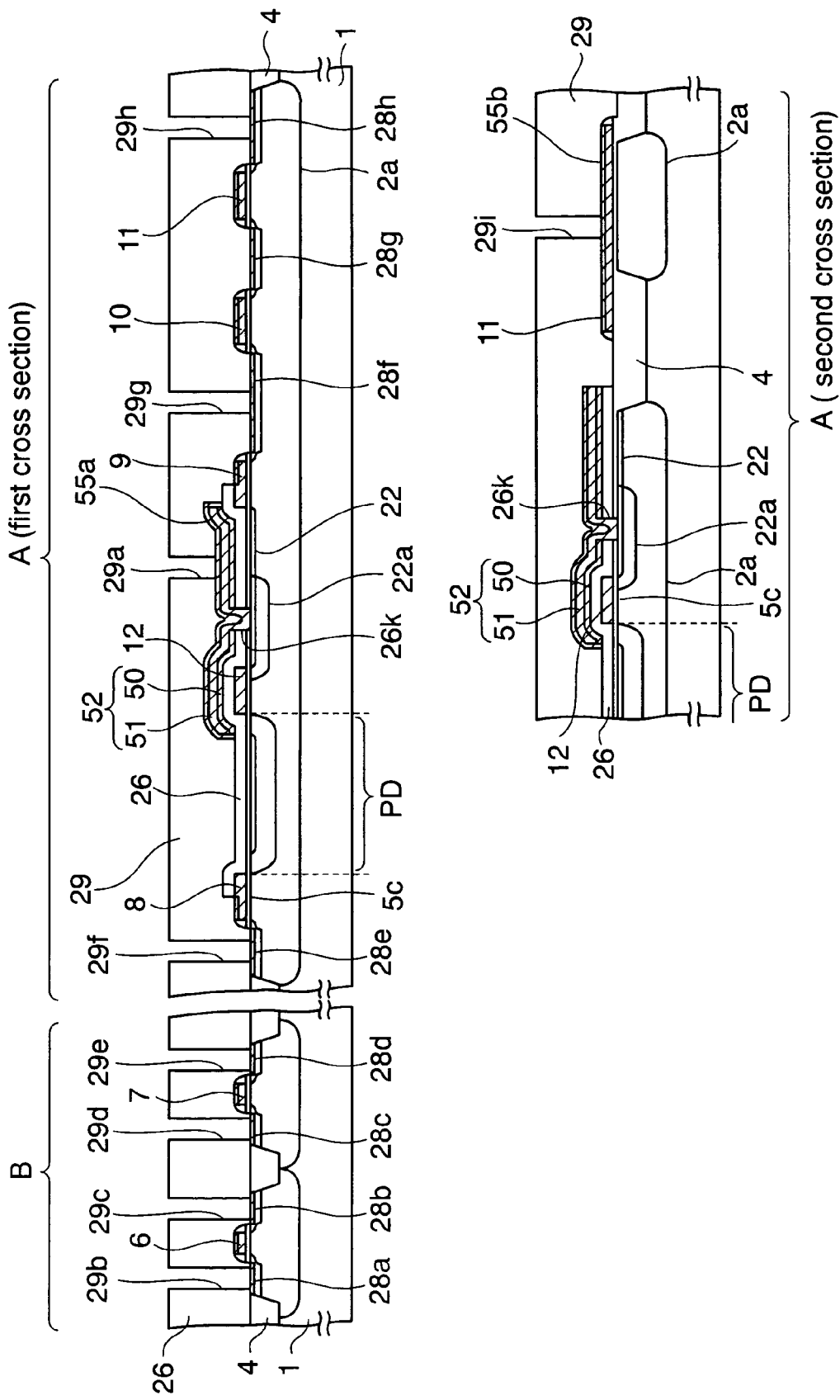
FIG. 22A and FIG. 22B are cross-sectional views of principal portions of an imaging device in steps of a manufacturing process in accordance with a sixth embodiment of the present invention.
Figure 22B:
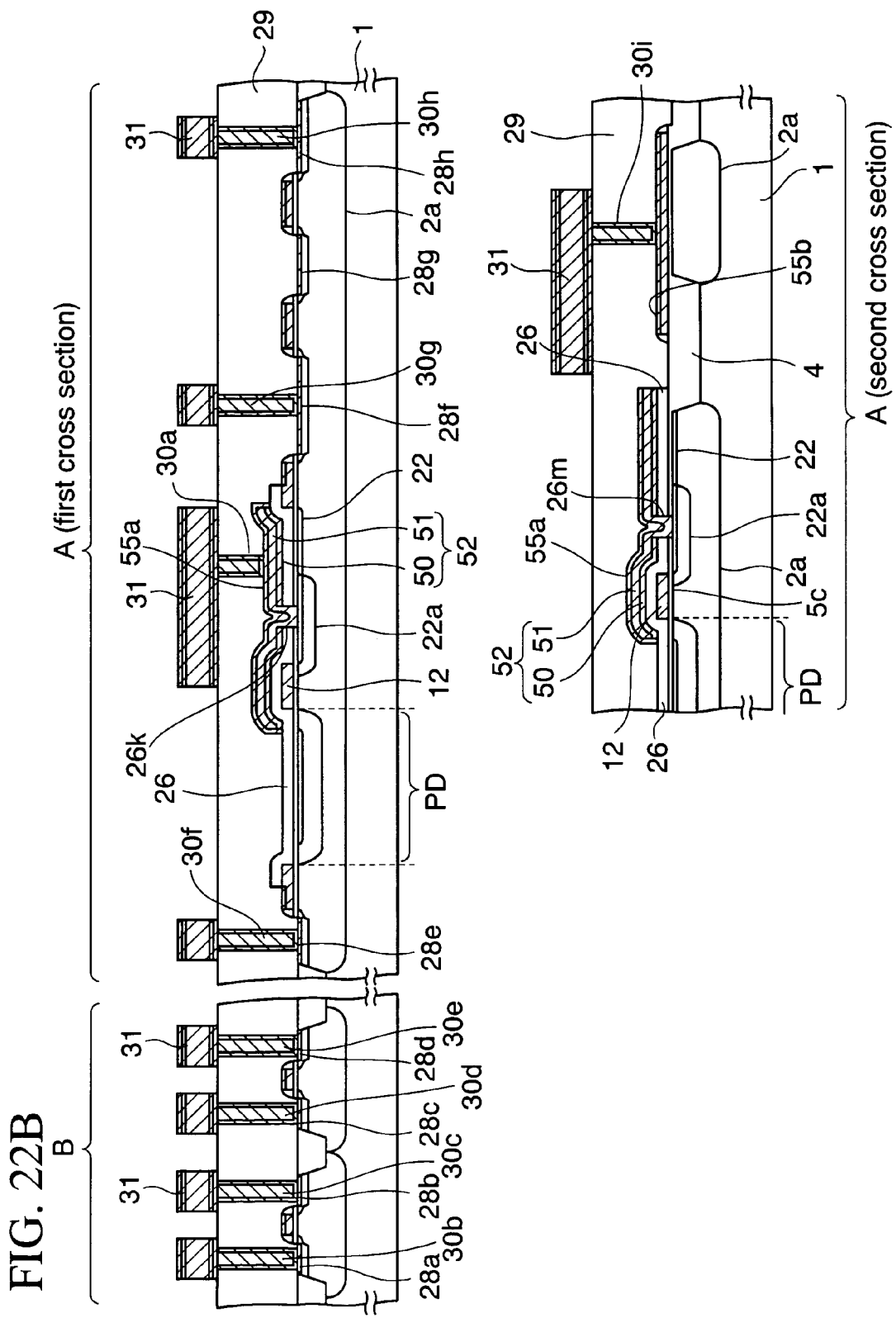

FIG. 22A and FIG. 22B are cross-sectional views of principal portions of an imaging device at some midpoints of a manufacturing process according to the present embodiment.

First, a process until obtaining a cross-sectional structure shown in FIG. 22A will be described.

In accordance with the process of FIG. 20F in the fifth embodiment, a first hole 29a and a fifth hole 29i are formed on the conductive pattern 52 and the fifth gate electrode 10 simultaneously when the second holes 29b to 29h are formed.

Next, a process until obtaining a cross-sectional structure shown in FIG. 22B will be described.

First, a Ti film and a TiN film are stacked as glue film in this order on the inner surfaces of the respective holes 29a to 29i and the upper surface of the third insulating film 29 by the sputtering method. Then, a W film is formed on the stacked films by the CVD method, and the respective holes 29a to 29i are completely filled therewith. The W film formed by the CVD method exhibits better performance in step coverage than an AL film formed by the sputtering method, so that the narrow holes 20a to 29i can be favorably filled with the W film. Moreover, adhesion of the TiN film in the glue film is good to the W film, and the TiN film prevents the W film from peeling off and has a function as a diffusion prevention film for the W film.

Note that, in place of the W film, any of a doped polysilicon film, a tungsten silicide film, a cobalt silicide film, a tungsten nitride film, a Ta film, a Ru film, an Ir film, an Os film and a Pt film may be used.

Subsequently, extra glue film and W film on the upper surface of the third insulating film 29 are removed by the CMP method, and the glue film and the W film are left only in the respective holes 29a to 29i. The glue film and W film thus left become a first conductive plug 31a in the first hole 29a, and become second conductive plugs 30b to 30h in the second holes 29b to 29h. Then, these films left in the fifth hole 29i become a seventh conductive plug 30i.

Thereafter, similar processes to those in the fifth embodiment are performed, and the first level metal wiring 31 is formed on the third insulating film 29 and the respective conductive plugs 30a to 30i.

This first wiring 31 is extended from a portion on the first conductive plug 30a to the seventh conductive plug 30i, and thus the floating diffusion region 22 and the fifth gate electrode 10 is electrically connected to each other.

According to the persent embodiment described above, the silicide layers 28a to 28h, 55a and 55b are exposed under all the holes 29a to 29i, and these silicide layers serve as etching stoppers when forming the holes. Accordingly, all the holes 29a to 29i can be formed simultaneously under the same etching conditions. Hence, unlike the first embodiment in which the different types of materials are exposed under the respective holes, it is not necessary to form the respective holes separately while changing the etching conditions. Therefore, simplification of the processes can be achieved.

(Seventh Embodiment)

Next, a manufacturing method of an imaging device according to a seventh embodiment of the present invention will be described. FIG. 23A and FIG. 23B are cross-sectional views of principal portions of the imaging device at some midpoints in a manufacturing process according to the present embodiment. FIG. 24 is a plan view of the principal portions. Note that, in these drawings, the same reference numerals as those in the first embodiment is used for the members described in the first embodiment, and description thereof will be omitted below.

First, a process until obtaining a cross-sectional structure shown in FIG. 23A will be described.

After performing the process of FIG. 4A, which has been described in the first embodiment, P-type impurity such as boron is ion-implanted into the N well 3 by use of a resist pattern (not shown) having a window on the N well 3 as a mask, and the first and second P-type diffusion regions 13 and 14 are formed in a self-aligning manner with respect to the first gate electrode 6. Thereafter, the above-described resist pattern is removed.

Subsequently, a seventh resist pattern 60 covering a portion of the silicon substrate 1 from the third gate electrode 8 to the sixth gate electrode 11 is formed, and while using the seventh resist pattern 6 as a mask, phosphorus is ion-implanted into the silicon substrate 1 under conditions where the acceleration energy is 20 keV and the dose amount of $4 \times 10^{13}$ cm$^{-2}$. At the time of this ion implantation, the second and third gate electrodes 7 and 8 and the sixth gate electrode 11 serve as masks, and the first to third N-type diffusion regions 15 to 17 and the sixth N-type diffusion region 20 are formed on the sides of these gate electrodes in a self-aligning manner.

Thereafter, the seventh resist pattern 60 is removed.

Next, a process until obtaining a cross-sectional structure shown in FIG. 23B will be described.

First, photoresist (not shown) is coated on the entire surface of the silicon substrate 1, and then the photoresist is exposed and developed. Thus, a eighth resist pattern 61 having a third window 61a is formed. The third window 61a is formed such that side faces thereof overlap the respective upper surfaces of the transfer gate 12 and sixth gate 11 and that the respective upper surfaces of the fourth and fifth gate electrodes 9 and 10 are exposed to the inside of the third window 61a.

Subsequently, the eighth resist pattern 61 is used as a mask, and the phosphorus is ion-implanted into the silicon substrate 1 under the condition where the impurity concentration is lowered more than that in the process of FIG. 23A, for example, conditions where the acceleration energy is 20 keV and the dose amount is 0.5 to $1 \times 10^{12}$ cm$^{-2}$. In such a way, the low-concentration floating diffusion region 22 is formed between the transfer gate 12 and the fourth gate electrode 9 in a self-aligning manner, the fourth and fifth N-type diffusion regions 18 and 19 are formed among the fourth to sixth gate electrodes 9 to 11.

Thereafter, the processes of FIG. 4D and FIG. 4E, which have been described in the first embodiment, are performed. Thus, the highly doped region 22a is formed in the floating diffusion region 22, and the photodiode Pd is formed.

A plan view after the end of these processes becomes as shown in FIG. 24. The cross-sectional views of the peripheral circuit region B of FIG. 23A and FIG. 23B explained in the above correspond to a cross section along a line I—I of FIG. 24, and the cross-sectional views of the pixel region A thereof correspond to a cross section along a line II—II of FIG. 24.

As described above, in this embodiment, the fourth and fifth N-type diffusion regions 18 and 19 serving as the source/drain regions of the detection transistor TR$_{SF}$ are formed simultaneously with the low concentration floating diffusion region 22, and thus the impurity concentration of the regions 18 and 19 is lowered more than that of the first and second N-type diffusion regions 15 and 16 of the peripheral circuit region B.

According to this structure, the impurity of the fourth and fifth N-type diffusion regions 18 and 19 is not diffused widely in the lateral direction of the silicon substrate 1 in comparison with that of the first and second N-type diffusion regions 15 and 16 of the peripheral circuit. Hence, as shown in FIG. 24, the overlap width between the source region and gate electrode of the detection transistor TR$_{SF}$ (that is, the overlap width between the fourth N-type diffusion region 18 and the fifth gate electrode 10) becomes a fourth width d4 narrower than the overlap width d2 in the peripheral transistor TR$_N$.

As can be understood from FIG. 2, the overlap capacitance between the source and gate of the detection transistor TR$_{SF}$ functions as a part of a capacitor which converts the charges accumulated in the floating diffusion region 22 into a gate voltage of the detection transistor TR$_{SF}$. Then, a variation V of the gate voltage is proportional to the charge amount Q in the floating diffusion region 22, and a coefficient of proportionality thereof becomes an inverse number $C^{-1}$ of a capacitance value C of this capacitor.

In this embodiment, the overlap width d4 between the source region and gate electrode of the detection transistor TR$_{SF}$ is narrowed more than the overlap width d2 in the peripheral transistor. Accordingly, the capacitance value of the overlap capacitance between the source and gate thereof can be reduced. Consequently, a value of the above-described coefficient of proportionality $C^{-1}$ is made larger than that of the first embodiment. Therefore, the gate voltage of the detection transistor TR$_{SF}$ can be made to sensitively response to the variations of the charge amount Q in the floating diffusion region 22, and a CMOS image sensor more sensitive than that of the first embodiment can be provided.

In addition, the impurity concentration of the source/drain regions (fourth and fifth N-type diffusion regions 18 and 19) of the detection transistor $TR_{SF}$ is lowered more than the peripheral transistor $TR_N$. Accordingly, the diffusion of the impurity from the source/drain regions of the detection transistor $TR_{SF}$ to its channels is reduced. Consequently, even if the gate length of the detection transistor $TR_{SF}$ is shortened as a result of a miniaturization progress of the image sensor, a short channel effect of the detection transistor $TR_{SF}$ can be restricted more than that of the peripheral transistor $TR_N$, and the characteristics of the detection transistors $TR_{SF}$ can be prevented from being varied among the unit pixels U.

(Eighth Embodiment)

Figure 25:
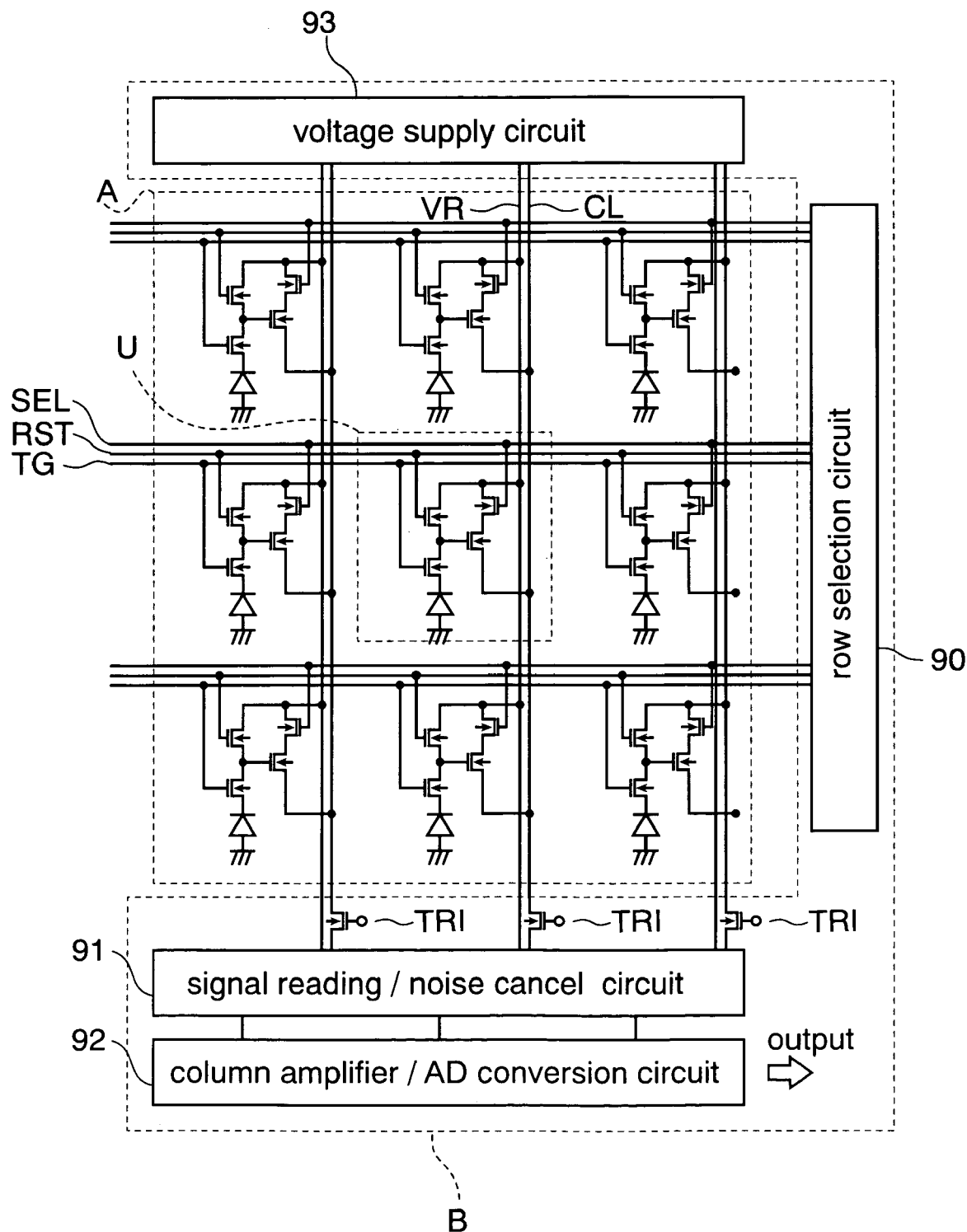
FIG. 25 is a circuit diagram of an imaging device according to an eighth embodiment of the present invention.

FIG. 25 is a circuit diagram of an imaging device according to the present embodiment.

In FIG. 25, the same reference numerals as those in FIG. 1 is used for the circuit elements already described with reference to FIG. 1, and description thereof will be omitted below.

As shown in FIG. 25, in this embodiment, a voltage supply circuit 93 is provided in the peripheral circuit region B, and a voltage from the voltage supply circuit 93 is applied to the vertical signal lines CL. Moreover, for each column, first transistor $TR_1$ is provided on the vertical signal lines CL in positions immediately before the signal reading/noise cancel circuit 91.

Figure 26:
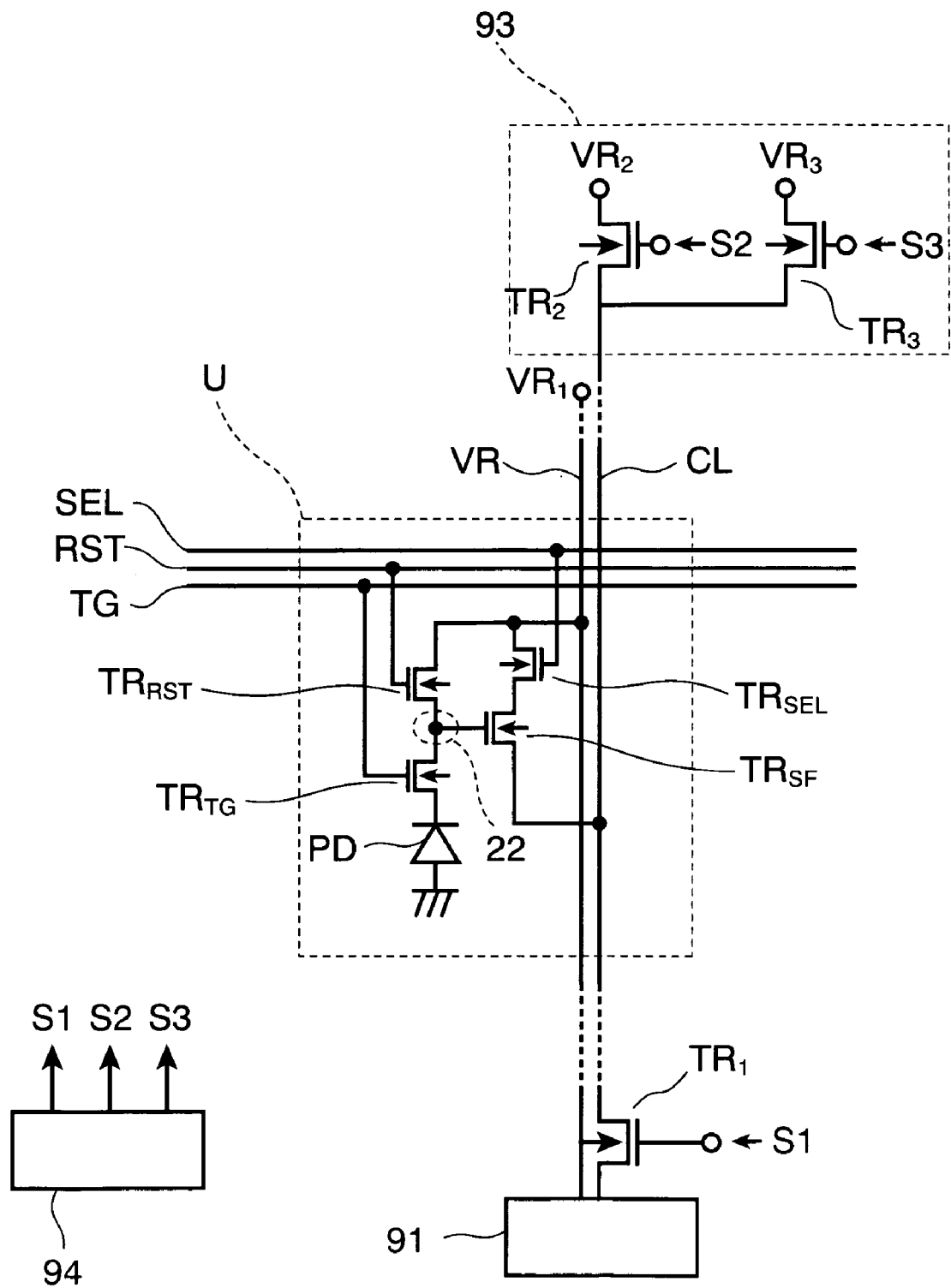
FIG. 26 is a circuit diagram of a unit pixel and voltage supply circuit of the imaging device according to the eighth embodiment of the present invention.

FIG. 26 is a circuit diagram of the unit pixel U and the voltage supply circuit 93 in the present embodiment.

As shown in FIG. 26, the voltage supply circuit 93 has a second transistor $TR_2$ and a third transistor $TR_3$ for each column, and a second voltage $VR_2$ and a third voltage $VR_3$, each has different value, are applied to drains of the respective transistors $TR_2$ and $TR_3$. Then, sources of the respective transistors $TR_2$ and $TR_3$ are commonly connected to the vertical signal line CL.

Signal voltages S2 and S3 are applied to gates of these transistors $TR_2$ and $TR_3$ from a control circuit 94 formed in the peripheral circuit region B. The signal voltages S2 and S3 control ON/OFF of the respective transistor $TR_2$ and $TR_3$, leading to selective outputs of the second voltage $VR_2$ and the third voltage $VR_3$ to the vertical signal line CL. Note that the control circuit 94 also outputs a signal voltage S1 to the first transistor $TR_1$, and controls ON/OFF of the first transistor $TR_1$.

Meanwhile, in the unit pixel U, a order of connection between the detection transistor $TR_{SF}$ and the selection transistor $TR_{SEL}$ is made reverse to that of the first embodiment. The source of the detection transistor $TR_{SF}$ is directly connected to the vertical signal line CL, and a source voltage of the detection transistor $TR_{SF}$ is adapted to be read out directly to the vertical signal line CL.

Note that the power source line VR is set in a state of being constantly applied with the first voltage $VR_1$.

Figure 27:
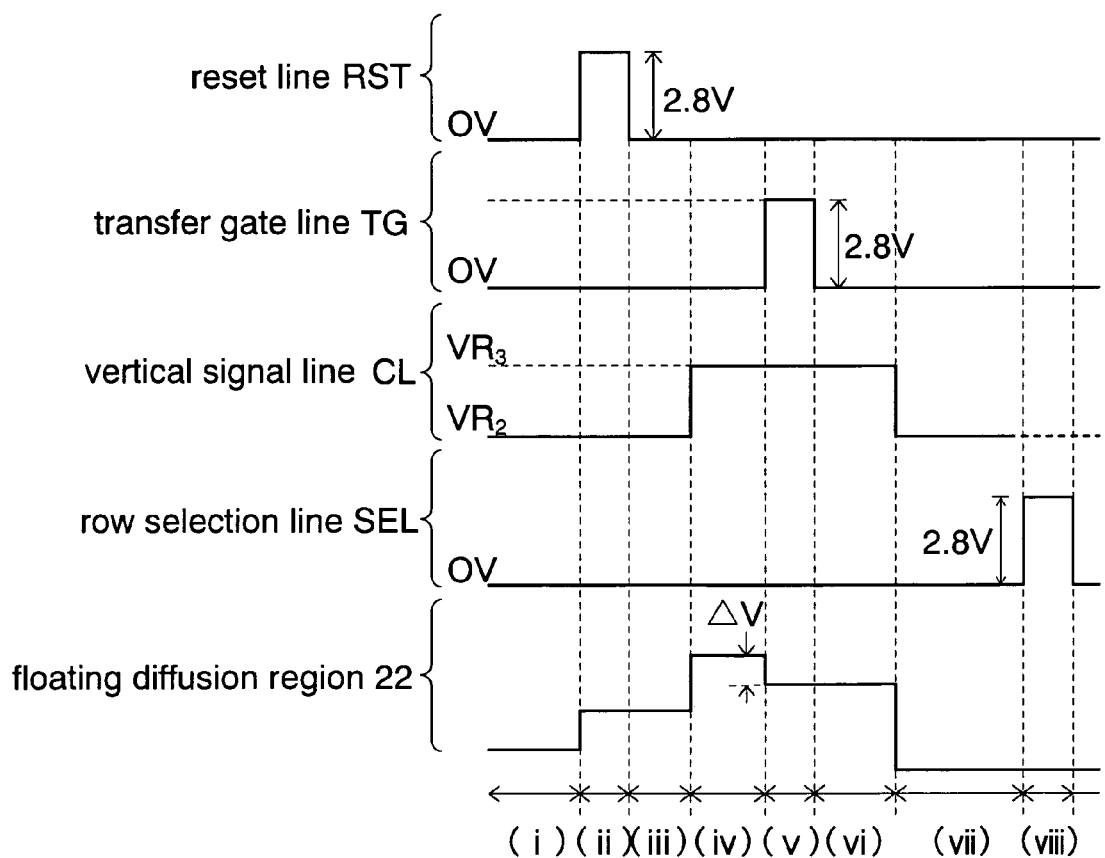
FIG. 27 is a timing chart showing an operation of the imaging device according to the eighth embodiment of the present invention.

Next, an operation of this imaging device will be described with reference to FIG. 27. FIG. 27 is a timing chart showing the operation of the imaging device according to the present embodiment.

As shown in FIG. 27, in a first step (i), the second transistor $TR_2$ is turned to an ON state, and the third transistor $TR_3$ is turned to an OFF state. Thus, the second voltage $VR_2$ is outputted to the vertical signal line CL from the voltage supply circuit 93, and the second voltage $VR_2$ is applied to the source of the detection transistor $TR_{SF}$.

In a next step (ii), a high-level voltage (2.8V) is applied to the reset line RST to turn the reset transistor $TR_{RST}$ to an ON state. Thus, the floating diffusion region 22 is reset to a drain voltage of the reset transistor $TR_{RST}$, that is, the first voltage $VR_1$ of the power source line VR, and the first voltage $VR_1$ is applied to the gate of the detection transistor $TR_{SF}$.

In such a way, the second voltage $VR_2$ is applied to the source of the detection transistor $TR_{SF}$, and the first voltage $VR_1$ is applied to the gate of the detection transistor $TR_{SF}$. In the present embodiment, such a value that the channel of the detection transistor $TR_{SF}$ in this state is turned ON, for example, 0.5 to 1V is adopted as a value of the second voltage $VR_2$. Thus, the detection transistor $TR_{SF}$ is turned to an ON state simultaneously when the floating diffusion region 22 is reset in the step (ii).

Thereafter, in a step (iii), the reset line RST is returned to low level, so that the reset transistor $TR_{RST}$ is turned to an OFF state. In this state, the reset voltage (first voltage $VR_1$) remains written into the floating diffusion region 22.

In a next step (iv), the second transistor $TR_2$ is turned to an OFF state, and the third transistor $TR_3$ is turned to an ON state, and thus the third voltage $VR_3$ is outputted to the vertical signal line CL. In the present embodiment, 1.8V, which is higher than the second voltage $VR_2$ (0.5 to 1V), is employed for the third voltage $VR_3$. Consequently, the ON state of the detection transistor $TR_{SF}$ is maintained, and the potential of the floating diffusion region 22 is raised by a capacitance between the channel and gate of the detection transistor $TR_{SF}$.

Subsequently, in a step (v), the potential of the transfer gate line TG is set at the high level (2.8V), and thus the transfer transistor $TR_{TG}$ is turned to an ON state. Consequently, the charges (in this case, electrons) accumulated in the photodiode PD are transferred to the floating diffusion region 22 through the transfer transistor $TR_{TG}$, and the potential of the floating diffusion region 22 is reduced by V in accordance with the amount of transferred electrons.

Thereafter, in a step (vi), the voltage of the transfer gate line TG is returned to the low level (0V) again, and the charge transfer is stopped.

Subsequently, in a step (vii), the second transistor $TR_2$ is turned to an ON state again, the third transistor $TR_3$ is turned to an OFF state again, and thus the voltage of the vertical signal line CL is returned to the second voltage $VR_2$. In such a way, the voltage of the floating diffusion region 22 becomes a voltage lower than that in the first state (step (i)) by V in accordance with the amount of transferred electrons.

Then, after the elapse of a predetermined time in the state of the step (vii) (standby state), the second and third transistors $TR_2$ and $TR_3$ are turned to an OFF state in a next step (viii). Thereafter, the first transistor $TR_1$ is turned to an ON state, and the row selection line SEL is set at the high level to turn the selection transistor $TR_{SEL}$ to an ON state. Thus, the source voltage of the detection transistor $TR_{SF}$ is read out as a signal voltage to the vertical signal line CL.

According to the above steps, the charge transfer and the signal reading are ended.

According to the present embodiment described above, in the steps (ii) and (iii), the reset voltage (first voltage $VR_1$) of the floating diffusion region 22 is applied to the gate of the detection transistor $TR_{SF}$ to turn the detection transistor $TR_{SF}$ to an ON state in the state where the second voltage $VR_2$ is applied to the source of the detection transistor $TR_{SF}$. Thus, the capacitance between the channel and gate of the detection transistor $TR_{SF}$ is created. Then, in the step (iv), the third voltage $VR_3$ higher than the second voltage $VR_2$ is applied to the source of the detection transistor $TR_{SF}$, and the floating diffusion region 22 connected to the gate of the detection transistor $TR_{SF}$ is raised to the positive potential side by use of the capacitance between the channel and the gate of the detection transistor $TR_{SF}$.

According to this, the potential of the floating diffusion region 22 becomes deepened when viewed from the electrons, and accordingly, a potential difference between the photodiode PD and the floating diffusion region 22 is increased, and the electrons can be transferred effectively from the photodiode PD from the floating diffusion region 22.

Furthermore, it is only for a period of the above-described steps (iv) to (vi) that the potential of the floating diffusion region 22 is raised in the above manner. Accordingly, the junction leakage can be prevented from being generated between the floating diffusion region 22 and the silicon substrate 1, during the standby state (step (vii)) which starts from the transfer of the charges to the floating diffusion region 22 and ends with reading out of the signal. Thus, reliability of the CMOS image sensor can be enhanced.

In addition, according to the above, it is not necessary to provide a large overlap capacitance between the transfer gate 12 and the floating diffusion region 22 as in the first embodiment. Accordingly, the total capacitance of the floating diffusion region 22 can be prevented from being increased due to the overlap capacitance, and the sensitivity is not lowered.

Figure 28:
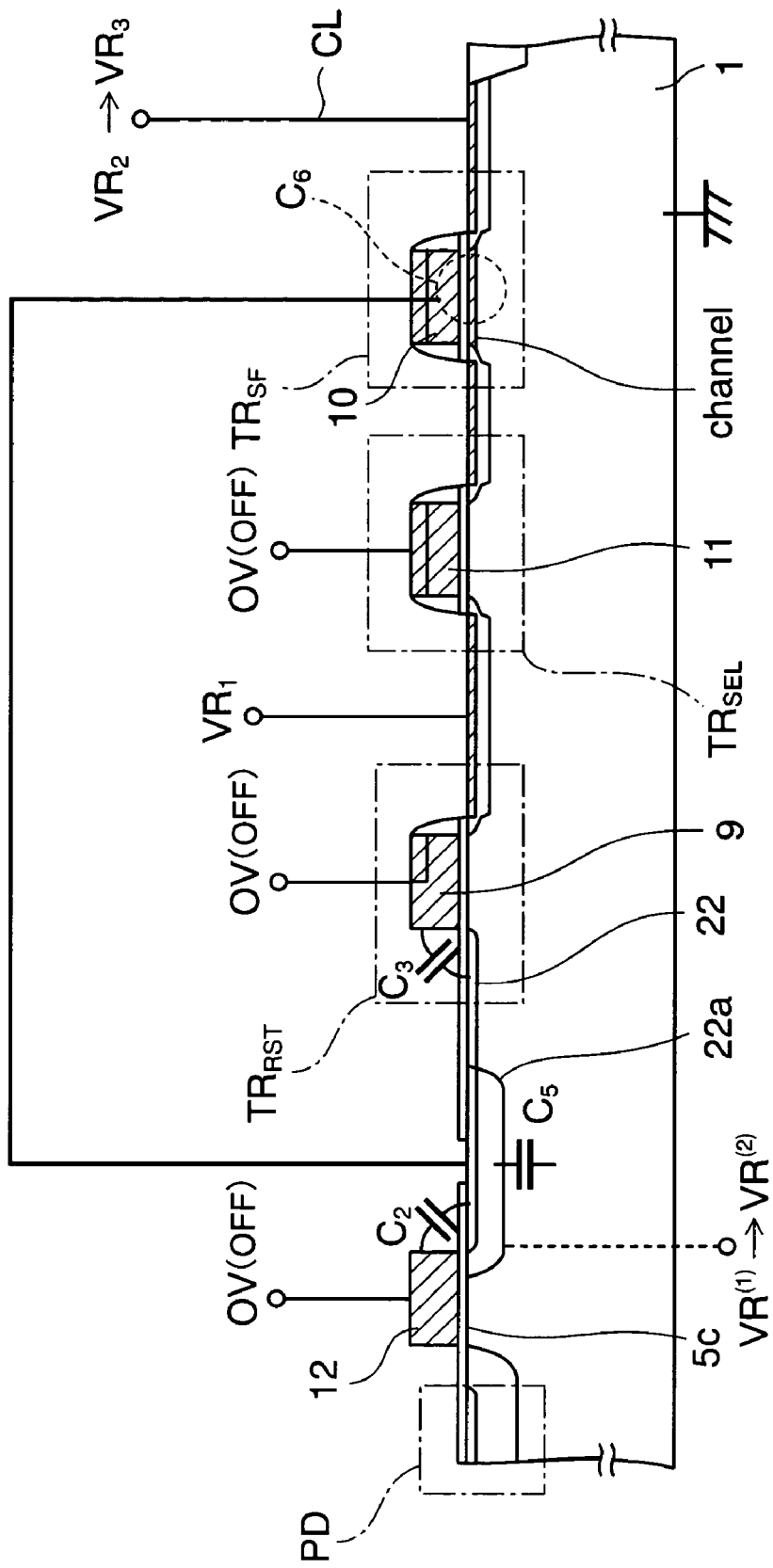
FIG. 28 is a view where a variety of capacitances are additionally written to the cross section of the imaging device in order to described advantages of the eighth embodiment of the present invention qualitatively.

FIG. 28 is a view where a variety of capacitances $C_2$, $C_3$, $C_5$ and $C_6$ are additionally written to a cross section of the imaging sensor of the present embodiment for the purpose of describing the above-described advantages qualitatively. Meanings of the capacitances $C_2$, $C_3$ and $C_5$ are the same as those in the first embodiment. The capacitance $C_6$ is the capacitance between the channel and gate of the detection transistor $TR_{SF}$.

As already described, the second voltage $VR_2$ applied to the source of the detection transistor $TR_{SF}$ is set at such a value (0.5 to 1V) that the channel of the detection transistor $TR_{SF}$ is turned ON when the floating diffusion region 22 is reset to the first voltage $VR_1$ (approximately 1.8V). Hence, when the voltage of the floating diffusion region 22 is reset to the first voltage $VR_1$ in the above-described step (ii), the detection transistor $TR_{SF}$ is turned to an ON state.

Thereafter, when the reset transistor $TR_{RST}$ is set in an OFF state in the above-described step (iii), electrons present so far in an inversion layer of the reset transistor $TR_{RST}$ flow into the floating diffusion region 22, and accordingly, the potential of the floating diffusion region 22 becomes $VR^{(1)}$ somewhat lower than the first voltage $VR_1$.

Furthermore, when the potential of the vertical signal line CL is changed from the second voltage $VR_2$ to the third voltage $VR_3$ in the step (iv), the potential of the floating diffusion region 22 is raised through the capacitance $C_6$ between the channel and the gate to become $VR^{(2)}$ higher than $VR^{(1)}$.

Before and after this step (iv), the fifth gate 10 of the detection transistor $TR_{SF}$ and the floating diffusion region 22 are in an electrically floating state, and accordingly, the total amount Q of electrons therein may be regarded not to be changed.

Before the step (iv), the above Q can be written as:

$$Q = C_{total} \cdot VR^{(1)} + C_6 \cdot (VR^{(1)} - VR_2) \qquad (10)$$

(where $C_{total} = C_2 + C_3 + C_5$).

Meanwhile, after the step (iv), Q may be written as:

$$Q = C_{total} \cdot VR^{(2)} + C_6 \cdot (VR^{(2)} - VR_3) \qquad (11).$$

Hence, by putting right sides of these equations (10) and (11), the following equation is obtained:

$$VR^{(2)} = VR^{(1)} + C_6 \cdot (VR_3 - VR_2)/(C_{total} + C_6) \qquad (12).$$

Hence, from this equation (12), it can be understood that, by changing the potential of the vertical signal line CL from the second voltage $VR_2$ to the third voltage $VR_3$, the potential of the floating diffusion region 22 is raised by $C_6 \cdot (VR_3 - VR_2)/(C_{total} + C_6)$ in comparison with the case where the vertical signal line CL is fixed.

Note that, though the overflow drain transistor $TR_{OFD}$ (see FIG. 2) and the overflow drain line OFD, which have been described in the first embodiment, are not used in the present embodiment, these may be provided in the CMOS image sensor of this embodiment as a matter of course.

(Ninth Embodiment)

In the eighth embodiment, such a voltage that the detection transistor $TR_{SF}$ is turned ON in the state where the first voltage $VR_1$ is written into the floating diffusion region 22 is employed for the second voltage $VR_2$, and by utilizing the capacitance between the channel and gate of the detection transistor $TR_{SF}$, the potential of the floating diffusion region is raised.

In place of the above, in the present embodiment, the potential of the floating diffusion region 22 is raised by utilizing the overlap capacitance between the source and gate of the detection transistor $TR_{SF}$. The overlap capacitance is not the one that is intentionally created as in the first embodiment but naturally generated in a usual process. Accordingly, a new process for realizing the structure of this embodiment is not required.

Moreover, in the present embodiment, it is necessary only to employ the different value as the second voltage $VR_2$ than that in the eighth embodiment, and a circuit configuration and operation timing may be the same as those in the eighth embodiment. Hence, description will be made below with reference again to FIGS. 25 to 27 referred to in the eighth embodiment.

In the first step (i) of FIG. 27, the second transistor $TR_2$ is turned to an ON state, the third transistor $TR_3$ is turned to an OFF state, and thus the second voltage $VR_2$ is outputted from the voltage supply circuit 93 to the vertical signal line CL.

Subsequently, in the step (ii), the high-level voltage (2.8V) is applied to the reset line RST. Thus, the reset transistor $TR_{RST}$ is turned to an ON state, and the potential of the floating diffusion region 22 is reset to the first voltage $VR_1$. According to this, the detection transistor $TR_{SF}$ is set in the state where the first voltage $VR_1$ and the second voltage $VR_2$ are applied to the gate and source thereof, respectively.

In the present embodiment, unlike the eighth embodiment, such a voltage that leaves the detection transistor $TR_{SF}$ in the OFF state, for example, a voltage of 1 to 2V is employed as the second voltage $VR_2$. Hence, in this step (ii), the capacitance between the channel and the gate as in the eighth embodiment is not formed in the detection transistor $TR_{SF}$.

Subsequently, in the step (iii), the reset line is set at the low level, and the reset transistor $TR_{RST}$ is turned to an OFF state.

Subsequently, in the step (iv), the second transistor $TR_2$ is turned to an OFF state, and the third transistor $TR_3$ is turned to an ON state. Thus, the third voltage $VR_3$ higher than the second voltage $VR_2$ is outputted to the vertical signal line CL. Consequently, the potential of the floating diffusion region 22 is raised toward the voltage (third voltage $VR_3$) of the vertical signal line CL and the detection transistor $TR_{SF}$ is turned to an ON state by the overlap capacitance between the source and gate of the detection transistor $TR_{SF}$.

Next, in the step (v), the potential of the transfer gate line TG is set at the high level. Thus, the transfer transistor $TR_{TG}$ is turned to an ON state, and the electrons accumulated in the photodiode PD are transferred to the floating diffusion region 22. According to this, the potential of the floating diffusion region 22 is reduced by V in accordance with the amount of transferred electrons.

Thereafter, in the step (vi), the voltage of the transfer gate line TG is returned to the low level (0V) again, and the charge transfer is stopped.

Subsequently, in the step (vii), the second transistor $TR_2$ is turned to an ON state again, the third transistor $TR_3$ is turned to an OFF state again, and thus the voltage of the vertical signal line CL is returned to the second voltage $V_2$.

Next, in the step (viii), the second and third transistors $TR_2$ and $TR_3$ are turned to an OFF state. Thereafter, the first transistor $TR_1$ is turned to an ON state, and the row selection line SEL is set at the high level to turn the selection transistor $TR_{SEL}$ to an ON state. Then, the source voltage of the detection transistor $TR_{SF}$ is read out as a signal voltage to the vertical signal line CL.

By the above, the charge transfer and the signal reading are ended.

According to the present embodiment described above, the voltage of the floating diffusion region 22 is raised toward the second voltage $VR_2$ of the vertical selection line CL through the overlap capacitance between the source and gate of the detection transistor $TR_{SF}$. This overlap capacitance contributes to a parasitic capacitance of the vertical signal line CL, but a capacitance value of the overlap capacitance is smaller than the capacitance between the channel and the gate of the detection transistor $TR_{SF}$. Accordingly, the parasitic capacitance of the vertical signal line CL can be made smaller than in the eighth embodiment utilizing the capacitance between the channel and the gate of the detection transistor $TR_{SF}$, and the level of the selection line CL can be changed from $VR_2$ to $VR_3$ at high speed in the step (iv).

(Tenth Embodiment)

In the first to ninth embodiments, the potential (viewed from the electrons) of the floating diffusion region 22 can be deepened only during the charge transfer from the photodiode PD to the floating diffusion region 22. Then, in the standby state from the end of the charge transfer to before the reading out of the output voltage in accordance with the amount of charges, the potential of the floating diffusion region 22 is not deepened. Accordingly, the junction leakage between the N-type floating diffusion region 22 and the P-type silicon substrate 1 can be prevented.

In the present embodiment, a reading operation of an imaging device capable of utilizing such advantages effectively is provided.

Figure 29:
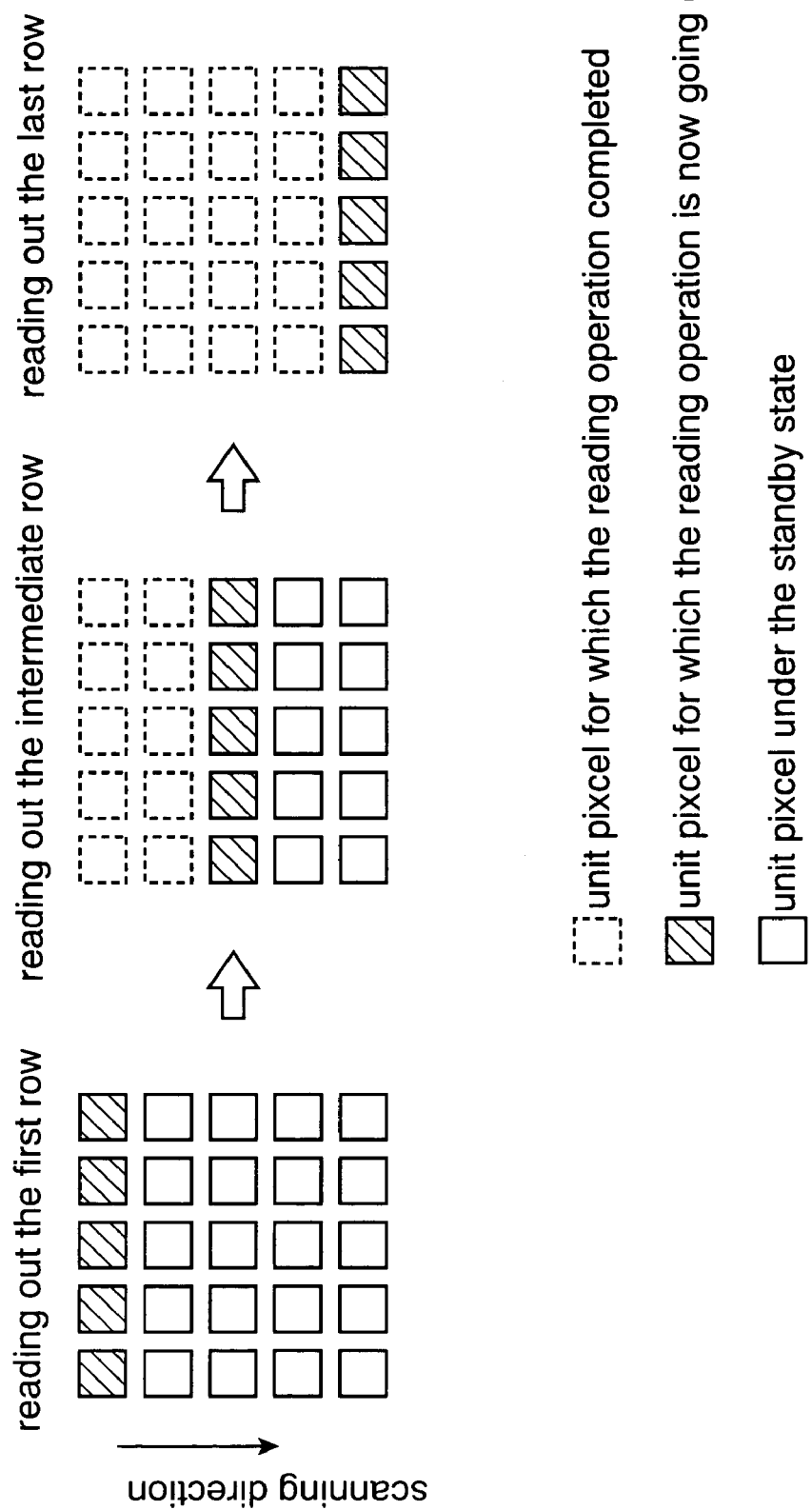
FIG. 29 is a plan view schematically showing a reading operation of an imaging device according to a tenth embodiment of the present invention.

FIG. 29 is a plan view schematically showing the reading operation of the imaging device according to the present embodiment. Hatched rectangles in the figure show unit pixels U being currently read, and rectangles shown by dotted lines show unit pixels U being completed read operation. Moreover, rectangles shown by solid lines show unit pixels U in a standby state, which are to be read from now on.

As shown in FIG. 29, the reading of the signal voltages is performed per row unit sequentially from the first row, after simultaneously performing the charge transfer from the photodiodes PD to the floating diffusion regions 22 for all the rows (see FIG. 3). Performing the charge transfer for all the rows collectively as described above is equal to storing an image formed on the pixel regions before the charge transfer in the floating diffusion regions 22 of all the rows. Accordingly, such charge transfer is also referred to as an electrical "global shutter." The reading of the signals of each row is performed per row unit after the global shutter. However, according to this method, as shown in FIG. 29, lengths of duration times of the standby state (hereinafter, referred to as standby times) differ depending on the rows. Therefore, in the first row, the standby time is the shortest, and in the final row, the standby time is the longest.

If the standby time lasts long in a state where high potentials are applied to the floating diffusion regions 22, the junction leakages between the floating diffusion regions 22 and the silicon substrates 1 are increased, and the reliability of the CMOS image sensor is lowered. Hence, in the case where the high potentials are constantly applied to the floating diffusion regions 22 to improve the charge transfer efficiency without adopting such configurations as in the first to ninth embodiments, the above-described global shutter cannot be adopted. Hence, in this case, it is necessary not to produce a row where the standby state is lengthened by performing the charge transfer sequentially from the first row while performing exposure. Such a method of the charge transfer is also referred to as a "rolling shutter."

However, in this rolling shutter, "shake" and "distortion" are prone to occur when imaging a moving object because exposure periods differ for each of the rows. This gives discomfort to a user.

On the contrary to this, in the first to ninth embodiments, the junction leakages between the floating diffusion regions 22 and the silicon substrates 1 do not occur so much even if the duration time is lengthened by adopting the global shutter method of the present embodiment because the high voltages are not applied to the floating diffusion regions 22 of the unit pixels U in the standby state. Hence, the first to ninth embodiments can suitably adopt the above-described global shutter. Thus, the exposure times are equalized in all the rows, and an image can be made resistant to flow in the case of taking a moving picture.

In the present embodiment, as a result of adopting the global shutter mode, the above-described junction leakages can be prevented even if there are unit pixels U of which standby time is 1 millisecond or more.

It should be noted, however, that such situation can frequently arises where the only low voltage is used as the voltage sources in the actual application. Therefore, even in the case where the rolling shutter is employed, method of raising the voltage of the FD at transfer step described above is preferably applicable.

(Eleventh Embodiment)

In the present embodiment, an imaging device unit is provided by combining each imaging device of the first to tenth embodiments with an optical lens and the like.

Figure 30:
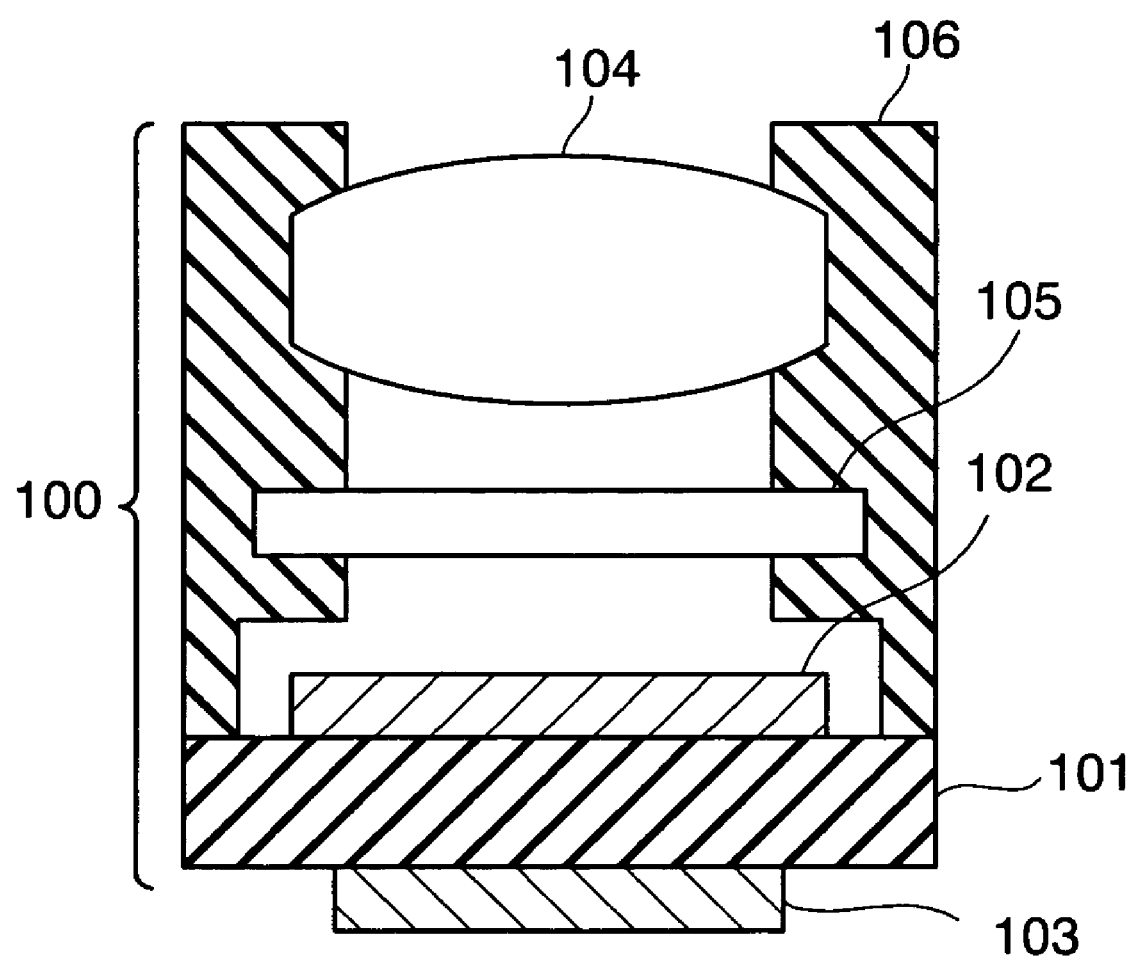
FIG. 30 is across-sectional view of an imaging device unit according to an eleventh embodiment of the present invention.

As shown in FIG. 30, an imaging device unit 100 is constituted from a substrate 101, an imaging device 102 mounted on the substrate 101, a signal processing IC 103 for processing an output signal of the imaging device 102, a lens 104 for collecting light from a subject onto the imaging device 102, a filter 105 for cutting an ultraviolet ray and the like, a housing 106 and the like.

The light from the object is collected by the lens 104, an ultraviolet ray or an infrared ray is cut therefrom by the filter 105, and then formed on the imaging device 102. The imaging device 102 converts the optical image into signal voltages, and then outputs the signal voltages to the signal processing IC 103. In the signal processing IC 103, the signal voltages undergo predetermined treatments.

The imaging device unit 100 as described above is used by being assembled into a cellular phone, a notebook type personal computer or the like for which low power consumption is required. The imaging device unit 100 can create a good image in which the charge transfer efficiency is improved.

What is claimed is:

1. An imaging device, comprising:
   a photodiode and a floating diffusion region formed to be spaced from each other on a surface layer of a pixel region of a semiconductor substrate;
   a transfer gate having either of a concave and convex portion toward the floating diffusion region, the transfer gate being formed above the semiconductor substrate between the photodiode and the floating diffusion region by interposing a gate insulating film therebetween;
   a reset transistor formed in the pixel region of the semiconductor substrate and employing the floating diffusion region as a source region; and
   a peripheral transistor formed in a peripheral circuit region of the semiconductor substrate,
   wherein, in the lateral direction of the semiconductor substrate, a gate electrode of the reset transistor overlaps the floating diffusion region by a first width, and a gate electrode of the peripheral transistor overlaps either of a source region and drain region of the peripheral transistor by a second width wider than the first width.

2. The imaging device according to claim 1, wherein, in the lateral direction of the semiconductor substrate, the transfer gate overlaps the floating diffusion region by a third width longer than the second width and shorter than a gate length of the transfer gate.

3. The imaging device according to claim 2, wherein the gate length of the transfer gate is longer than a gate length of the reset transistor.

4. The imaging device according to claim 1, wherein a channel width of the transfer gate is wider than a channel width of the reset transistor.

5. The imaging device according to claim 1, further comprising:
   a highly doped region formed in the floating diffusion region closer to the transfer gate, an impurity concentration of the highly doped region being higher than other portions of the floating diffusion region;
   an element isolation insulating film formed on the surface layer of the semiconductor substrate and defining at least one edge of the highly doped region;
   an insulating film covering the highly doped region;
   a hole formed in the insulating film on the highly doped region; and
   a conductive plug formed in the hole and electrically connected to the highly doped region.

6. The imaging device according to claim 1, further comprising:
   a detection transistor formed in the pixel region of the semiconductor substrate, a gate electrode of the detection transistor being electrically connected to the floating diffusion region,
   wherein, in the lateral direction of the semiconductor substrate, a gate electrode of the detection transistor overlaps either of a source region and drain region of the detection transistor by a fourth width narrower than the second width.

7. The imaging device according to claim 1, wherein both of a drain region of the reset transistor and the floating diffusion region are bent in an L shape.

* * * * *